(12) United States Patent
Rathinasamy et al.

(10) Patent No.: US 11,349,509 B2
(45) Date of Patent: May 31, 2022

(54) MICRO-STRAND TRANSCEIVER HEAT DISSIPATION SYSTEM

(71) Applicant: Dell Products L.P., Round Rock, TX (US)

(72) Inventors: Shree Rathinasamy, Round Rock, TX (US); Victor Teeter, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 8 days.

(21) Appl. No.: 16/952,903

(22) Filed: Nov. 19, 2020

(65) Prior Publication Data
US 2021/0359712 A1 Nov. 18, 2021

Related U.S. Application Data

(63) Continuation-in-part of application No. 15/929,657, filed on May 14, 2020, now Pat. No. 11,160,196.

(51) Int. Cl.
*H04B 1/036* (2006.01)
*H01Q 1/02* (2006.01)

(52) U.S. Cl.
CPC .............. *H04B 1/036* (2013.01); *H01Q 1/02* (2013.01)

(58) Field of Classification Search
CPC ............ H04B 1/036; H04B 1/38; H01Q 1/02
See application file for complete search history.

(56) References Cited

U.S. PATENT DOCUMENTS

| | | | | |
|---|---|---|---|---|
| 6,003,586 A | * | 12/1999 | Beane | B22D 18/06 164/63 |
| 2002/0182397 A1 | * | 12/2002 | Whatley | H01L 23/3677 428/297.4 |
| 2003/0029600 A1 | * | 2/2003 | Woodard | H02K 9/223 165/46 |
| 2014/0195066 A1 | * | 7/2014 | Nanda | G06F 1/324 700/300 |

\* cited by examiner

*Primary Examiner* — Nguyen T Vo
(74) *Attorney, Agent, or Firm* — Joseph Mencher

(57) ABSTRACT

A micro-strand transceiver device heat dissipation system includes a transceiver device chassis, at least one transceiver component located in the transceiver device chassis, and micro-strand heat dissipator elements that are each positioned in the transceiver device chassis in a spaced apart orientation from the others of the micro-strand heat dissipator elements. Each of the micro-strand heat dissipator elements include a first micro-strand heat dissipator element portion that engages the at least one transceiver component, and a second micro-strand heat dissipator element portion that extends from the at least one transceiver component. The first micro-strand heat dissipator element portion on each of the micro-strand heat dissipator elements conducts heat generated by the at least one transceiver component to the second micro-strand heat dissipator element portion on that micro-strand heat dissipator element, which allows that heat to be dissipated.

20 Claims, 43 Drawing Sheets

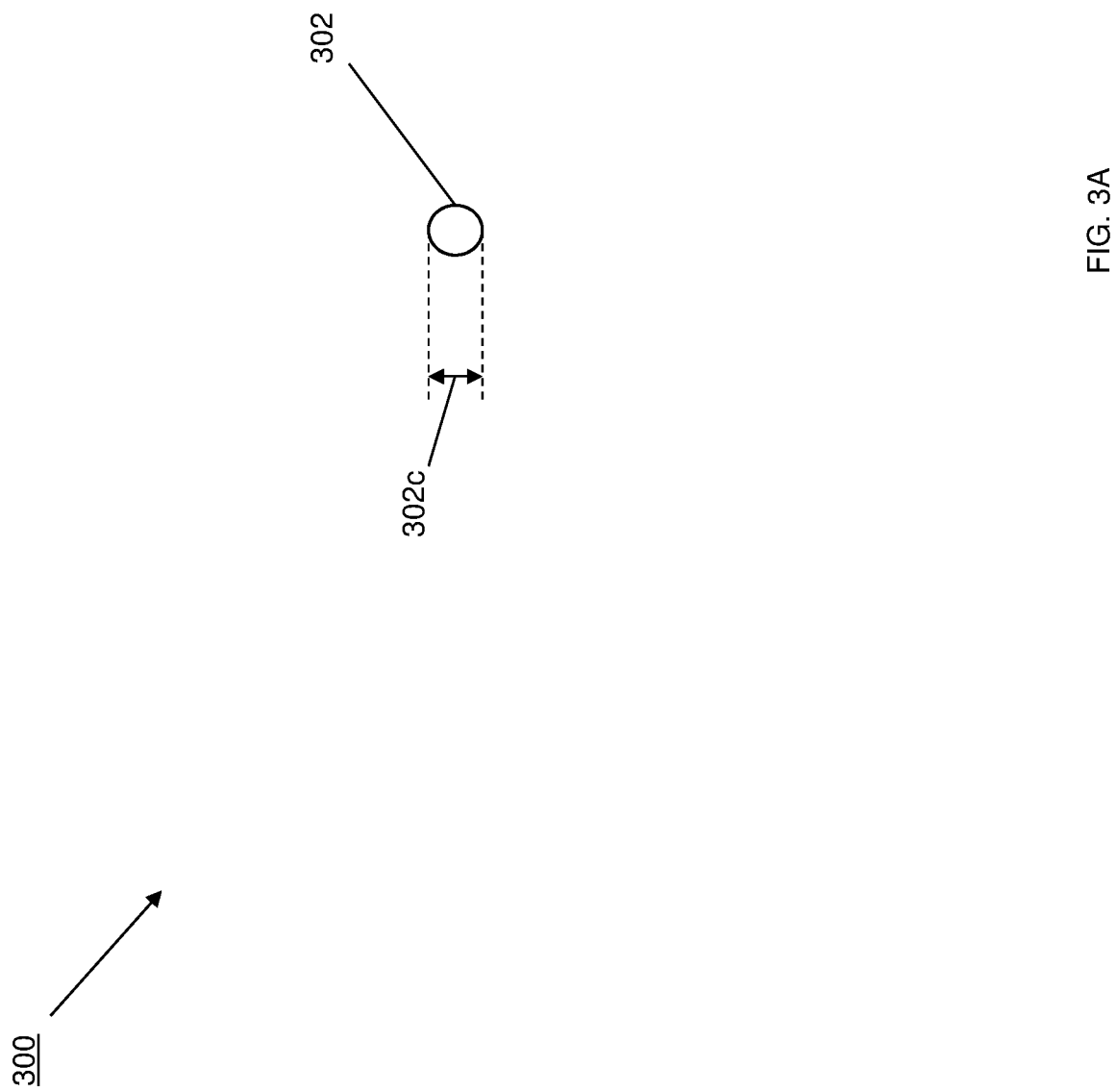

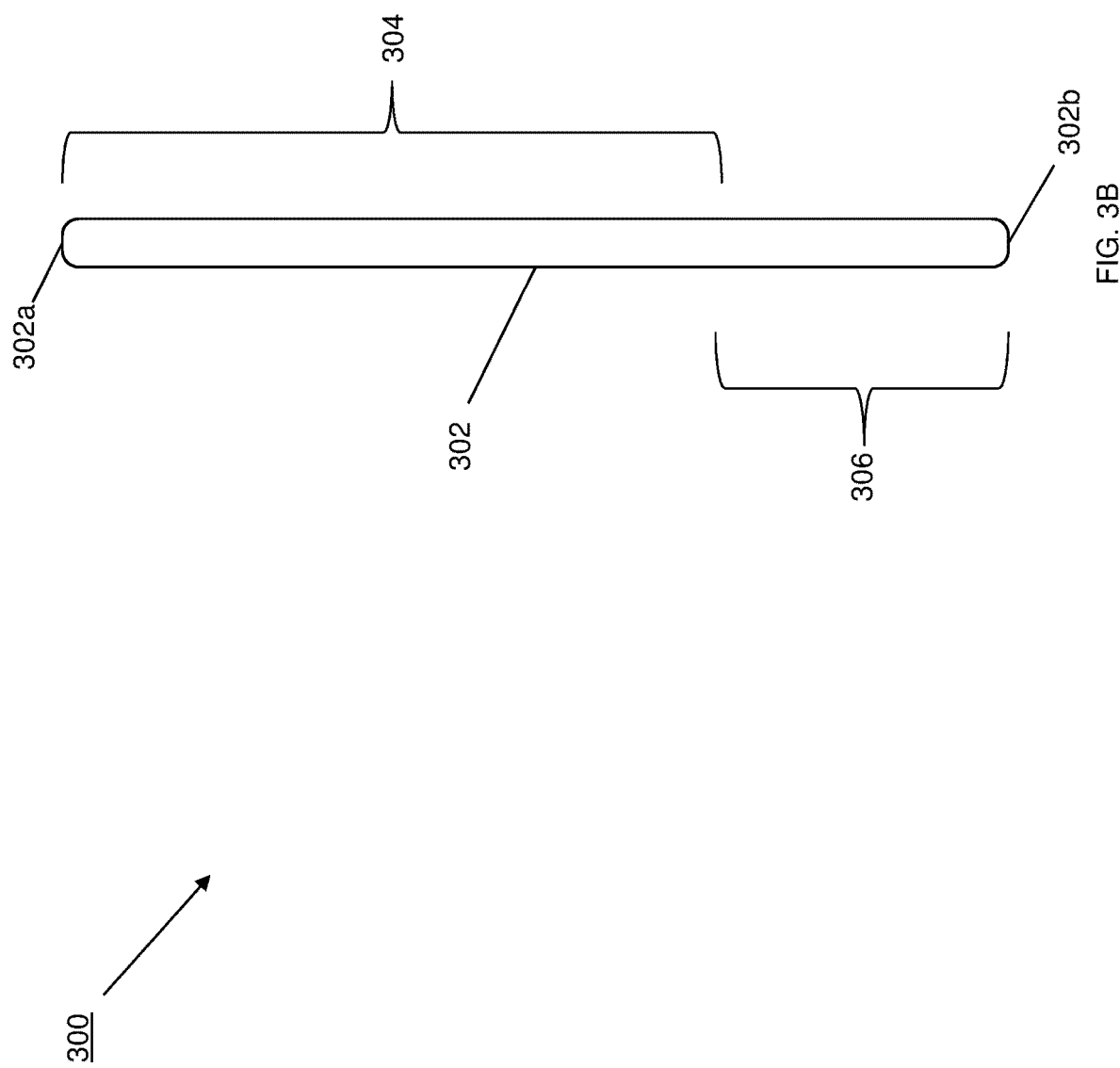

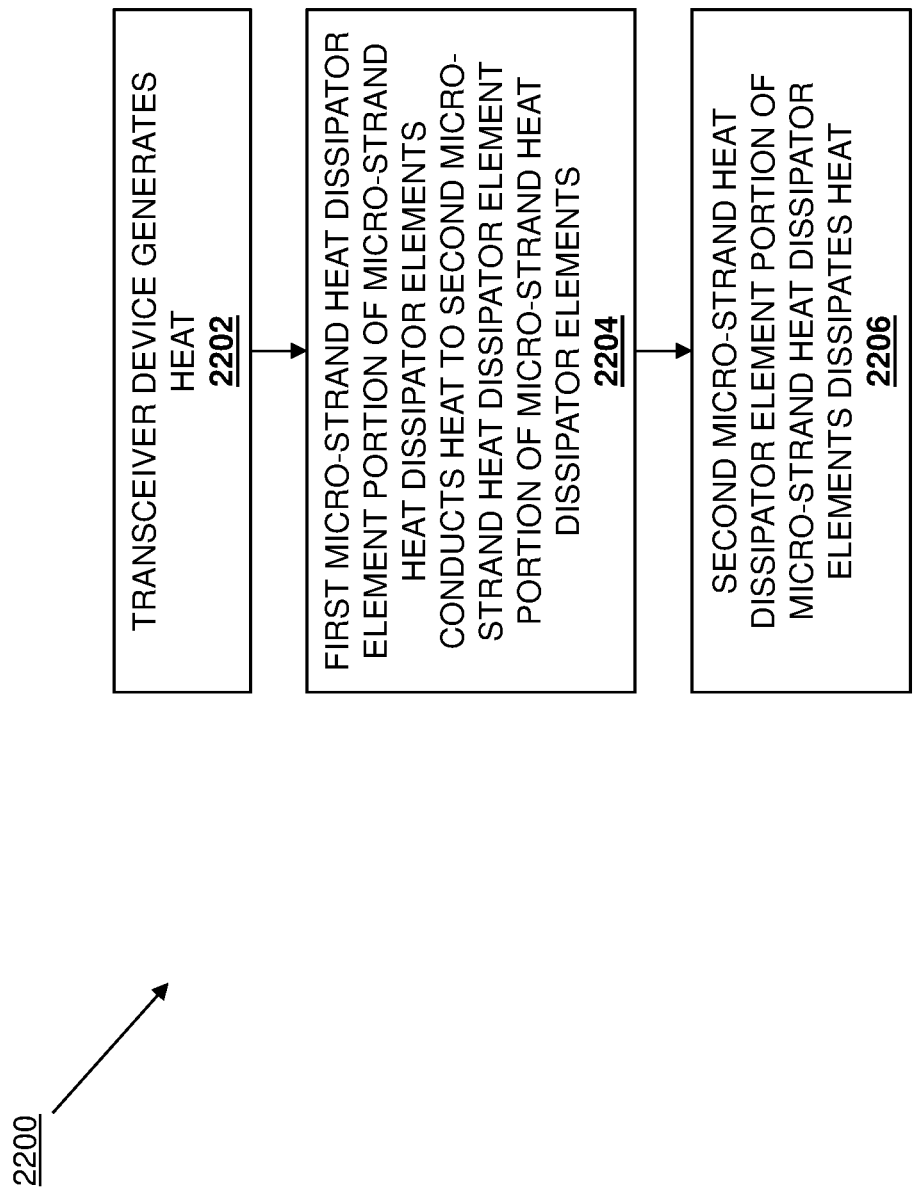

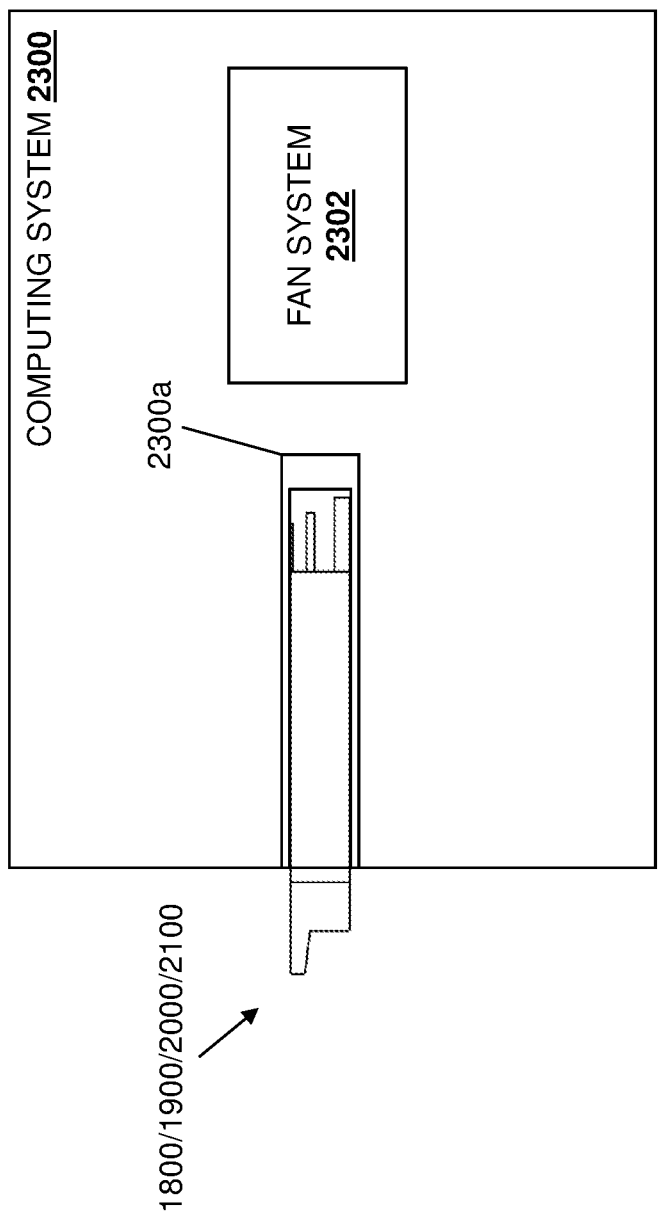

MICRO-STRAND TRANSCEIVER HEAT DISSIPATION SYSTEM

CROSS-REFERENCE TO RELATED APPLICATIONS

The present disclosure is a continuation-in-part of U.S. patent application Ser. No. 15/929,657, filed on May 14, 2020, the disclosure of which is incorporated herein by reference in its entirety.

BACKGROUND

The present disclosure relates generally to information handling systems, and more particularly to the dissipation of heat generated by a transceiver device using micro-strand heat dissipator elements.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, switch devices, and/or other devices known in the art, may be coupled to transceiver devices that include components that are capable of generating relatively high amounts of heat that must be dissipated. For example, silicon photonics transceiver devices include integrated circuits that utilize silicon as an optical medium in order to allow the silicon photonics transceiver device to process optical data signals, which is viewed as a solution to the issues associated with how to provide the relatively high signal transmission rates required by next generation servers/switch/networking devices. However, silicon photonics transceiver devices tend to be provided with a relatively high circuit density, and high-performance silicon photonics transceiver devices can generate relatively high amounts of heat that must be dissipated.

Conventional transceiver devices rely the conduction of heat generated by (or via component coupled to) their circuit boards though the metal frame/chassis/"cage" of the transceiver device and to its surface in order to dissipate heat, which may be insufficient for current or future silicon photonics transceiver devices. As will be appreciated by one of skill in the art, inability to dissipate the relatively higher amount of heat generated by the silicon photonics transceiver devices discussed above may result in the disruption of the optical data signals in the silicon photonics transceiver device due to the heat or due to noise created by thermal issues, frequency shifts in the optical data signals, failure of the silicon photonics transceiver device, higher heat stresses that can result in transceiver device component failures, higher performance cooling components being required for use with the transceiver device that increase costs, higher levels of cooling system operation that can cause cooling system component failure and/or increased energy consumption costs, and/or other heat-related issues known in the art.

Accordingly, it would be desirable to provide a transceiver device heat dissipation system that addresses the issues discussed above.

SUMMARY

According to one embodiment, an Information Handling System (IHS) includes an Information Handling System (IHS) chassis; a transceiver device connector that is included on the IHS chassis; a transceiver device connected to the transceiver device connector; at least one transceiver component located in the transceiver device; and a plurality of micro-strand heat dissipator elements that are each positioned in the transceiver device in a spaced apart orientation from the others of the plurality of micro-strand heat dissipator elements, wherein each of the plurality of micro-strand heat dissipator elements include: a first micro-strand heat dissipator element portion that engages the at least one transceiver component; and a second micro-strand heat dissipator element portion that extends from the at least one transceiver component.

BRIEF DESCRIPTION OF THE DRAWINGS

FIG. 3A is a schematic top view illustrating an embodiment of a micro-strand heat dissipation element that may be utilized with the processing device of FIGS. 2A and 2B.

FIG. 3B is a schematic side view illustrating an embodiment of the micro-strand heat dissipation element of FIG. 3A.

FIG. 22 is a flow chart illustrating an embodiment of a method for dissipating heat from a transceiver device.

FIG. 23A is a schematic embodiment of the transceiver device of FIG. 18A/18B, 19A/19B, or 20A/20B operating during the method of FIG. 22.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
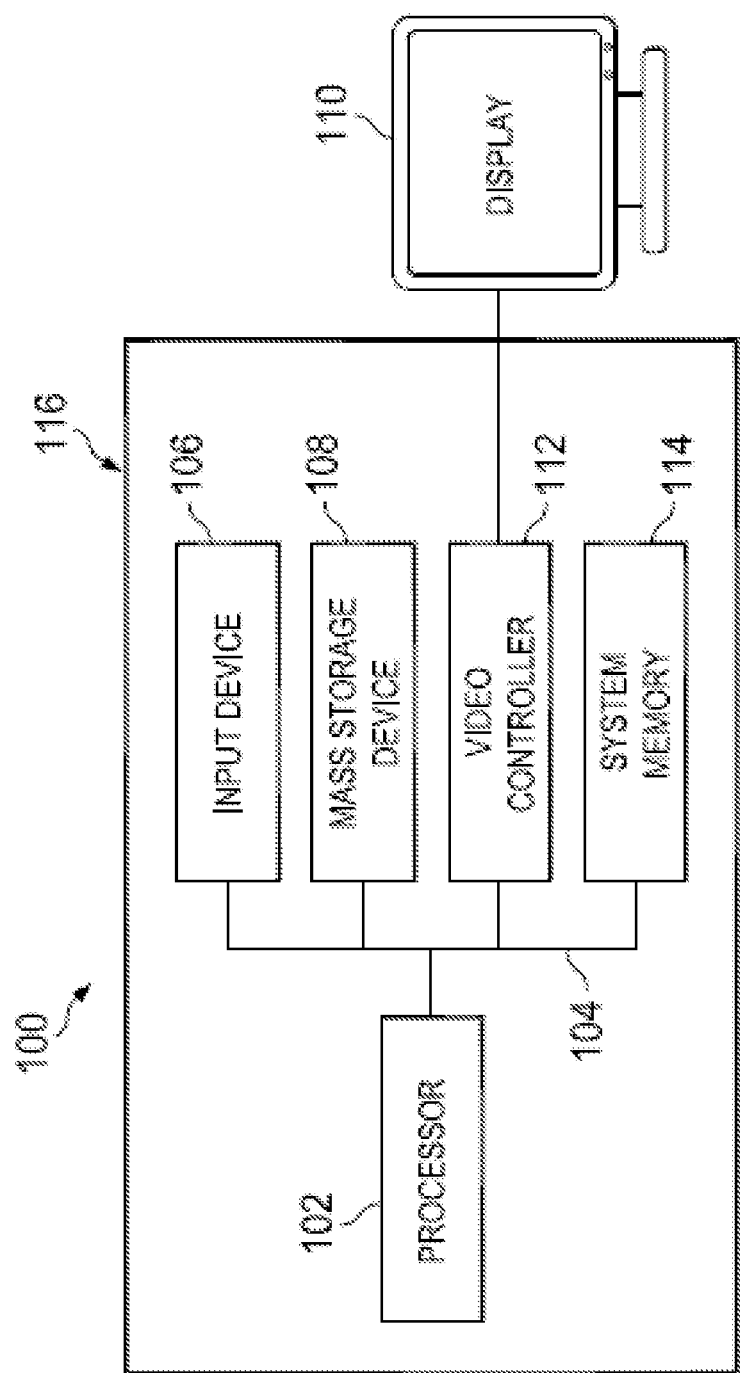
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
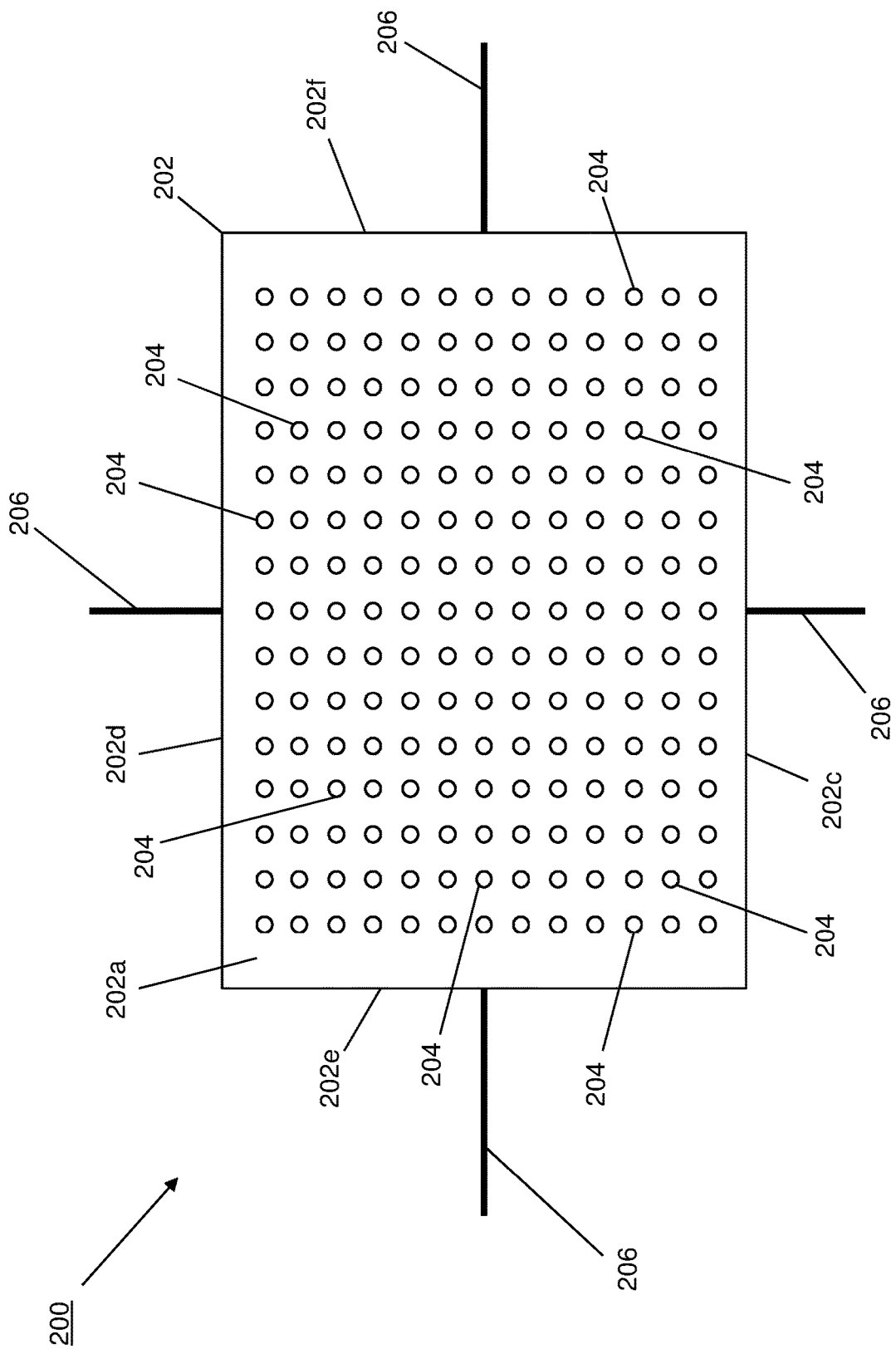
FIG. 2A is a schematic top view illustrating an embodiment of a processing device that may utilize the micro-strand heat dissipation system of the present disclosure.
Figure 2B:
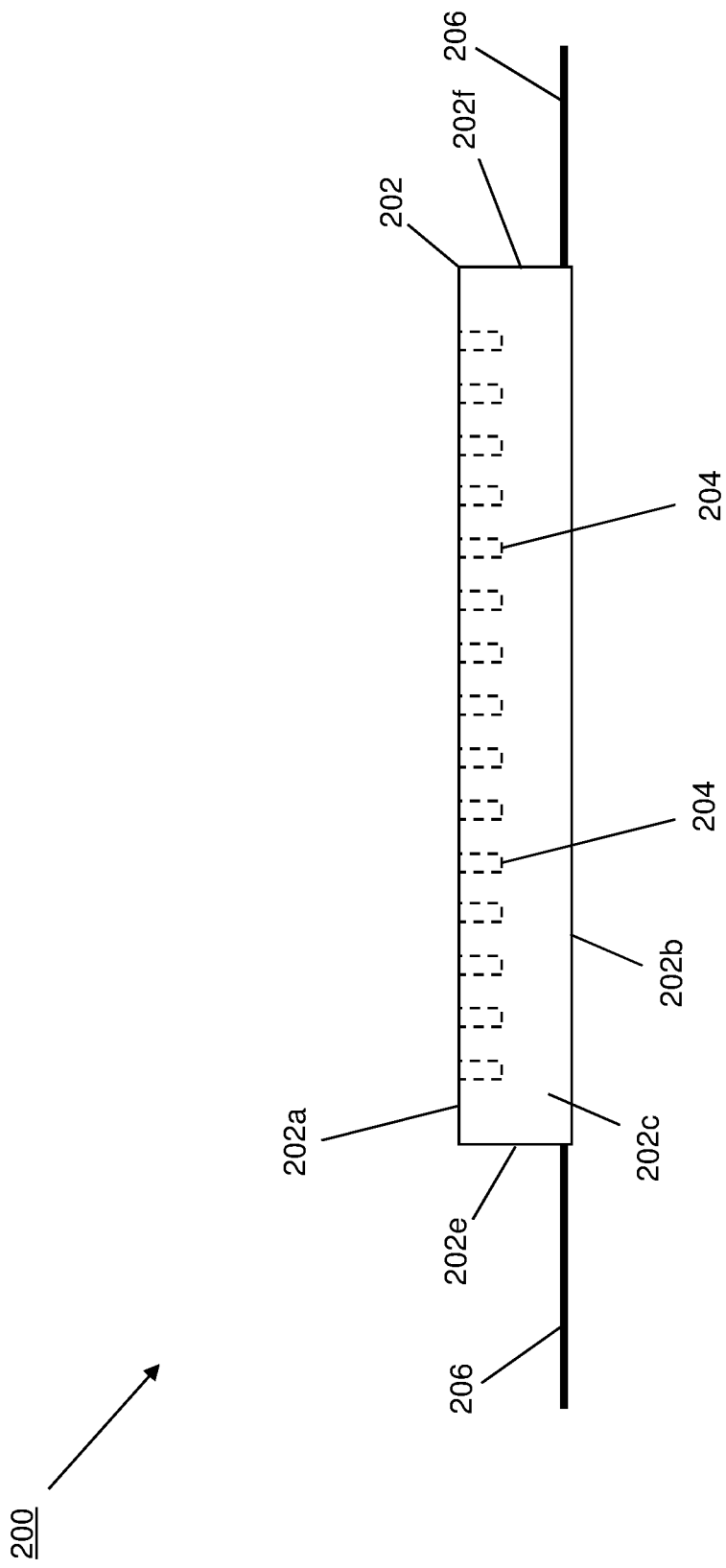
FIG. 2B is a schematic side view illustrating an embodiment of the processing device of FIG. 2A.

Referring now to FIGS. 2A and 2B, an embodiment of a processing device 200 is illustrated that may utilize the micro-strand heat dissipation system of the present disclosure. In many of the examples discussed below, the processing device 200 is described as being provided by a silicon photonics integrated circuit. However, one of skill in the art in possession of the present disclosure will recognize that the processing device 200 may be provided by other processing devices, integrated circuits, and/or heat producing devices while remaining within the scope of the present disclosure as well. In an embodiment, the processing device 200 may be provided as the processor 102 in the IHS 100 discussed above with reference to FIG. 1, or the functionality of the micro-strand heat dissipation system of the present disclosure may be utilized with another heat producing device that is included in the IHS 100. As such, while illustrated and discussed as a processing device, one of skill in the art in possession of the present disclosure will recognize that devices utilizing the micro-strand heat dissipation system of the present disclosure may include any heat producing devices that may be configured to operate similarly as the processing device 200 discussed below.

In the illustrated embodiment, the processing device 200 includes a base 202 having an outer surface that includes a top surface 202a, a bottom surface 202b that is located opposite the base 202 from the top surface 202a, a front surface 202c extending between the top surface 202a and the bottom surface 202b, a rear surface 202d located opposite the base 202 from the front surface 202c and extending between the top surface 202a and the bottom surface, and a pair of side surfaces 202e and 202f that are located opposite the base 202 from each other and that extend between the top surface 202a, the bottom surface 202b, the front surface 202c, and the rear surface 202d. In the schematic illustration of the processing devices provided herein, the base is a rectangle with the front surface, rear surface, and side surfaces of that base oriented perpendicularly to the top surface and the bottom surface of that base, but one of skill in the art in possession of the present disclosure will recognize how the base of a processing system may be provided in different shapes with its front surface, rear surface, and side surfaces oriented at different angles to its top surface and bottom surface, and how those angles may be considered as substantially perpendicular while remaining within the scope of the present disclosure as well.

In some embodiments, processing devices provided in the micro-strand heat dissipation system of the present disclosure may include micro-strand heat dissipator connector features, a specific example of which are illustrated in FIGS. 2A and 2B as a plurality of micro-strand heat dissipator connector holes 204 that are defined by the base 202 and that extend into the base 202 from the top surface 202a. In the example illustrated in FIGS. 2A and 2B, the micro-strand heat dissipator connector holes 204 are provided in an equally spaced, 13×15 rectangular grid, with each micro-strand heat dissipator connector hole 204 extending substantially the same depth into the base 202. However, one of skill in the art in possession of the present disclosure will appreciate that the micro-strand heat dissipator connector holes 204 may be provided in any configuration and may extend different depths into the base 202 while remaining within the scope of the present disclosure as well. For example, in some embodiments the micro-strand heat dissipator connector holes 204 may be provided only in areas/volumes of the base 202 (and extending into the outer surface 202a of the base 202) that are known to become relatively hot during operation of the processing device 200, and may extend into the base 202 such that they are located immediately adjacent heat producing components in the base 202 in order to maximize the amount of cooling provided by the micro-strand heat dissipation system of the present disclosure, discussed in further detail below.

However, while illustrated and described herein as provided by "holes" extending into the base 202 of the processing device 200, one of skill in the art in possession of the present disclosure will recognize that other types of micro-strand heat dissipator connector features may be provided with the processing device 200 to allow the micro-strand heat dissipator elements (discussed below) to be connected to the processing device 200 in a variety of manners that will fall within the scope of the present disclosure as well. Furthermore, as described below, in other embodiments the micro-strand heat dissipator elements of the present disclosure may be integrated as part of processing devices, and thus the micro-strand heat dissipator connector features illustrated and described herein may be omitted, and the processing devices utilizing the micro-strand heat dissipation system of the present disclosure may instead be manufactured, fabricated, and/or otherwise produced with micro-strand heat dissipator element (i.e., rather than the micro-strand heat dissipator elements being connected to the processing device 200 via the micro-strand heat dissipator connector features as discussed in some of the embodiments below).

As illustrated in FIGS. 2A and 2B, processing device coupling elements 206 may extend from the front surface 202c, the rear surface 202d, and the side surfaces 202e and 202f of the base 202, and one of skill in the art in possession of the present disclosure will recognize how the processing device coupling elements 206 may be provided by any processing device/integrated circuit couplings that allow the processing device 200 to be coupled to other components (e.g., via a circuit board or other coupling medium known in the art.) However, while a specific processing device 200 has been illustrated and described, one of skill in the art in possession of the present disclosure will recognize that the micro-strand heat dissipation system of the present disclosure may include a variety of components and component configurations while remaining within the scope of the present disclosure as well.

Referring now to FIGS. 3A and 3B, an embodiment of a micro-strand heat dissipator element 300 is illustrated. In the illustrated embodiment, the micro-strand heat dissipator element 300 includes a base 302 that, in the examples discussed below, is provided with a circular cross-section along a majority of the base 302 such that the base 302 is substantially shaped as an elongated cylinder. However, while illustrated and described as provided by an elongated cylinder, one of skill in the art in possession of the present disclosure will recognize that the micro-strand heat dissipator elements of the present disclosure may be provided with cross-sections having different shapes other than those illustrated herein in order to provide the base of the micro-strand heat dissipator element with different shapes other than those illustrated while remaining within the scope of the present disclosure as well. In different embodiments, the base 302 may be provided using a copper material, an aluminum material, and/or other heat conducting materials that would be apparent to one of skill in the art in possession of the present disclosure.

As illustrated, the base 302 of the micro-strand heat dissipator element 300 includes a top end 302a and a bottom end 302b that is located opposite the base 302 from the top end 302a. Furthermore, the base 302 may include a diameter 302c (or other "thickness") that may vary based on the implementation of the micro-strand heat dissipation system. For example, in some embodiments the diameter 302c (or other thickness) of the base 302 of the micro-strand heat dissipator element 300 may be similar to that of a human hair (e.g., 0.04 mm to 0.1 mm). As such, one of skill in the art in possession of the present disclosure will appreciate that the examples of the micro-strand heat dissipator elements 300 illustrated herein may not be draw to scale in order to allow for features of those micro-strand heat dissipator elements 300 (as well as features of the processing device 200 in some embodiments) to be clearly visible for discussion. Furthermore, one of skill in the art in possession of the present disclosure will appreciate that larger diameters or thicknesses of the base 302 of the micro-strand heat dissipator element 300 may be utilized while remaining within the scope of the present disclosure as well.

As discussed in further detail below, the base 302 of the micro-strand heat dissipator element 300 may include a first micro-strand heat dissipator element portion 304 that extends between the top end 302a of the base 302 and a location on the base 302 that is located between the top end 302a and the bottom end 302b of the base 302, and that is configured to extend from an outer surface of the processing device with which it is utilized in the micro-strand heat dissipation system of the present disclosure. The base 302 of the micro-strand heat dissipator element 300 may also include a second micro-strand heat dissipator element portion 306 that extends from the first micro-strand heat dissipator element portion 304 of the base 302 and to the bottom end 302b of the base 302, and that is configured to extend into the base of the processing device with which it is utilized in the micro-strand heat dissipation system of the present disclosure. One of skill in the art in possession of the present disclosure will recognize that the length of the first micro-strand heat dissipator element portion 304 extending from the processing device and the length of the second micro-strand heat dissipator element portion 306 extending into the processing device may be selected based on heat dissipation requirements for the processing device, structural integrity of the micro-strand heat dissipator element 300, and/or any other system characteristics that would be apparent to one of skill in the art in possession of the present disclosure.

As such, one of skill in the art in possession of the present disclosure will appreciate that the length of the first micro-strand heat dissipator element portion and the second micro-strand heat dissipator element portion on any particular micro-strand heat dissipator element utilized in the micro-strand heat dissipation system of the present disclosure may vary relative to the first micro-strand heat dissipator element portion and the second micro-strand heat dissipator element portion on other micro-strand heat dissipator elements utilized in the micro-strand heat dissipation system of the present disclosure while remaining within the scope of the present disclosure. For example, as discussed in some embodiment of the present disclosure below, different micro-strand heat dissipator elements may extend different depths into the base of the processing device with which they are utilized in the micro-strand heat dissipation system of the present disclosure, and/or different micro-strand heat dissipator elements may extend different lengths from the outer surface on the base of the processing device with which they are utilized in the micro-strand heat dissipation system of the present disclosure. However, while a particular micro-strand heat dissipator element 300 has been described, one of skill in the art in possession of the present disclosure will appreciate that micro-strand heat dissipator elements may include a variety of configurations for providing the functionality discussed below while remaining within the scope of the present disclosure as well.

Figure 4A:
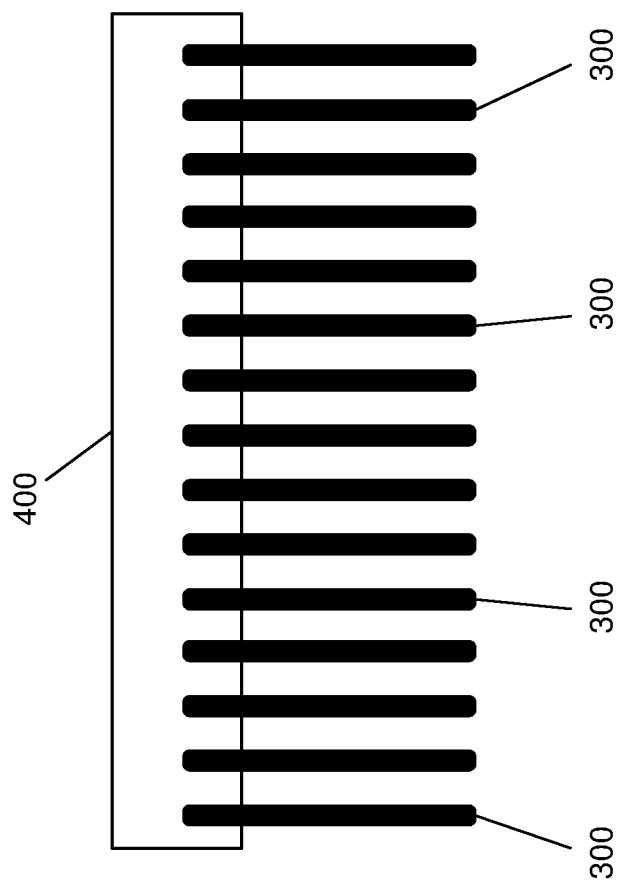
FIG. 4A is a schematic side view illustrating an embodiment of a plurality of the micro-strand heat dissipation elements of FIG. 3 provided for connection to a processing device.
Figure 4B:
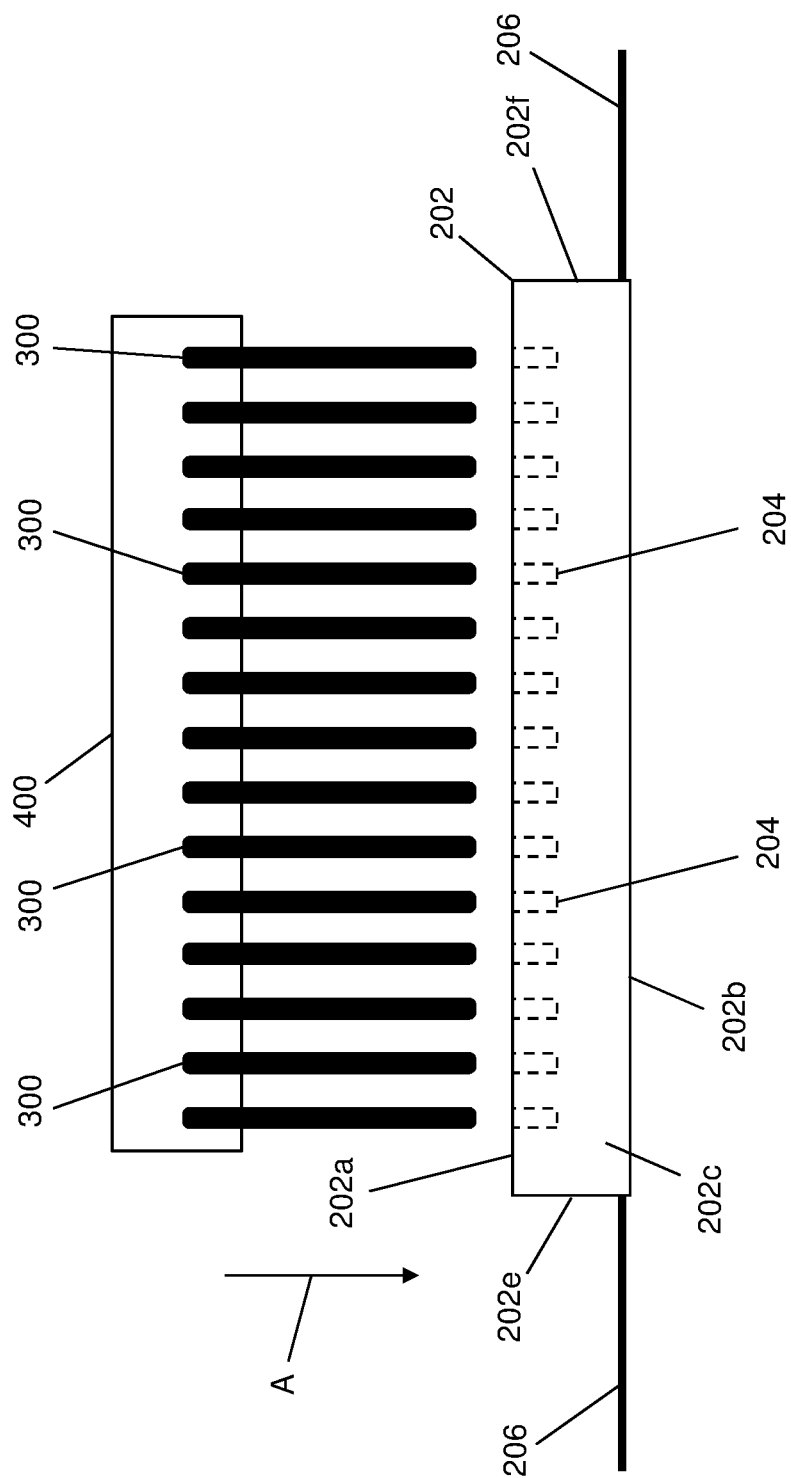
FIG. 4B is a schematic side view illustrating an embodiment of the plurality of micro-strand heat dissipation elements of FIG. 4A being connected to the processing device of FIGS. 2A and 2B.

In the embodiment illustrated in FIG. 4A, a micro-strand heat dissipator element carrier 400 is illustrated that is coupled to a plurality of the micro-strand heat dissipator elements 300 (e.g., to the top ends 302a of the base 302 on the micro-strand heat dissipator elements 300 discussed above with reference to FIG. 3) and that positions the micro-strand heat dissipator elements 300 in a configuration that corresponds to the configuration of the micro-strand heat dissipator connector features on the processing device to which those micro-strand heat dissipator elements 300 will be connected. For example, FIG. 4B illustrates how the micro-strand heat dissipator element carrier 400 coupled to the plurality of the micro-strand heat dissipator elements 300 may be positioned adjacent the top surface 202a of the processing device 200 such that respective micro-strand heat dissipator elements 300 are aligned with respective micro-strand heat dissipator connector holes 204 defined by the base 202 of the processing device 200. While not explicitly illustrated, one of skill in the art in possession of the present disclosure will appreciate that the micro-strand heat dissipator element carrier 400 may be coupled to the plurality of the micro-strand heat dissipator elements 300 in a variety of manners that allows the plurality of the micro-strand heat dissipator elements 300 to be released from the micro-strand heat dissipator element carrier 400 as discussed below.

Figure 4C:
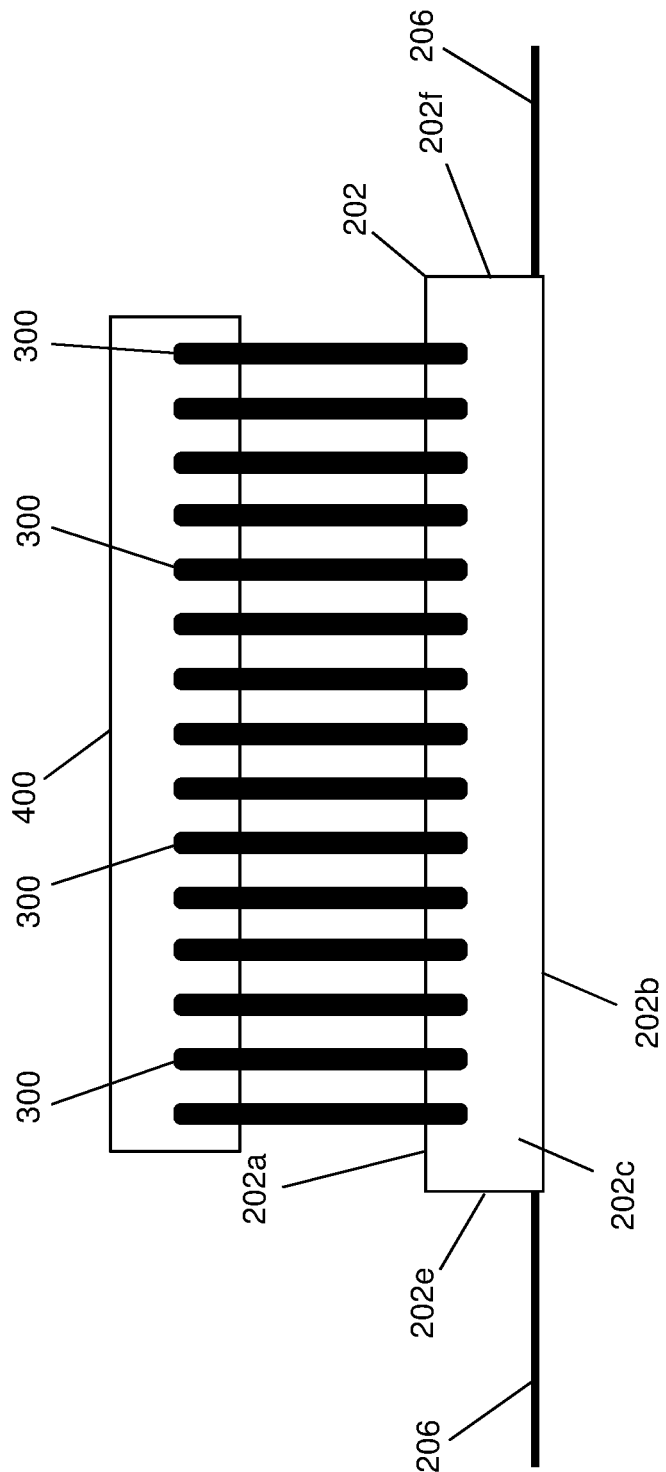
FIG. 4C is a schematic side view illustrating an embodiment of the plurality of micro-strand heat dissipation elements of FIG. 4A being connected to the processing device of FIGS. 2A and 2B.
Figure 4D:
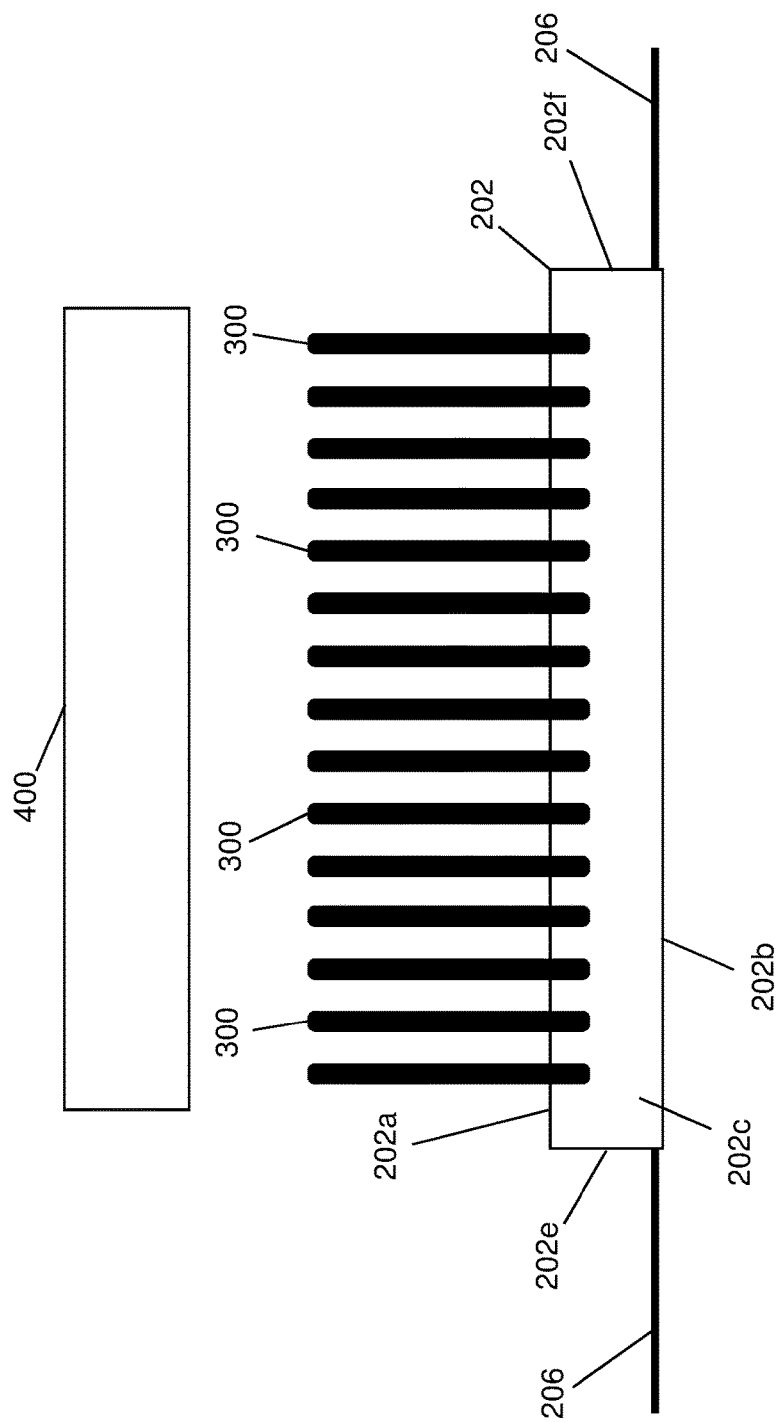
FIG. 4D is a schematic side view illustrating an embodiment of the plurality of micro-strand heat dissipation elements of FIG. 4A connected to the processing device of FIGS. 2A and 2B.

As illustrated in FIGS. 4B and 4C, the micro-strand heat dissipator element carrier 400 coupled to the plurality of the micro-strand heat dissipator elements 300 may be moved in a direction A such that each of the micro-strand heat dissipator elements 300 extend into the micro-strand heat dissipator connector holes 204. As illustrated in FIG. 4D, the plurality of the micro-strand heat dissipator elements 300 may then be released from the micro-strand heat dissipator element carrier 400, and the micro-strand heat dissipator element carrier 400 may be moved opposite the direction A. One of skill in the art in possession of the present disclosure will appreciate that the micro-strand heat dissipator elements 300 located in the micro-strand heat dissipator connector holes 204 defined by the base 202 of the processing device 200 may be connected to the base 202 and/or secured in the micro-strand heat dissipator connector holes 204 using a variety of techniques. For example, prior to positioning the micro-strand heat dissipator elements 300 in the micro-strand heat dissipator connector holes 204, a heat conductive adhesive may be provided on the bottom end 302b of the micro-strand heat dissipator elements 300 and/or micro-strand heat dissipator connector holes 204 defined by the base 202, and following the positioning of the micro-strand heat dissipator elements 300 in the micro-strand heat dissipator connector holes 204, that heat conductive adhesive may be allowed to dry to connect/secure the micro-strand heat dissipator elements 300 to the micro-strand heat dissipator connector holes 204 defined by the base 202 of the processing device 200. However, in other embodiments, mechanical couplings and/or other coupling subsystems known in the art may be utilized to connect/secure the micro-strand heat dissipator elements 300 to the micro-strand heat dissipator connector holes 204 defined by base 202 of the processing device 200 while remaining within the scope of the present disclosure as well.

As such, each of the micro-strand heat dissipator connector holes 204 defined by base 202 of the processing device 200 may have a respective micro-strand heat dissipator element 300 coupled thereto, with the second micro-strand heat dissipator element portion 306 on each micro-strand heat dissipator element 300 extending into the base 202 from its top surface 202a, and the first micro-strand heat dissipator element portion 304 on each micro-strand heat dissipator element 300 extending from the top surface 202a of the base 202, as illustrated in FIG. 4D. Furthermore, the micro-strand heat dissipator elements 300 may be provided on the processing device 200 in a spaced apart, rectangular configuration that corresponds to the configuration of the micro-strand heat dissipator connector holes 204 and that provides a 13×15 grid of micro-strand heat dissipator elements 300 extending from the top surface 202a of the processing device 200.

Figure 4E:
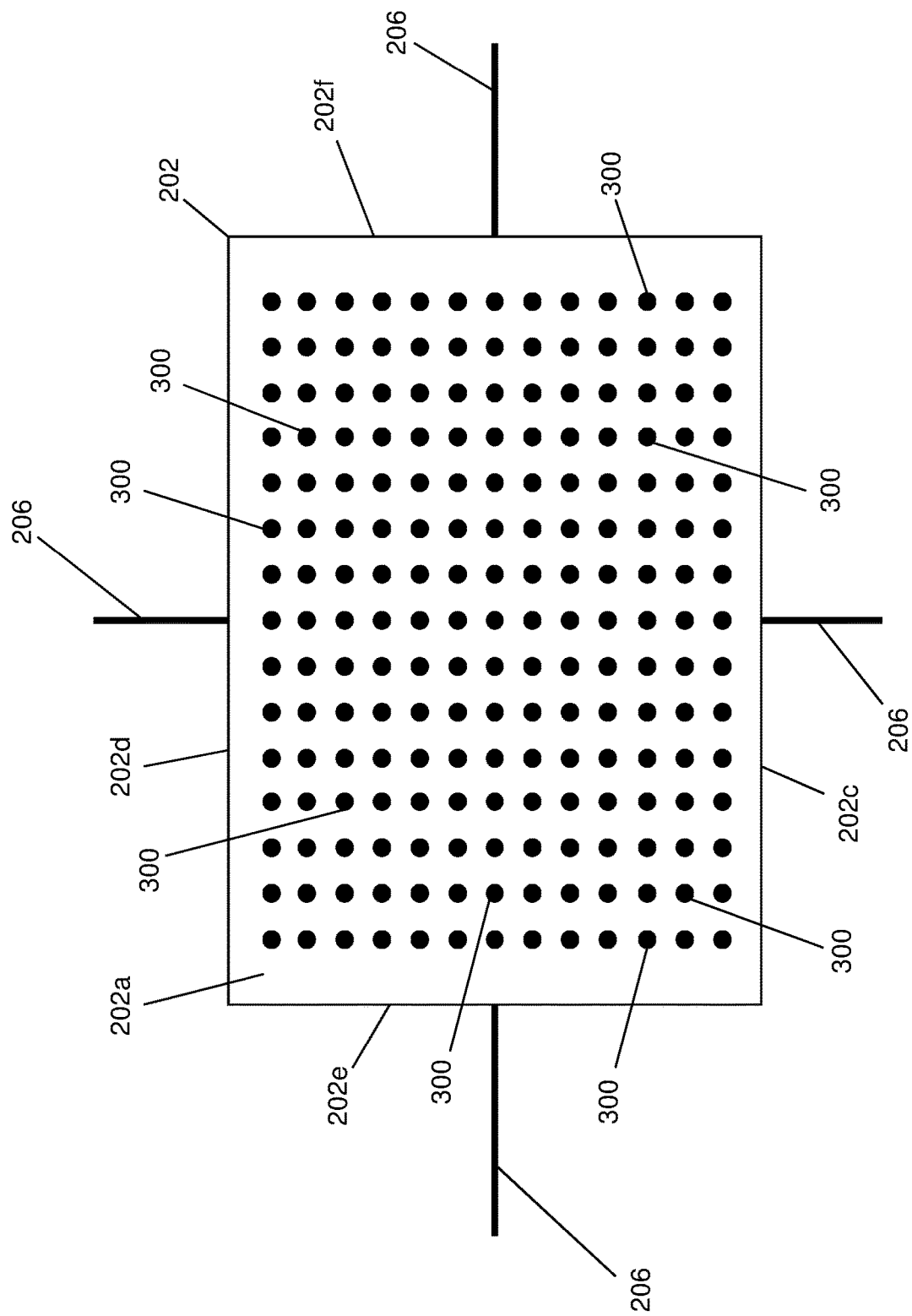
FIG. 4E is a schematic top view illustrating an embodiment of the plurality of micro-strand heat dissipation elements of FIG. 4A connected to the processing device of FIGS. 2A and 2B.

However, while discussed above with reference to FIGS. 4A-4E as being provided by the connection/securing of the micro-strand heat dissipator elements 300 to the micro-strand heat dissipator connector holes 204 defined by the base 202 of the processing device 200, in other embodiments the micro-strand heat dissipator connector features/holes 204 may be omitted, and the micro-strand heat dissipator elements 300 may be integrated with the processing device 200 in the configuration illustrated in FIGS. 4D and 4E during, for example, the manufacturing, fabrication, and/or other provisioning of the processing device 200. As such, one of skill in the art in possession of the present disclosure will appreciate that the micro-strand heat dissipator element configuration illustrated in FIGS. 4D and 4E may be provided on a processing device in a variety of manners that will fall within the scope of the present disclosure as well.

Figure 5A:
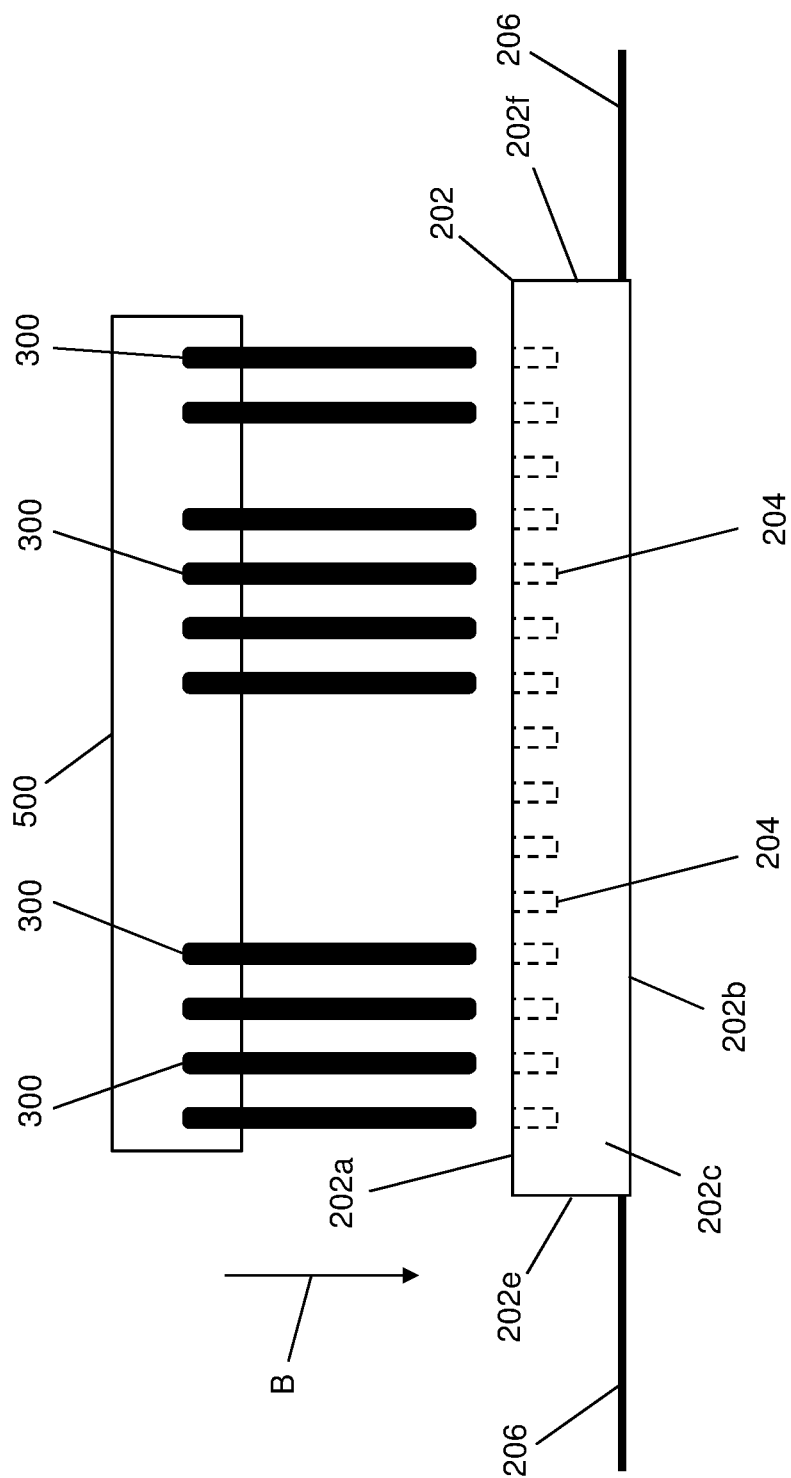
FIG. 5A is a schematic side view illustrating an embodiment of a plurality of the micro-strand heat dissipation elements of FIG. 3 being connected to the processing device of FIGS. 2A and 2B.
Figure 5B:
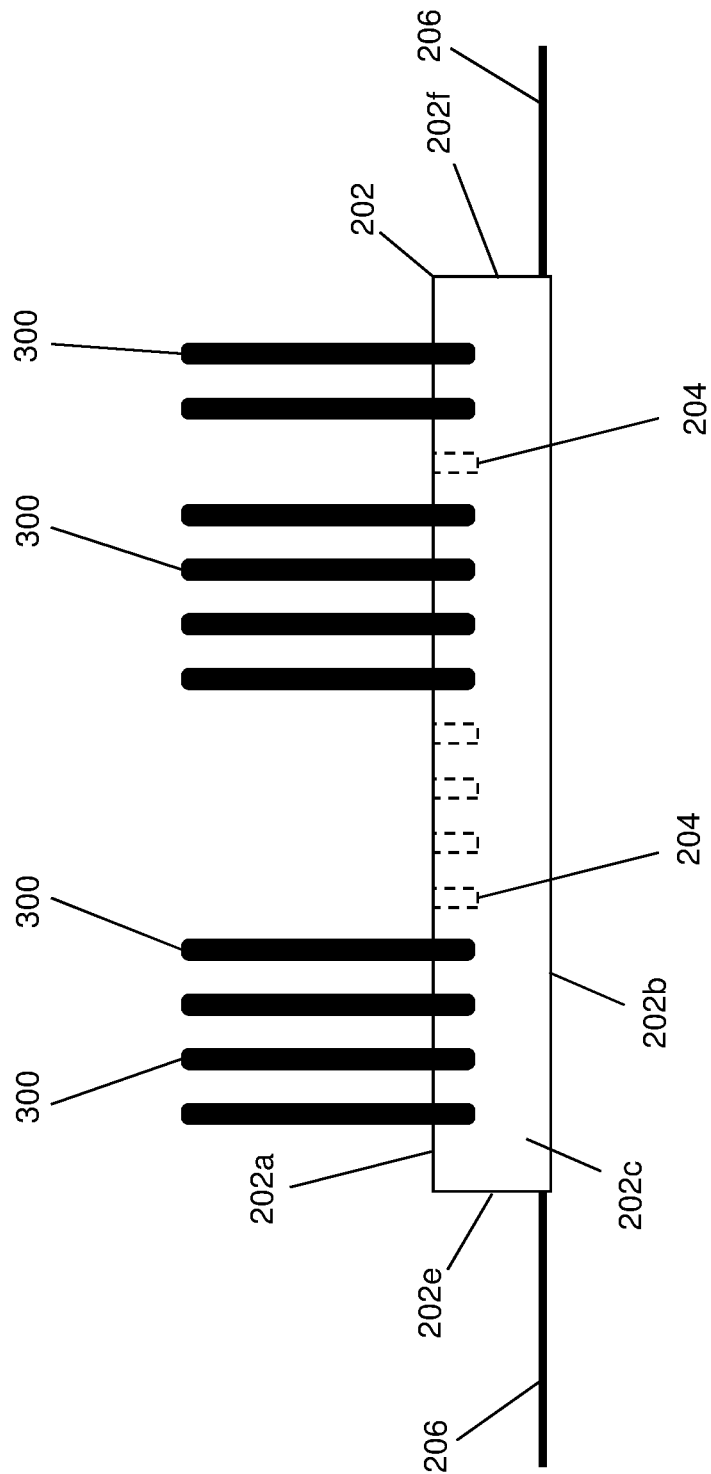
FIG. 5B is a schematic side view illustrating an embodiment of a plurality of the micro-strand heat dissipation elements of FIG. 3 connected to the processing device of FIGS. 2A and 2B.
Figure 5C:
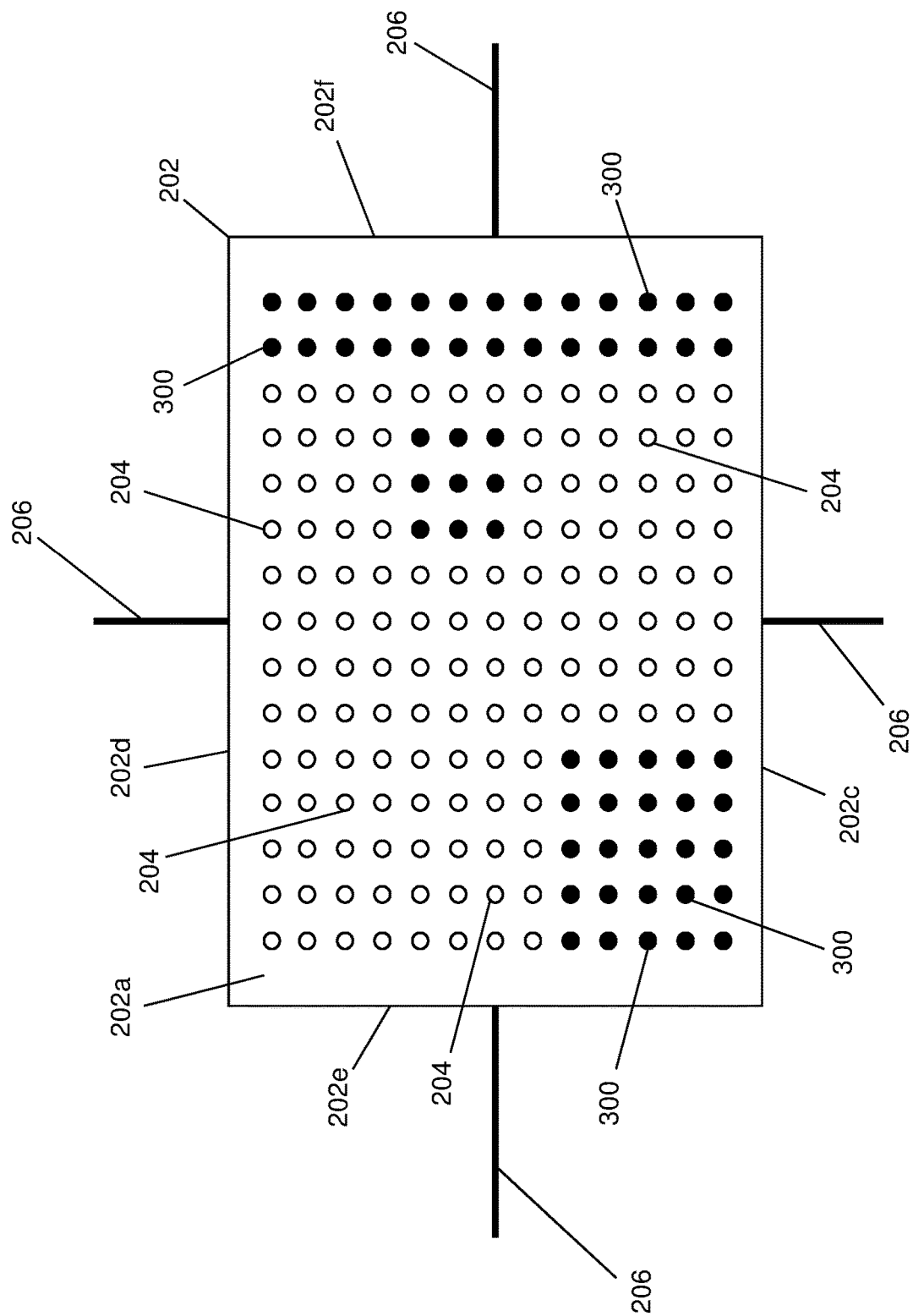
FIG. 5C is a schematic top view illustrating an embodiment of a plurality of the micro-strand heat dissipation elements of FIG. 3 connected to the processing device of FIGS. 2A and 2B.

With reference to FIGS. 5A, 5B, and 5C, another embodiment of the provisioning of the micro-strand heat dissipator elements 300 of the present disclosure on a processing device is illustrated. FIG. 5A illustrates a micro-strand heat dissipator element carrier 500 that is coupled to a plurality of the micro-strand heat dissipator elements 300 (e.g., to the top ends 302a of the base 302 on the micro-strand heat dissipator elements 300) and that positions the micro-strand heat dissipator elements 300 in a configuration that may correspond to a heat generation profile of the processing device to which those micro-strand heat dissipator elements 300 will be connected. In one example, the micro-strand heat dissipator element carrier 500 may be provided with the micro-strand heat dissipator elements 300 in the configuration illustrated in FIGS. 5A-5C based on expected heat production of processing device components in the base 202 of the processing device 200 (e.g., micro-strand heat dissipator elements 300 may be provided on the micro-strand heat dissipator element carrier 500 so that they may be connected/secured to the processing device 200 adjacent the highest heat generating components in the processing device 200). In another example, the processing device 200 may be tested to determine how heat is generated by the processing device 200 during its operations, and areas/volumes of the processing device 200 that generate relatively high amounts of heat during its operation may be identified. As will be appreciated by one of skill in the art in possession of the present disclosure, the identification of such a heat generation profile for the processing device 200 may allow the micro-strand heat dissipator element carrier 500 to be provided with the micro-strand heat dissipator elements 300 in the configuration that is illustrated in FIGS. 5A-5C and that correspond to the areas/volumes of the processing device 200 that generate relatively high amounts of heat during its operation. However, while two specific examples have been provided, the configuration of the micro-strand heat dissipator elements 300 in the micro-strand heat dissipator element carrier 500 may be determined in a variety of manners that will fall within the scope of the present disclosure as well.

FIG. 5A illustrates how the micro-strand heat dissipator element carrier 500 coupled to the plurality of the micro-strand heat dissipator elements 300 may be positioned adjacent the top surface 202a of the processing device 200 such that the micro-strand heat dissipator elements 300 are aligned with corresponding micro-strand heat dissipator connector holes 204 defined by the base 202 of the processing device 200. While not explicitly illustrated, one of skill in the art in possession of the present disclosure will appreciate that the micro-strand heat dissipator element carrier 500 may be coupled to the plurality of the micro-strand heat dissipator elements 300 in a variety of manners that allows the plurality of the micro-strand heat dissipator elements 300 to be released from the micro-strand heat dissipator element carrier 500 as discussed below.

As illustrated in FIGS. 5A and 5B, the micro-strand heat dissipator element carrier 500 coupled to the plurality of the micro-strand heat dissipator elements 300 may be moved in a direction B such that each of the micro-strand heat dissipator elements 300 extend into corresponding micro-strand heat dissipator connector holes 204. Similarly as discussed above, the plurality of the micro-strand heat dissipator elements 300 may then be released from the micro-strand heat dissipator element carrier 500, and the micro-strand heat dissipator element carrier 500 may be moved opposite the direction B. One of skill in the art in possession of the present disclosure will appreciate that the micro-strand heat dissipator elements 300 located in corresponding micro-strand heat dissipator connector holes 204 defined by the base 202 of the processing device 200 may be connected to the base 202 and/or secured in those micro-strand heat dissipator connector holes 204 using a variety of techniques. Similarly as discussed above, prior to positioning the micro-strand heat dissipator elements 300 in corresponding micro-strand heat dissipator connector holes 204, a heat conductive adhesive may be provided on the bottom end 302b of the micro-strand heat dissipator elements 300 and/or those micro-strand heat dissipator connector holes 204 defined by the base 202, and following the positioning the micro-strand heat dissipator elements 300 in corresponding micro-strand heat dissipator connector holes 204, the heat conductive adhesive may be allowed to dry to connect/secure the micro-strand heat dissipator elements 300 to corresponding micro-strand heat dissipator connector holes 204 defined by the base 202 of the processing device 200. However, in other embodiments, mechanical couplings and/or other coupling subsystems known in the art may be utilized to connect/secure the micro-strand heat dissipator elements 300 to corresponding micro-strand heat dissipator connector holes 204 defined by base 202 of the processing device 200 while remaining within the scope of the present disclosure as well.

As such, subsets of the micro-strand heat dissipator connector holes 204 defined by base 202 of the processing device 200 may have a respective micro-strand heat dissipator element 300 coupled thereto, with the second micro-strand heat dissipator element portion 306 on each of those micro-strand heat dissipator element 300 extending into the base 202 from the top surface 202a, and the first micro-strand heat dissipator element portion 304 on each of those micro-strand heat dissipator element 300 extending from the top surface 202a of the base 202, as illustrated in FIG. 5B. Furthermore, the micro-strand heat dissipator elements 300 may be provided on the processing device 200 in respective configurations that are illustrated as providing a 5×5 grid of micro-strand heat dissipator elements 300 extending from an area on the top surface 202a of the processing device 200, a 3×3 grid of micro-strand heat dissipator elements 300 extending from an area on the top surface 202a of the processing device 200, and a 13×2 grid of micro-strand heat dissipator elements 300 extending from an area on the top surface 202a of the processing device 200, which as discussed above may provided those micro-strand heat dissipator element grids immediately adjacent areas/volumes of the base 202 of the processing device 200 that are expected to (or known) to generate relatively high amounts of heat.

Figure 6A:
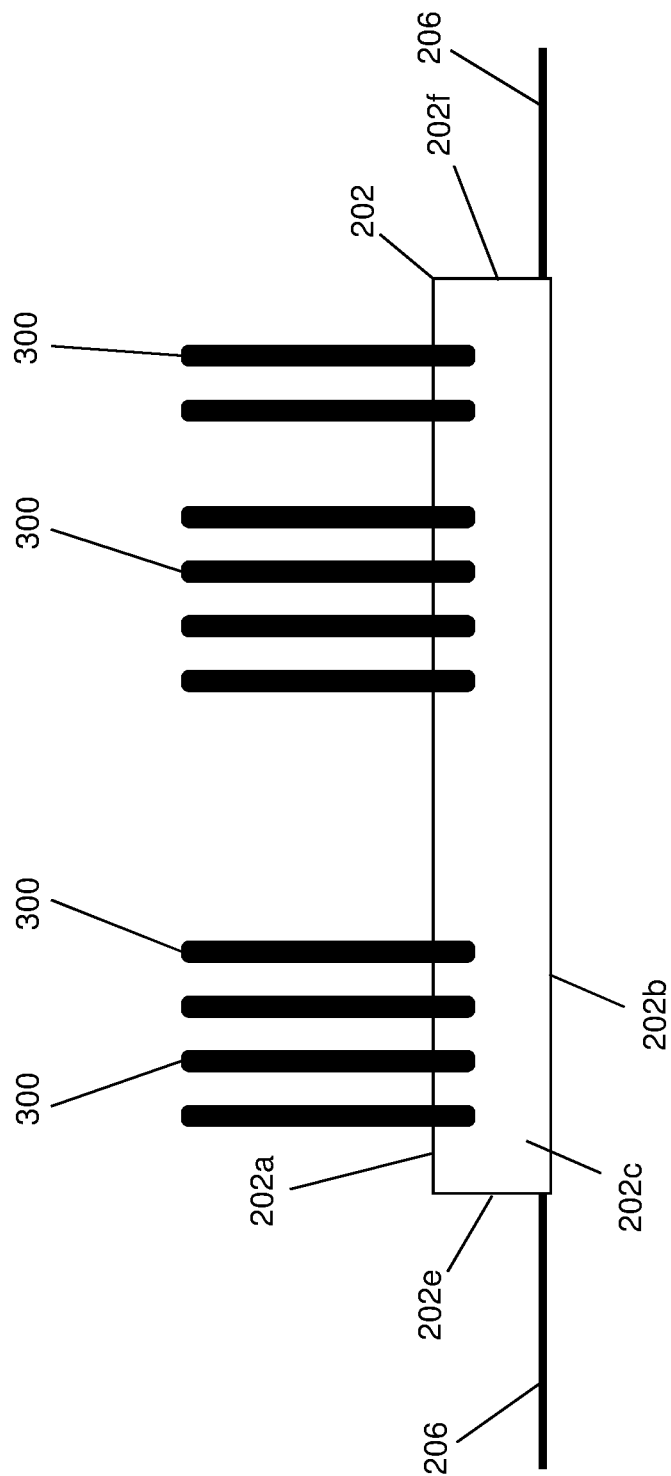
FIG. 6A is a schematic side view illustrating an embodiment of a plurality of the micro-strand heat dissipation elements of FIG. 3 integrated in a processing device.
Figure 6B:
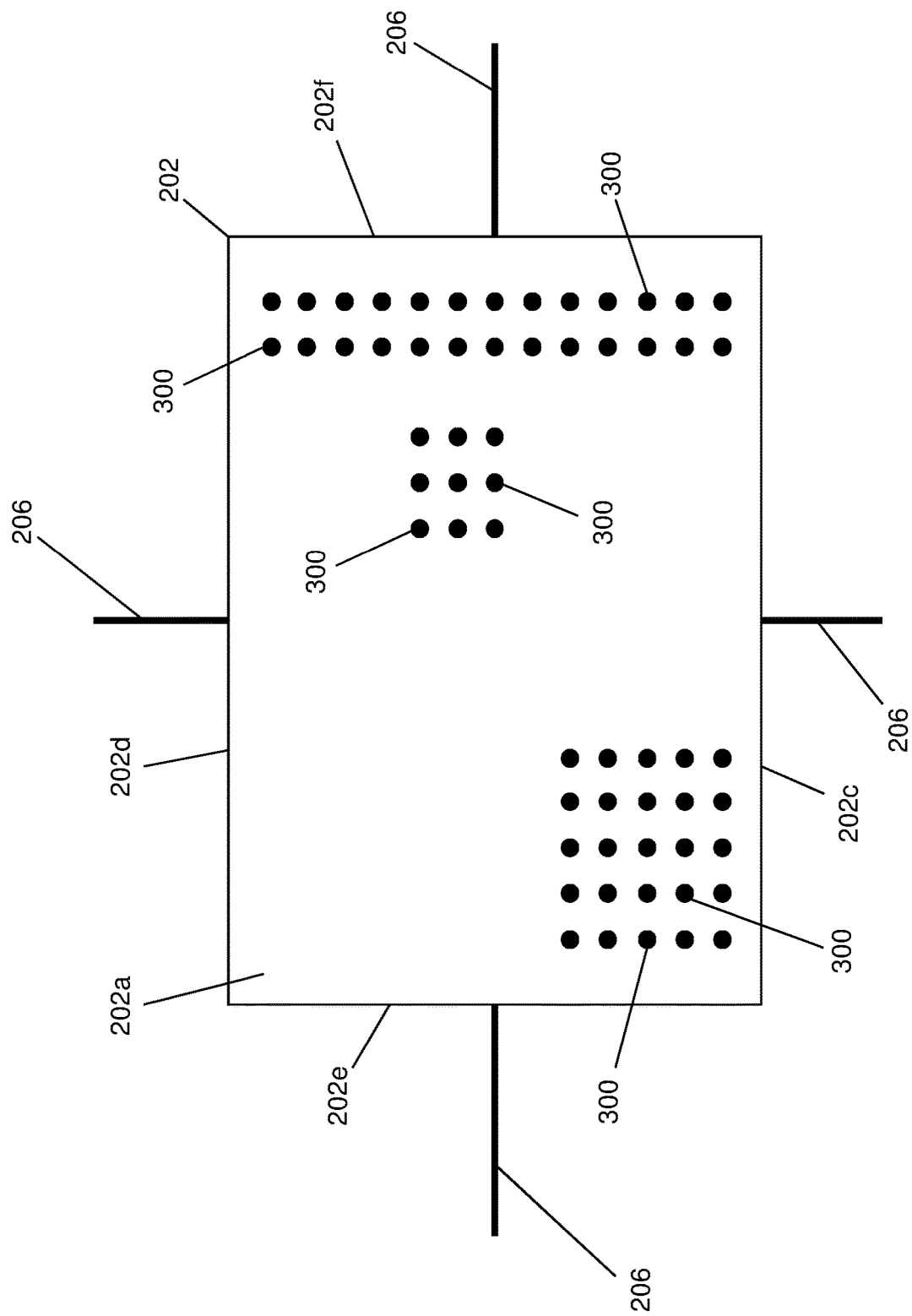
FIG. 6B is a schematic top view illustrating an embodiment of the processing device with the plurality of integrated micro-strand heat dissipation elements of FIG. 6A.

However, while discussed above with reference to FIGS. 5A-5C as being provided by the connection/securing of the micro-strand heat dissipator elements 300 to the micro-strand heat dissipator connector holes 204 defined by the base 202 of the processing device, FIGS. 6A and 6B illustrate how the micro-strand heat dissipator connector holes 204 may be omitted, and the micro-strand heat dissipator elements 300 may be integrated with the processing device 200 in the same configuration illustrated in FIGS. 5B and 5C during the manufacturing, fabrication, or other provisioning of the processing device 200. As such, one of skill in the art in possession of the present disclosure will appreciate that the micro-strand heat dissipator element configuration illustrated in FIGS. 5B and 5C may be provided in a variety of manners that will fall within the scope of the present disclosure as well.

Figure 7:
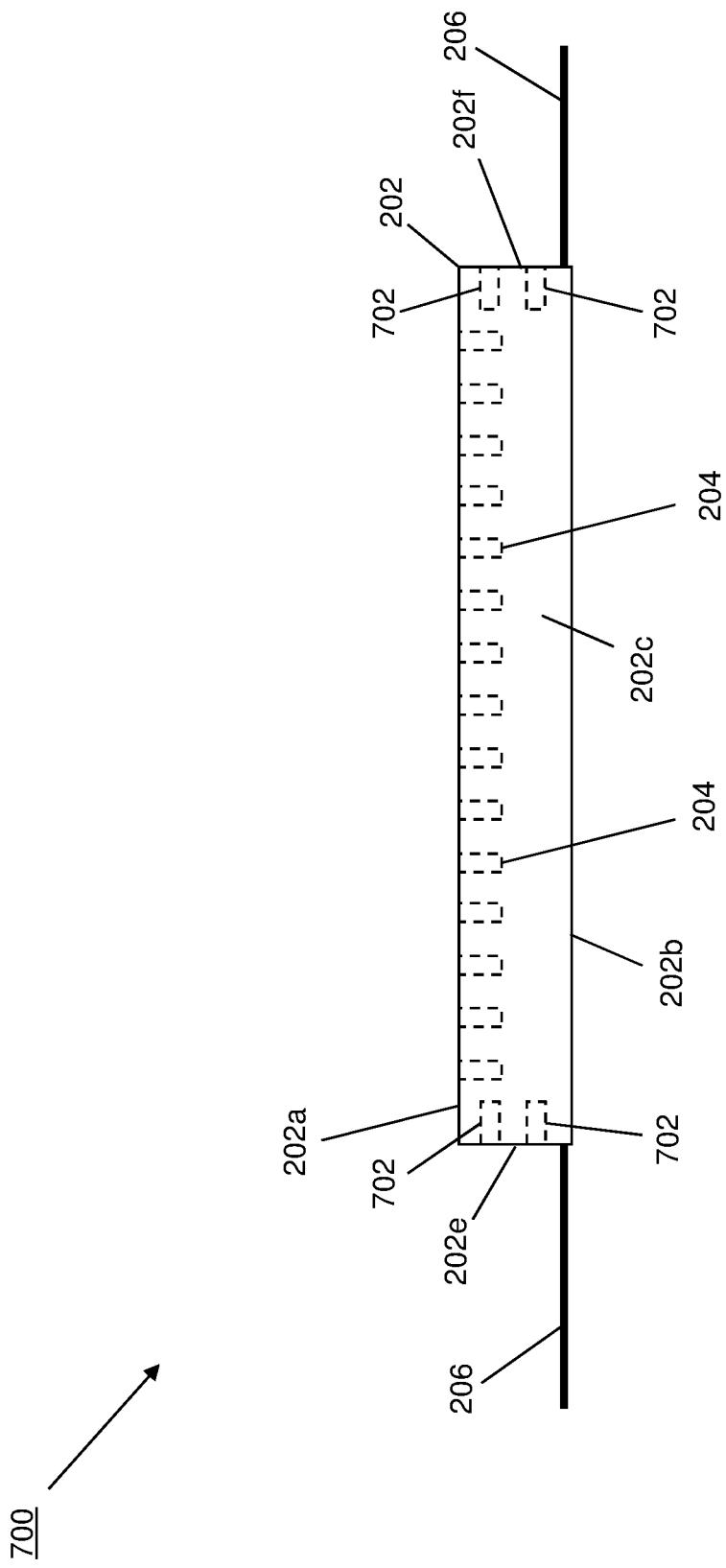
FIG. 7 is a schematic side view illustrating an embodiment of a processing device that may utilized the micro-strand heat dissipation system of the present disclosure.

Referring now to FIG. 7, an embodiment of a processing device 700 is illustrated that is similar to the processing device 200 discussed above with reference to FIGS. 2A and 2B, but with additional micro-strand heat dissipator connector features. As such, the processing device 700 is illustrated with similar reference numbers for elements that are shared with the processing device 200. In the specific example illustrated in FIG. 7, the additional micro-strand heat dissipator connector features are illustrated as a plurality of micro-strand heat dissipator connector holes 702 that are defined by the base 202 and that extend into the side surfaces 202e and 202f of the base 202. Furthermore, as discussed below, a plurality of micro-strand heat dissipator connector holes 702 may also extend into the base 202 from the front surface 202c and the rear surface 202d as well. Similarly as discussed above, the micro-strand heat dissipator connector holes 204 may be provided in any configuration and may extend different depths into the base 202 while remaining within the scope of the present disclosure as well. For example, micro-strand heat dissipator connector holes 204 may be provided only in areas on the outer surface of the base 202 that are known to become relatively hot during operation of the processing device 700, and may extend into the base 202 and adjacent heat producing components in the base 202 in order to maximize the amount of cooling provided by the micro-strand heat dissipation system of the present disclosure, discussed in further detail below.

However, while illustrated and described herein as provided by "holes" extending into the base 202 of the processing device 700, one of skill in the art in possession of the present disclosure will recognize that other types of micro-strand heat dissipator connector features may be provided with the processing device 700 to allow the micro-strand heat dissipator elements 300 to be connected to the processing device 700 in a variety of manners that will fall within the scope of the present disclosure as well. Furthermore, similarly as described above, in other embodiments the micro-strand heat dissipator elements of the present disclosure may be integrated as part of processing devices, and thus the micro-strand heat dissipator connector features discussed above may be omitted, and the processing devices utilizing the micro-strand heat dissipation system of the present disclosure may be manufactured, fabricated, or otherwise provisioned with micro-strand heat dissipator elements (i.e., rather than connecting the micro-strand heat dissipator elements to the processing device 700 via the micro-strand heat dissipator connector features as discussed above).

Figure 8A:
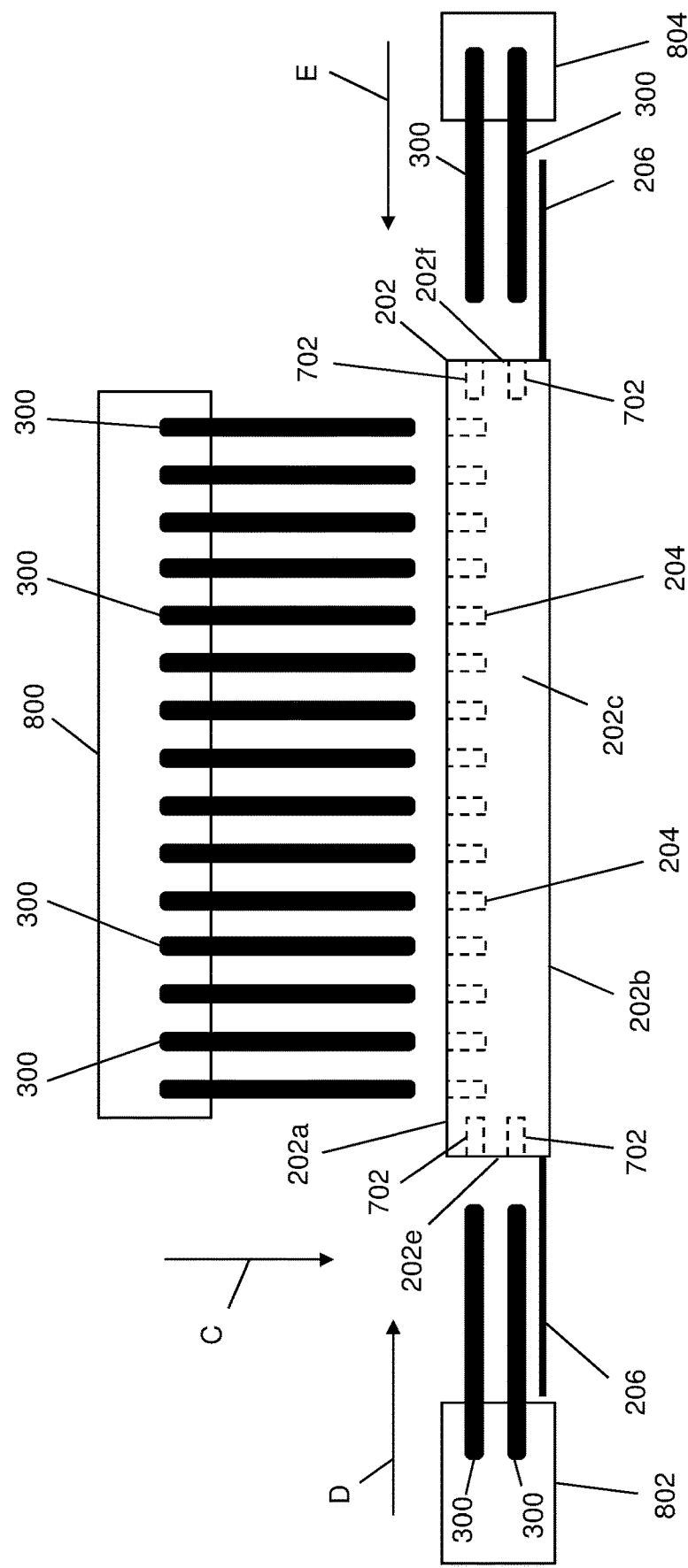
FIG. 8A is a schematic side view illustrating an embodiment of a plurality of the micro-strand heat dissipation elements of FIG. 3 being connected to the processing device of FIG. 7.
Figure 8B:
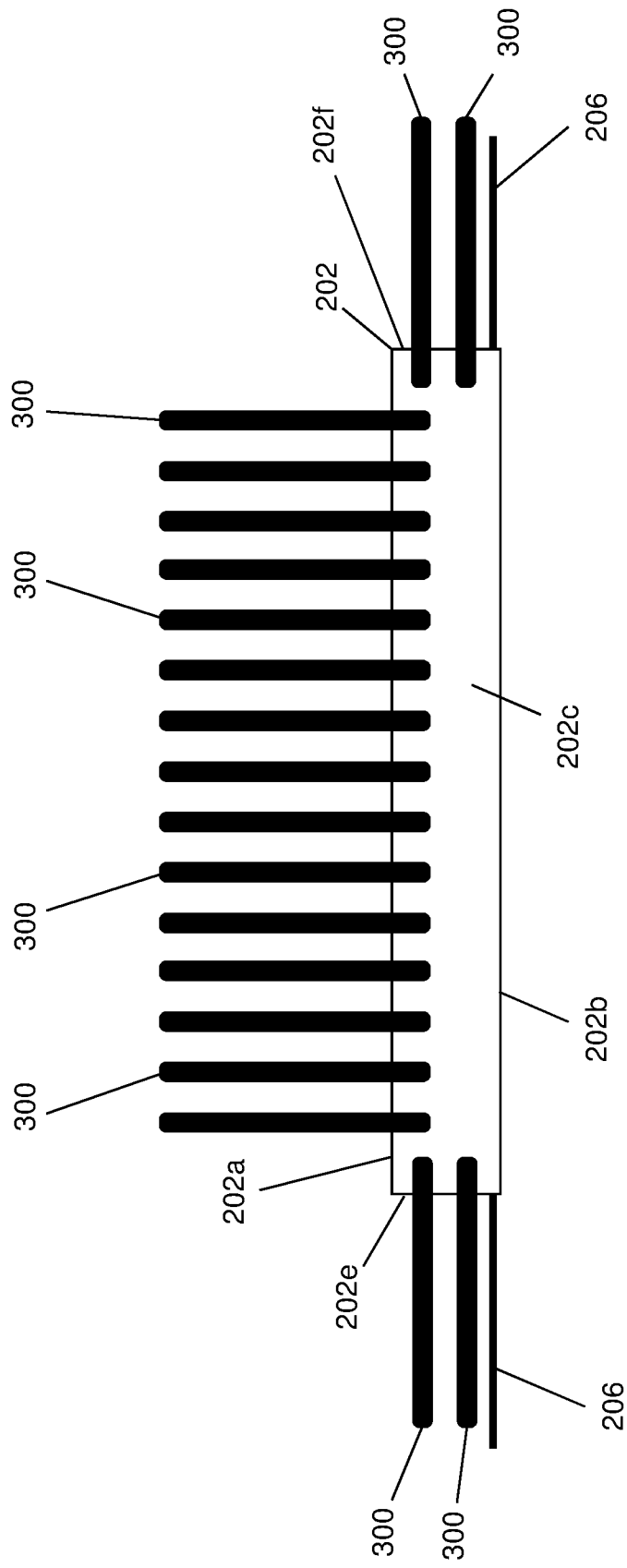
FIG. 8B is a schematic side view illustrating an embodiment of a plurality of the micro-strand heat dissipation elements of FIG. 3 connected to the processing device of FIG. 7.
Figure 8C:
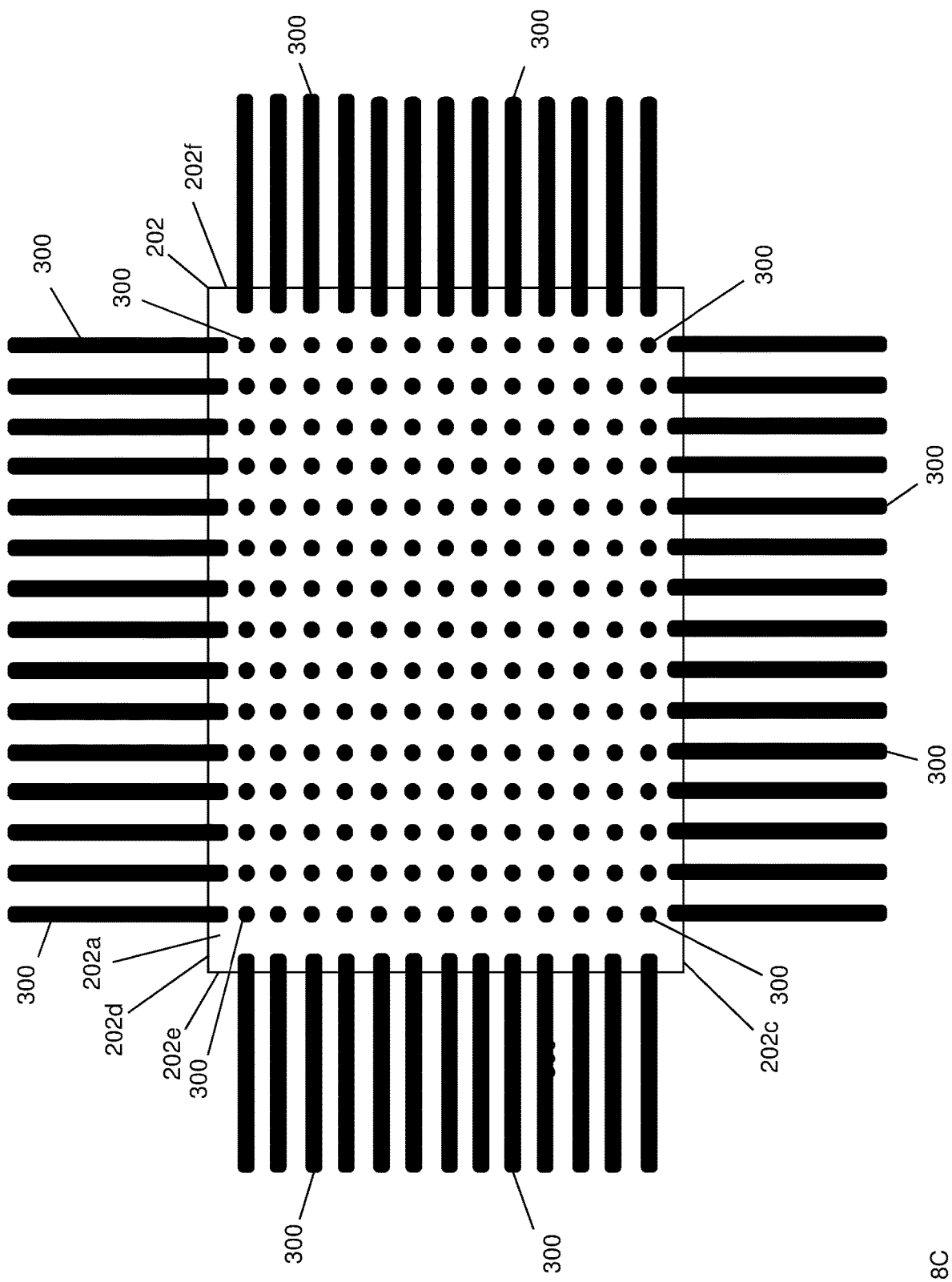
FIG. 8C is a schematic top view illustrating an embodiment of a plurality of the micro-strand heat dissipation elements of FIG. 3 connected to the processing device of FIG. 7.

With reference to FIGS. 8A, 8B, and 8C, another embodiment of the provisioning of the micro-strand heat dissipator elements 300 of the present disclosure on a processing device is illustrated. FIG. 8A illustrates a micro-strand heat dissipator element carrier 800 that is coupled to a plurality of the micro-strand heat dissipator elements 300 (e.g., to the top ends 302a of the base 302 on the micro-strand heat dissipator elements 300) and that positions those micro-strand heat dissipator elements 300 in a configuration that corresponds to the configuration of the micro-strand heat dissipator connector features on the processing device to which those micro-strand heat dissipator elements 300 will be connected, a micro-strand heat dissipator element carriers 802 that is coupled to a plurality of the micro-strand heat dissipator elements 300 (e.g., to the top ends 302a of the base 302 on the micro-strand heat dissipator elements 300) and that positions those micro-strand heat dissipator elements 300 in a configuration that corresponds to the configuration of the micro-strand heat dissipator connector features on the processing device to which those micro-strand heat dissipator elements 300 will be connected, and a micro-strand heat dissipator element carriers 804 that is coupled to a plurality of the micro-strand heat dissipator elements 300 (e.g., to the top ends 302*a* of the base 302 on the micro-strand heat dissipator elements 300) and that positions those micro-strand heat dissipator elements 300 in a configuration that corresponds to the configuration of the micro-strand heat dissipator connector features on the processing device to which those micro-strand heat dissipator elements 300 will be connected.

FIG. 8A illustrates how the micro-strand heat dissipator element carrier 800 coupled to the plurality of the micro-strand heat dissipator elements 300 is positioned adjacent the top surface 202*a* of the processing device 700 such that the micro-strand heat dissipator elements 300 are aligned with corresponding micro-strand heat dissipator connector holes 204 defined by the base 202 of the processing device 700. While not explicitly illustrated, one of skill in the art in possession of the present disclosure will appreciate that the micro-strand heat dissipator element carrier 800 may be coupled to the plurality of the micro-strand heat dissipator elements 300 in a variety of manners that allows the plurality of the micro-strand heat dissipator elements 300 to be released from the micro-strand heat dissipator element carrier 800 as discussed below.

FIG. 8A also illustrates how the micro-strand heat dissipator element carrier 802 coupled to the plurality of the micro-strand heat dissipator elements 300 is positioned adjacent the side surface 202*e* of the processing device 700 such that the micro-strand heat dissipator elements 300 are aligned with corresponding micro-strand heat dissipator connector holes 702 defined by the base 202 of the processing device 700. While not explicitly illustrated, one of skill in the art in possession of the present disclosure will appreciate that the micro-strand heat dissipator element carrier 802 may be coupled to the plurality of the micro-strand heat dissipator elements 300 in a variety of manners that allows the plurality of the micro-strand heat dissipator elements 300 to be released from the micro-strand heat dissipator element carrier 802 as discussed below.

FIG. 8A also illustrates how the micro-strand heat dissipator element carrier 804 coupled to the plurality of the micro-strand heat dissipator elements 300 is positioned adjacent the side surface 202*f* of the processing device 700 such that the micro-strand heat dissipator elements 300 are aligned with corresponding micro-strand heat dissipator connector holes 702 defined by the base 202 of the processing device 700. While not explicitly illustrated, one of skill in the art in possession of the present disclosure will appreciate that the micro-strand heat dissipator element carrier 804 may be coupled to the plurality of the micro-strand heat dissipator elements 300 in a variety of manners that allows the plurality of the micro-strand heat dissipator elements 300 to be released from the micro-strand heat dissipator element carrier 804 as discussed below. While not explicitly illustrated, one of skill in the art in possession of the present disclosure will appreciate how similar micro-strand heat dissipator element carriers coupled to micro-strand heat dissipator elements may be positioned adjacent the front surface 202*c* and the rear surface 202*d* of the base 202 on the processing device 200 as well.

As illustrated in FIGS. 8A and 8B, the micro-strand heat dissipator element carrier 800 coupled to the plurality of the micro-strand heat dissipator elements 300 may be moved in a direction C such that each of the micro-strand heat dissipator elements 300 extend into corresponding micro-strand heat dissipator connector holes 204, the plurality of the micro-strand heat dissipator elements 300 may then be released from the micro-strand heat dissipator element carrier 800, and the micro-strand heat dissipator element carrier 800 may be moved opposite the direction C. Similarly, the micro-strand heat dissipator element carrier 802 coupled to the plurality of the micro-strand heat dissipator elements 300 may be moved in a direction D such that each of the micro-strand heat dissipator elements 300 extend into corresponding micro-strand heat dissipator connector holes 702, the plurality of the micro-strand heat dissipator elements 300 may then be released from the micro-strand heat dissipator element carrier 802, and the micro-strand heat dissipator element carrier 802 may be moved opposite the direction D. Similarly as well, the micro-strand heat dissipator element carrier 804 coupled to the plurality of the micro-strand heat dissipator elements 300 may be moved in a direction E such that each of the micro-strand heat dissipator elements 300 extend into corresponding micro-strand heat dissipator connector holes 702, the plurality of the micro-strand heat dissipator elements 300 may then be released from the micro-strand heat dissipator element carrier 804, and the micro-strand heat dissipator element carrier 804 may be moved opposite the direction E.

Similarly as discussed above, the micro-strand heat dissipator elements 300 located in corresponding micro-strand heat dissipator connector holes 204/702 defined by the base 202 of the processing device 700 may be connected to the base 202 and/or secured in those micro-strand heat dissipator connector holes 204/702 using a variety of techniques. For example, prior to positioning the micro-strand heat dissipator elements 300 in corresponding micro-strand heat dissipator connector holes 204/702, a heat conductive adhesive may be provided on the bottom end 302*b* of the micro-strand heat dissipator elements 300 and/or those micro-strand heat dissipator connector holes 204/702 defined by the base 202, and may be allowed to dry to connect/secure the micro-strand heat dissipator elements 300 to corresponding micro-strand heat dissipator connector holes 204/702 defined by the base 202 of the processing device 700. However, in other embodiments, mechanical couplings and/or other coupling subsystems known in the art may be utilized to connect/secure the micro-strand heat dissipator elements 300 to corresponding micro-strand heat dissipator connector holes 204/702 defined by base 202 of the processing device 700 while remaining within the scope of the present disclosure as well.

As such, each of the micro-strand heat dissipator connector holes 204/702 defined by base 202 of the processing device 200 may have a respective micro-strand heat dissipator element 300 coupled thereto, with the second micro-strand heat dissipator element portion 306 on each of those micro-strand heat dissipator elements 300 extending into the base 202 from the top surface 202*a*, front surface 202*c*, rear surface 202*d*, and side surfaces 202*e* and 202*f*, and the first micro-strand heat dissipator element portion 304 on each of those micro-strand heat dissipator elements 300 extending from the top surface 202*a*, front surface 202*c*, rear surface 202*d*, and side surfaces 202*e* and 202*f* of the base 202, as illustrated in FIGS. 8B and 8C. However, while discussed above with reference to FIGS. 8A-8C as being provided by the connection/securing of the micro-strand heat dissipator elements 300 to the micro-strand heat dissipator connector holes 204/702 defined by the base 202 of the processing device 700, in some embodiments the micro-strand heat dissipator connector holes 204/702 may be omitted, and the micro-strand heat dissipator elements 300 may be integrated with the processing device 700 in the same configuration illustrated in FIGS. 8B and 8C during the manufacturing, fabrication, or other provisioning of the processing device 700. As such, one of skill in the art in possession of the present disclosure will appreciate that the micro-strand heat dissipator element configuration illustrated in FIGS. 8B and 8C may be provided in a variety of manners that will fall within the scope of the present disclosure as well.

Figure 9A:
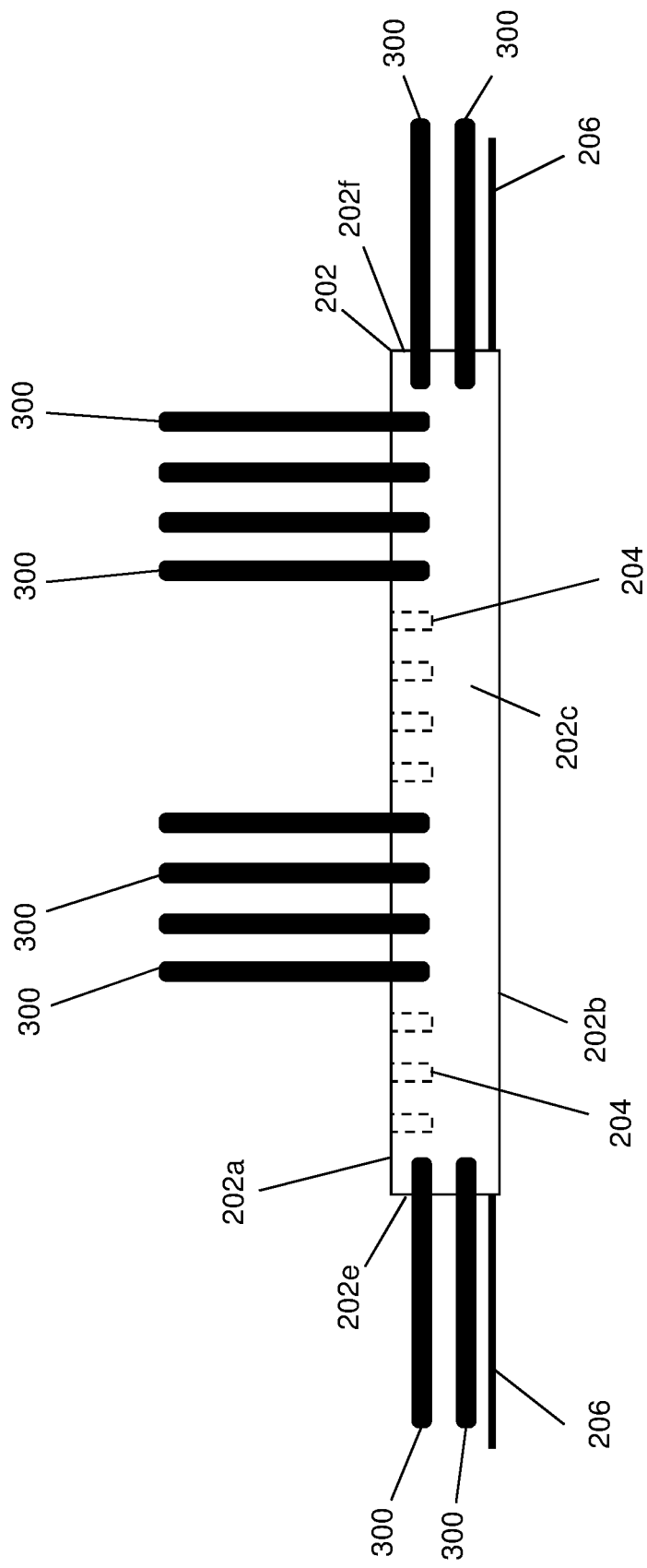
FIG. 9A is a schematic side view illustrating an embodiment of a plurality of the micro-strand heat dissipation elements of FIG. 3 connected to the processing device of FIG. 7.
Figure 9B:
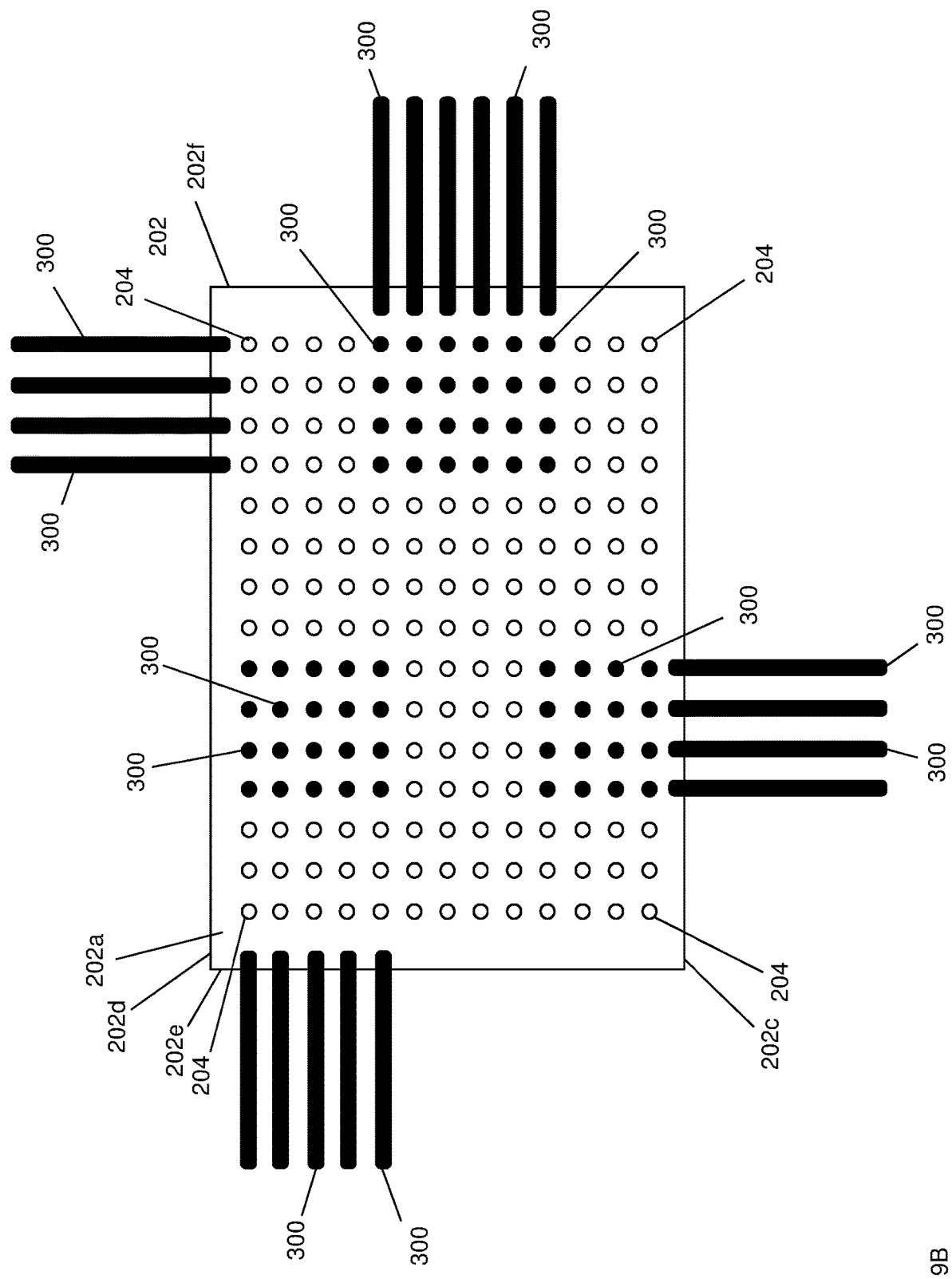
FIG. 9B is a schematic top view illustrating an embodiment of a plurality of the micro-strand heat dissipation elements of FIG. 3 connected to the processing device of FIG. 7.
Figure 10:
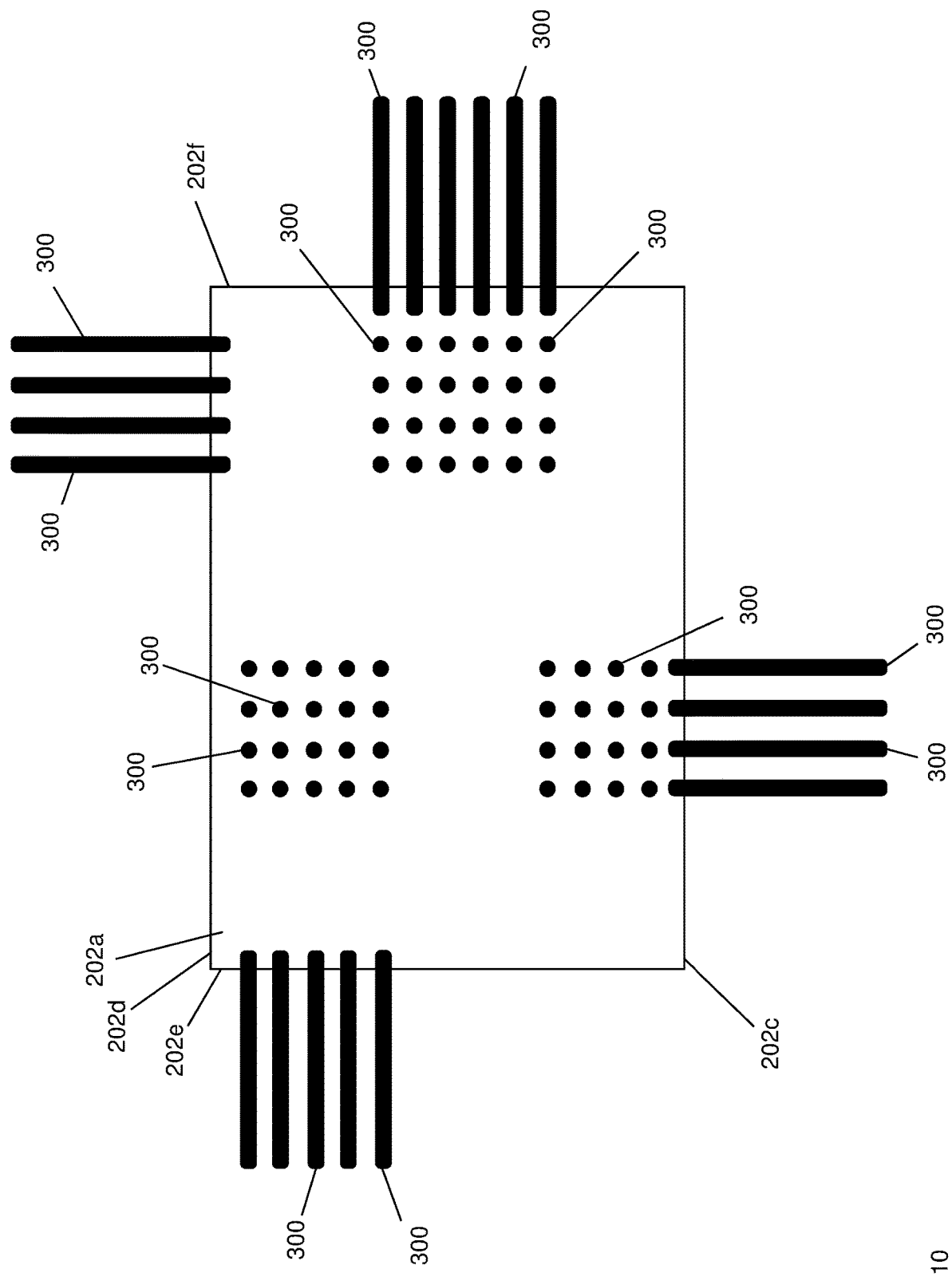
FIG. 10 is a schematic top view illustrating an embodiment of a plurality of the micro-strand heat dissipation elements of FIG. 3 integrated in a processing device.

Referring now to FIGS. 9A and 9B, an embodiment of the processing system 700 is illustrated with micro-strand heat dissipator elements 300 connected/secured to subsets of its micro-strand heat dissipator connector holes 204/702 in a manner similar to that described above with reference to FIGS. 5A-5C. As such, micro-strand heat dissipator elements 300 may be connected/secured to subsets of the micro-strand heat dissipator connector holes 204/702 on the processing device 700 using micro-strand heat dissipator element carriers that are similar to the micro-strand heat dissipator carrier 500 of FIG. 5A, and that are populated with micro-strand heat dissipator elements 300 based on the expected (or known) heat generation of the processing device 700. Similarly, FIG. 10 illustrates how the micro-strand heat dissipator connector holes 204/702 may be omitted from the processing device 700, and the micro-strand heat dissipator elements 300 may be integrated with processing device 700 during its manufacture in the same configuration as illustrated in FIGS. 9A and 9B.

Figure 11A:
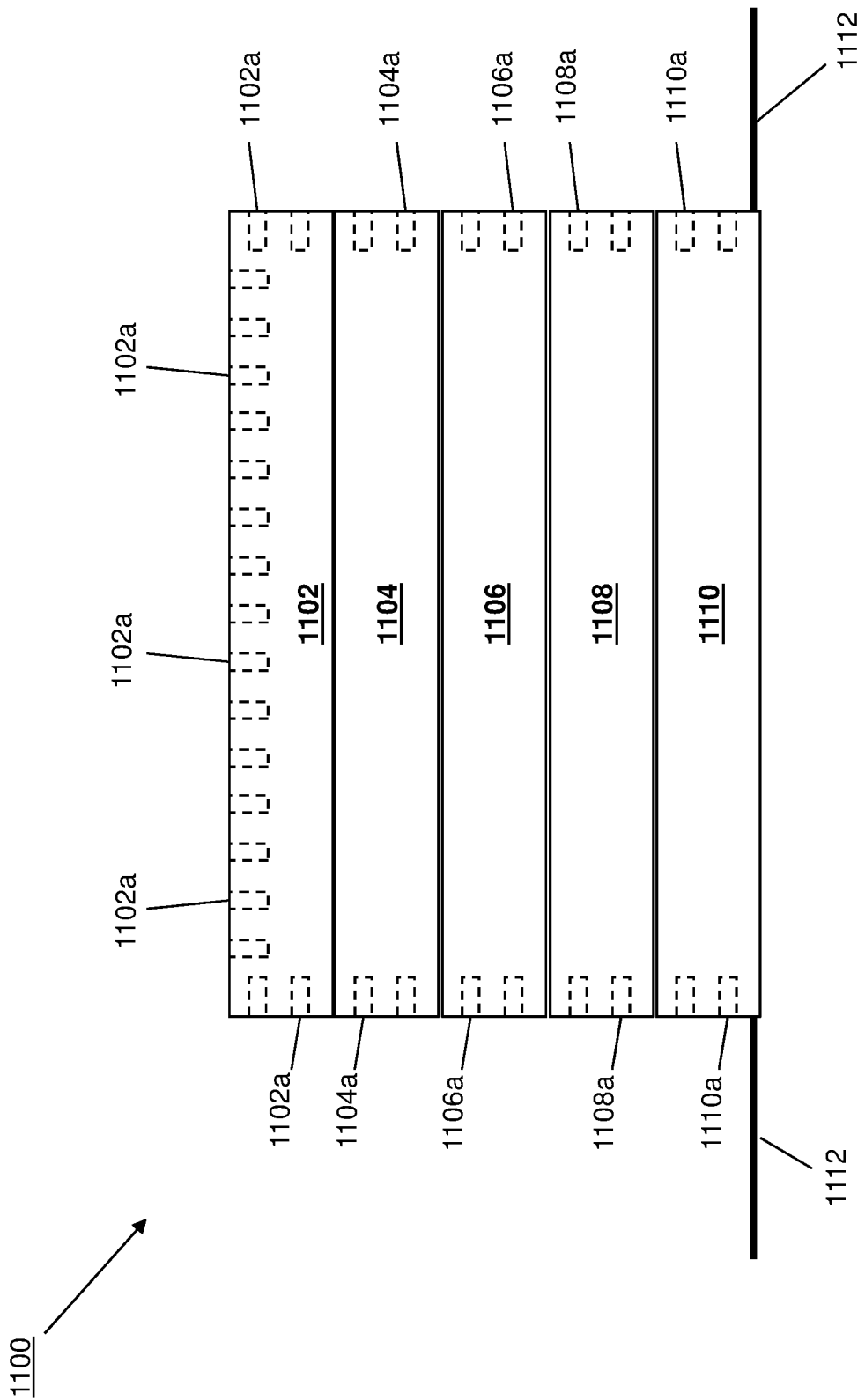
FIG. 11A is a schematic side view illustrating an embodiment of a stacked processing system that may utilized the micro-strand heat dissipation system of the present disclosure.

Referring now to FIG. 11A, an embodiment of a stacked processing system 1100 is illustrated that includes a plurality of processing devices 1102, 1104, 1106, 1108, and 1110 in a stacked processing system configuration. As will be appreciated by one of skill in the art in possession of the present disclosure, the processing device 1102 may be substantially similar to the processing system 700 based on its inclusion of micro-strand heat dissipator connector holes 1102a extending into its top surface and side surfaces, while the processing devices 1104, 1106, 1108, and 1110 may be substantially similar to the processing system 700 based on their inclusion of respective micro-strand heat dissipator connector holes 1104a, 1106a, 1108a, and 1110a extending into their side surfaces. Furthermore, one of more processing device coupling elements 1112 may extend from the processing devices 1102, 1104, 1106, 1108, and 1110, and one of skill in the art in possession of the present disclosure will recognize how the processing device coupling elements 1112 may be provided by any processing device/integrated circuit couplings that allow the processing devices 1102, 1104, 1106, 1108, and 1110 to be coupled to other components (e.g., via a circuit board or other coupling medium known in the art.) However, while a specific stacked processing system 1100 has been illustrated and described, one of skill in the art in possession of the present disclosure will recognize that the micro-strand heat dissipation system of the present disclosure may include a variety of components and component configurations while remaining within the scope of the present disclosure as well.

Figure 11B:
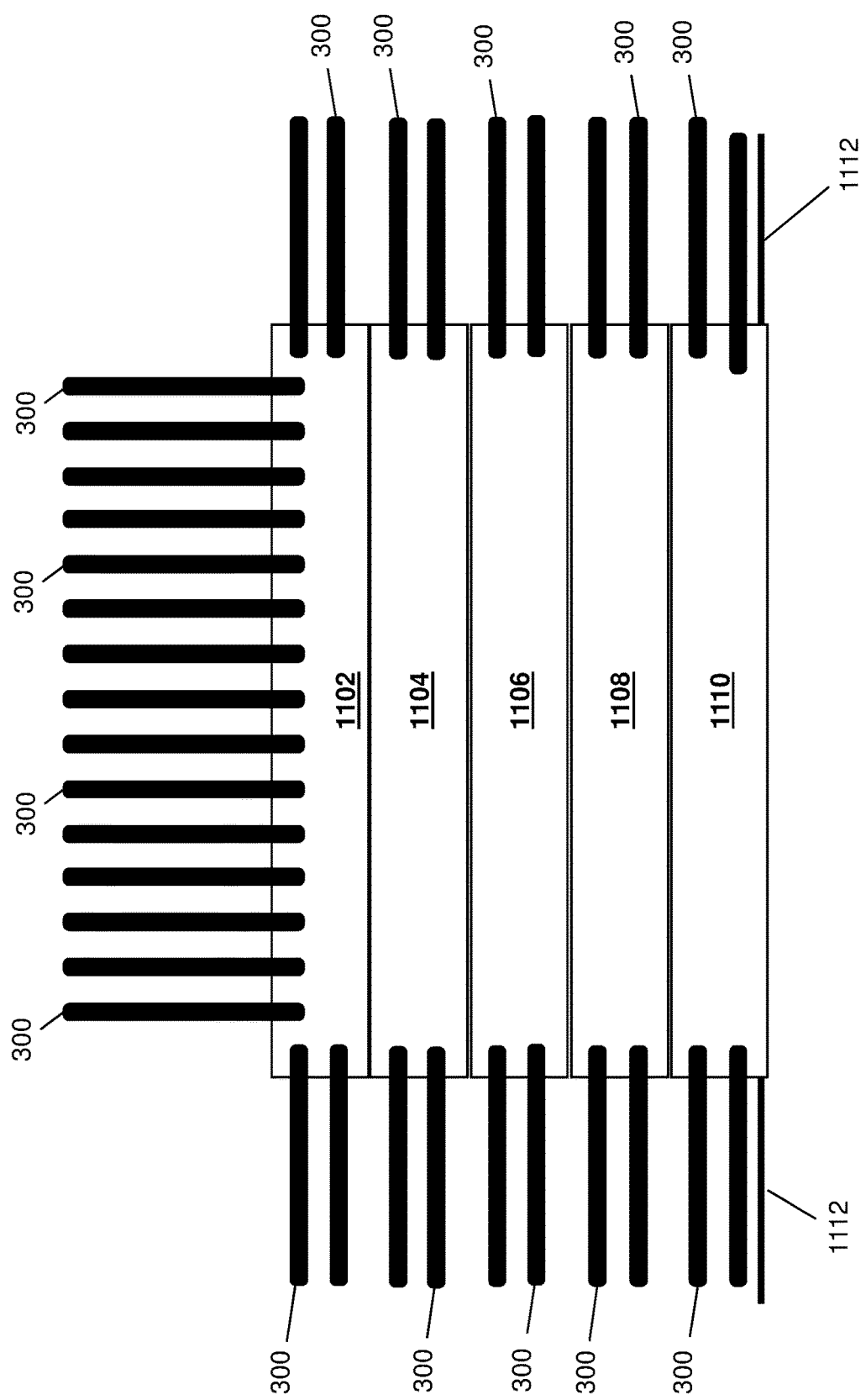
FIG. 11B is a schematic side view illustrating an embodiment of a plurality of the micro-strand heat dissipation elements of FIG. 3 connected to the stacked processing system of FIG. 11A.

With reference to FIG. 11B, an embodiment of the stack processing system 1100 is illustrated that includes micro-strand heat dissipator elements 300 connected/secured in each of the micro-strand heat dissipator connector holes 1102a, 1104a, 1106a, 1108a, and 1110a included on the stacked processing system 1100, and one of skill in the art in possession of the present disclosure will appreciate that the micro-strand heat dissipator elements 300 may be connected to each of the micro-strand heat dissipator connector holes 1102a, 1104a, 1106a, 1108a, and 1110a in substantially the same manner as described above with reference to FIGS. 4A-4E and/or 8A-8C.

Figure 12:
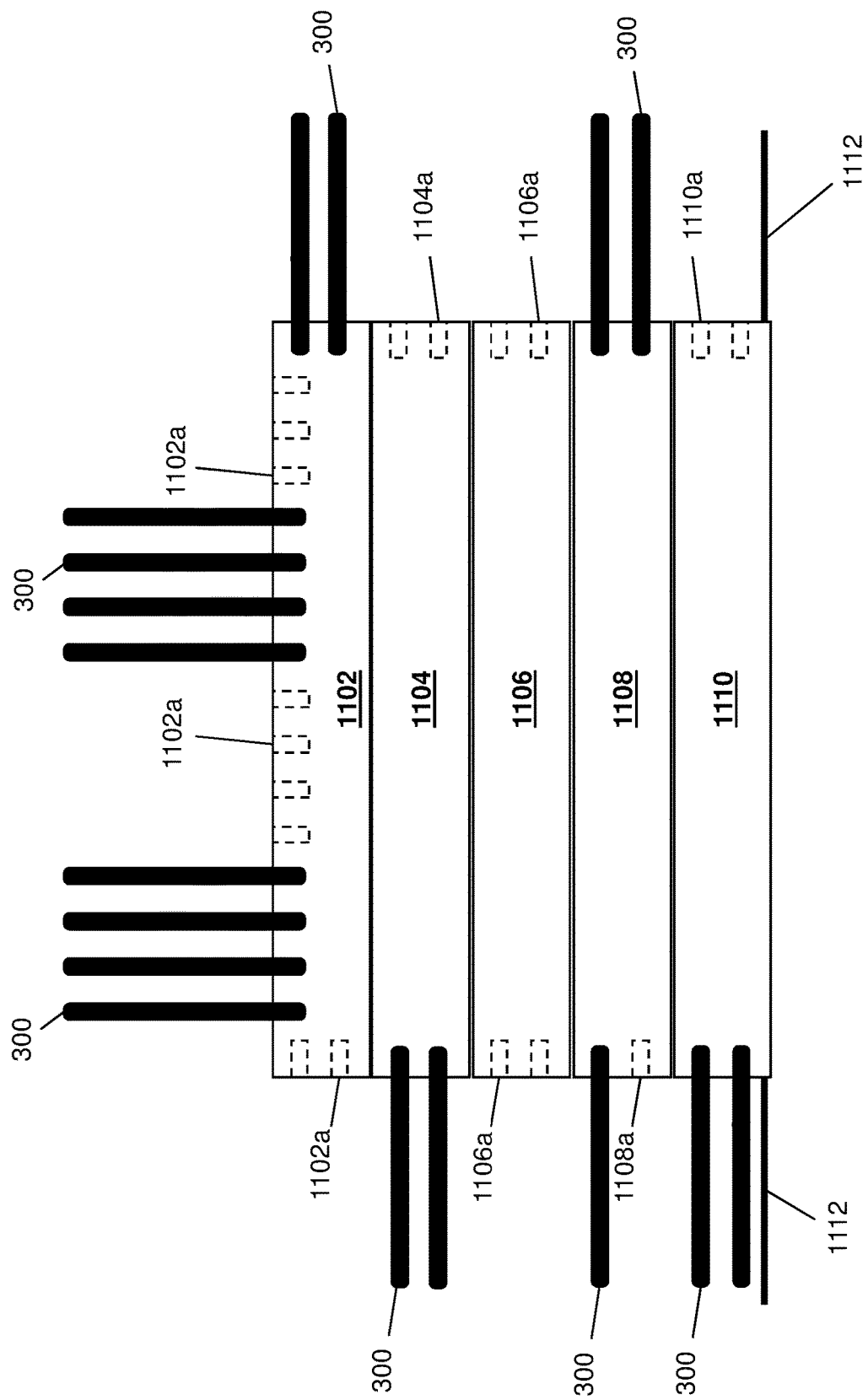
FIG. 12 is a schematic side view illustrating an embodiment of a plurality of the micro-strand heat dissipation elements of FIG. 3 connected to the stacked processing system of FIG. 11A.
Figure 13:
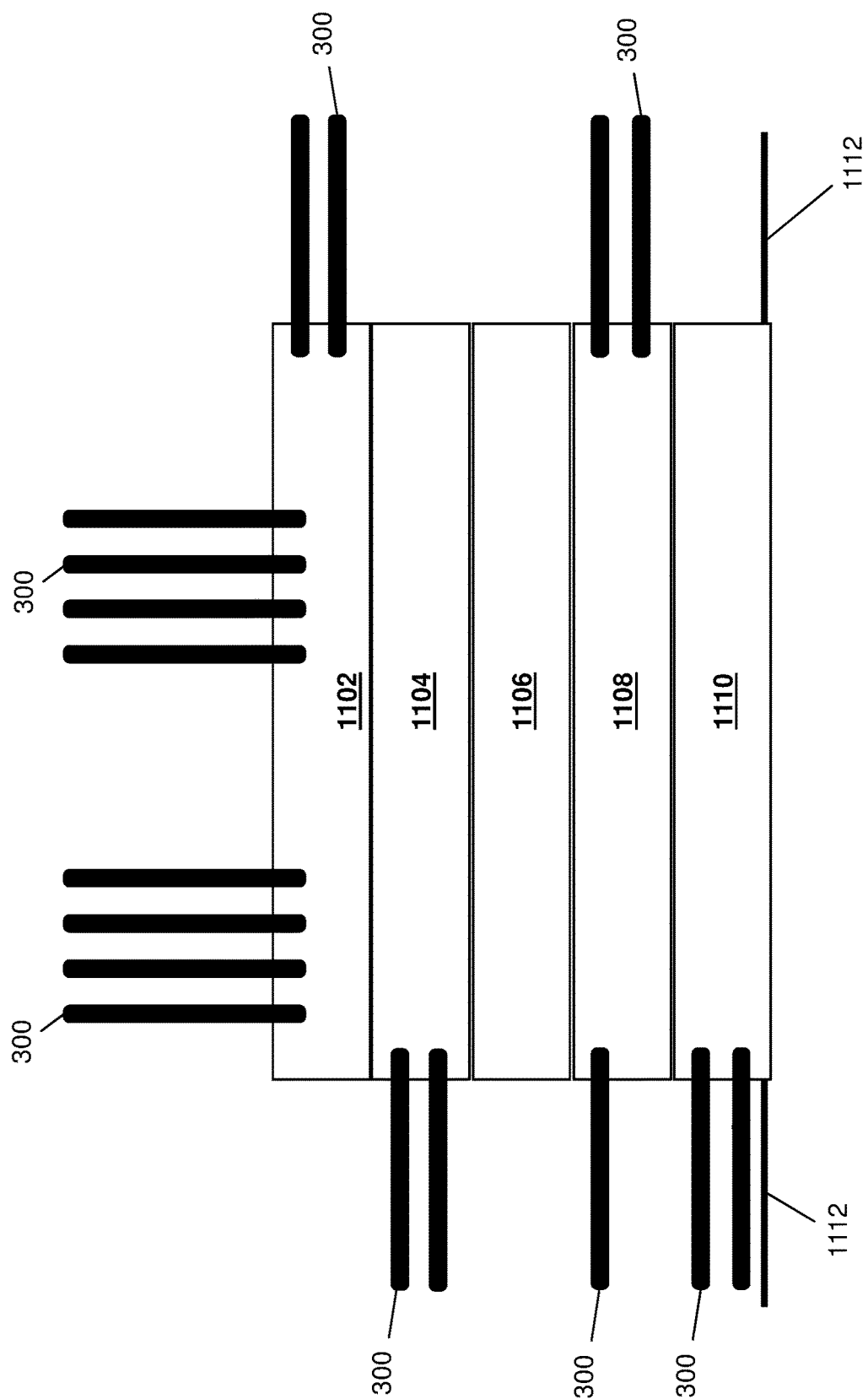
FIG. 13 is a schematic side view illustrating an embodiment of a plurality of the micro-strand heat dissipation elements of FIG. 3 integrated in a stacked processing system.

With reference to FIG. 12, an embodiment of the stack processing system 1100 is illustrated that includes micro-strand heat dissipator elements 300 connected/secured in subsets of the micro-strand heat dissipator connector holes 1102a, 1104a, 1106a, 1108a, and 1110a included on the stacked processing system 1100, and one of skill in the art in possession of the present disclosure will appreciate that the micro-strand heat dissipator elements 300 may be connected to each of the micro-strand heat dissipator connector holes 1102a, 1104a, 1106a, 1108a, and 1110a in substantially the same manner as described above with reference to FIGS. 5A-5C and/or 9A and 9B. Similarly, FIG. 13 illustrates how the micro-strand heat dissipator connector holes 1102a, 1104a, 1106a, 1108a, and 1110a may be omitted from the stacked processing system 1100, and the micro-strand heat dissipator elements 300 may be integrated with stacked processing system 1100 during its manufacture, fabrication, or other provisioning in the same configuration as illustrated in FIG. 12.

Figure 14:
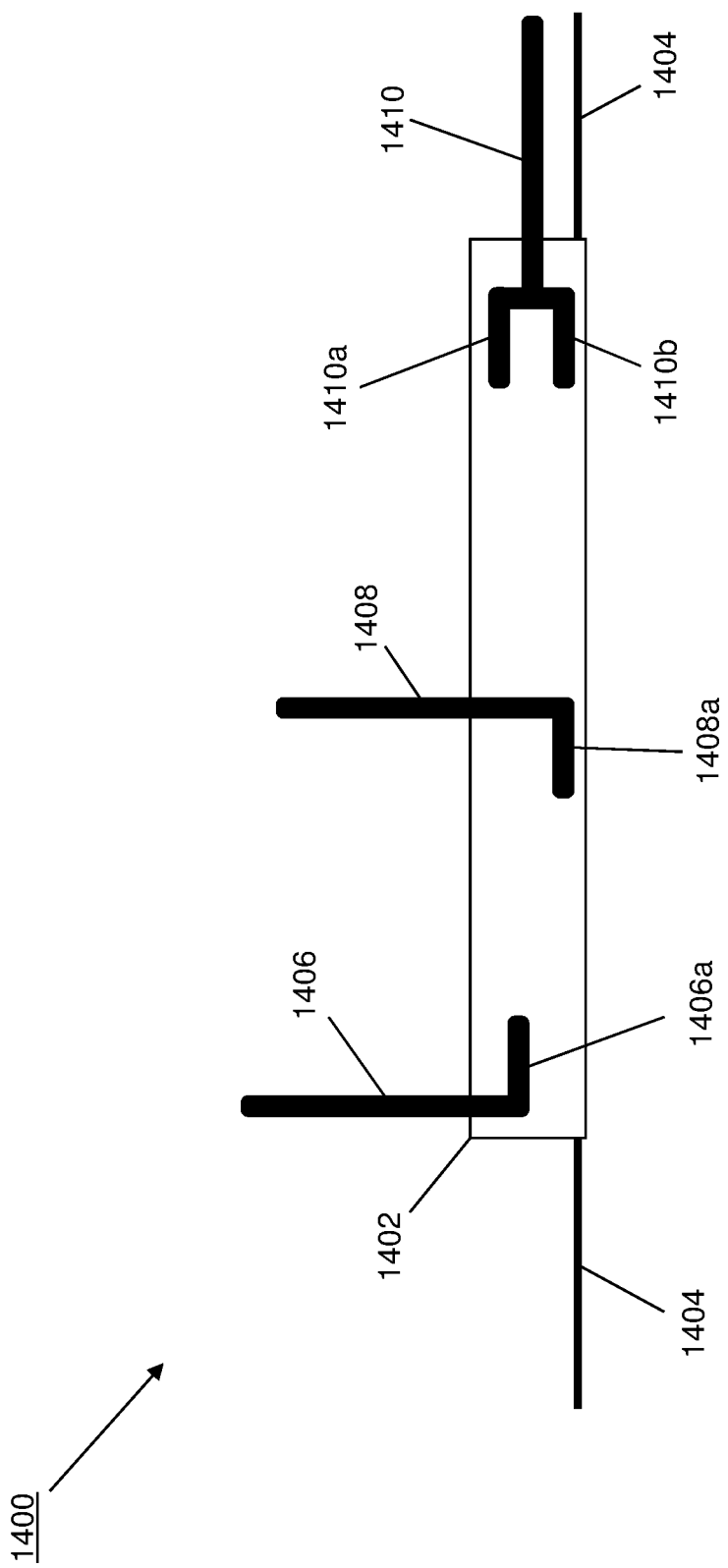
FIG. 14 is a schematic side view illustrating an embodiment of a plurality of the micro-strand heat dissipation elements of FIG. 3 integrated in a processing device.

Referring now to FIG. 14, an embodiment of a processing device 1400 is illustrated that may include integrated micro-strand heat dissipator elements that provide the micro-strand heat dissipation system of the present disclosure. As illustrated, the processing device 1400 includes a base 1402 with a plurality of processing device coupling elements 1404 extending from the outer surface of the base 1400. Furthermore, a micro-strand heat dissipator element 1406 is illustrated that includes a first micro-strand heat dissipator element portion that extends from the outer surface of the base 1402, and that includes a second micro-strand heat dissipator element portion 1406a that extends into the base 1402 from its outer surface and that is oriented substantially perpendicularly to the first micro-strand heat dissipator element portion of the micro-strand heat dissipator element 1406 that extends from the outer surface of the base 1402. Similarly, a micro-strand heat dissipator element 1408 is illustrated and includes a first micro-strand heat dissipator element portion that extends from the outer surface of the base 1402, and that includes a micro-strand heat dissipator element portion 1408a that extends into the base 1402 from its outer surface and that is oriented substantially perpendicularly to the first micro-strand heat dissipator element portion of the micro-strand heat dissipator element 1408 that extends from the outer surface of the base 1402.

Similarly as well, a micro-strand heat dissipator element 1410 is illustrated that includes a first micro-strand heat dissipator element portion that extends from the outer surface of the base 1402, and that includes a pair of micro-strand heat dissipator element portions 1410a and 1410b that extend into the base 1402 from its outer surface and that are oriented substantially parallel to the first micro-strand heat dissipator element portion of the micro-strand heat dissipator element 1408 that extends from the outer surface of the base 1402 but in different planes than the first micro-strand heat dissipator element portion of the micro-strand heat dissipator element 1408 that extends from the outer surface of the base 1402. As will be appreciated by one of skill in the art in possession of the present disclosure, the micro-strand heat dissipator element portion 1406a, 1408a, 1410a, and 1410b may be routed to locations in the base 1402 where heat generation is expected or known to occur, which allows the first micro-strand heat dissipator element portions of their respective micro-strand heat dissipator elements 1406,

1408, and 1410 that extend from the outer surface of the base 1402 to dissipate that heat more efficiently.

Figure 15:
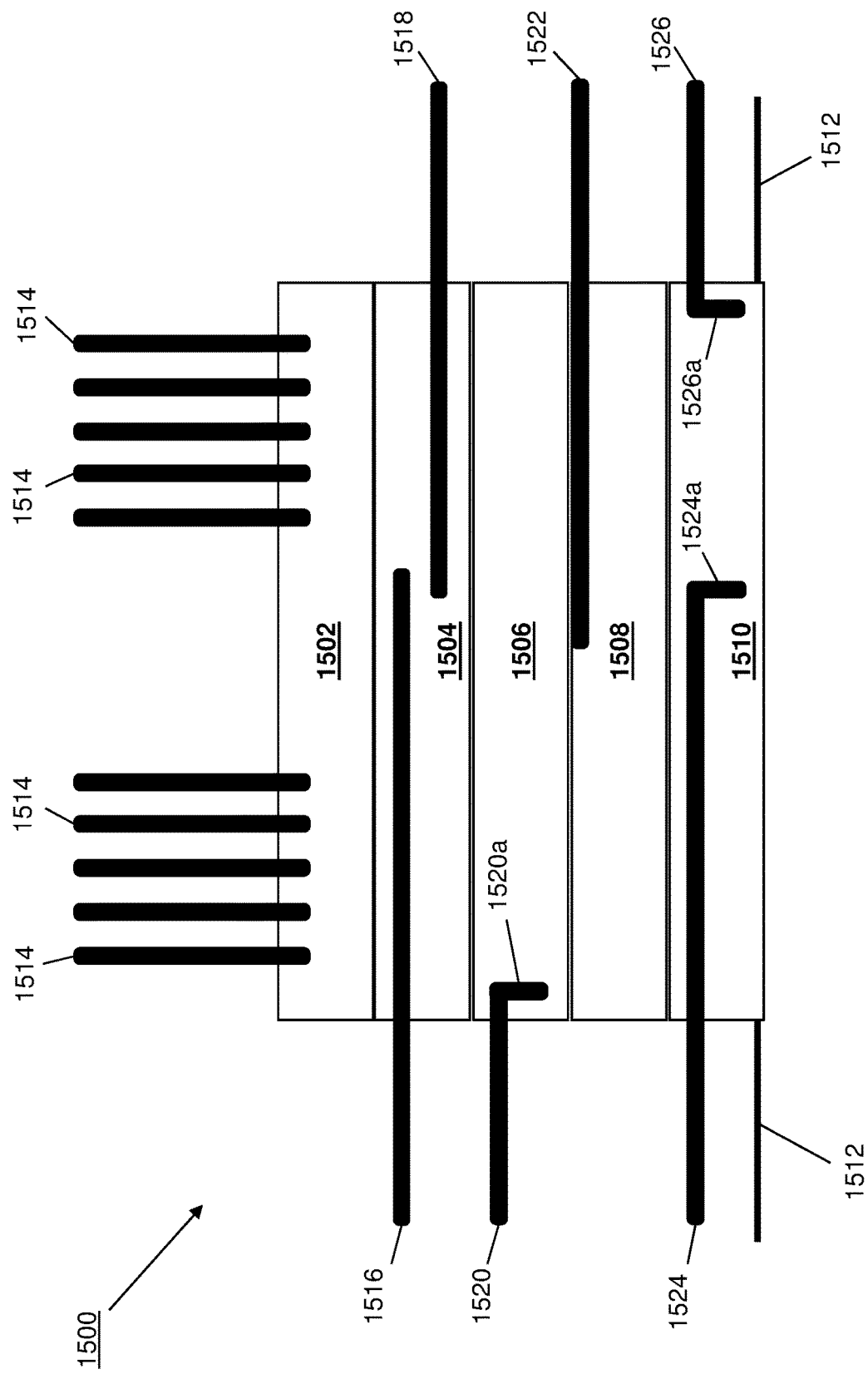
FIG. 15 is a schematic side view illustrating an embodiment of a plurality of the micro-strand heat dissipation elements of FIG. 3 integrated in a stacked processing system.

Referring now to FIG. 15, an embodiment of a stacked processing system 1500 is illustrated that may include integrated micro-strand heat dissipator elements that provide the micro-strand heat dissipation system of the present disclosure. As illustrated, the stacked processing system 1500 includes processing devices 1502, 1504, 1506, 1508, and 1510 in a stacked processing system orientation and with a plurality of processing device coupling elements 1512 extending from the outer surface of the base processing device 1510. Furthermore, a plurality of micro-strand heat dissipator elements 1514 are illustrated that extend from the outer surface of the processing device 1502, with each micro-strand heat dissipator elements 1514 extending into the processing device 1502 and out of the processing device 1502 substantially the same distance. Similarly, a pair of micro-strand heat dissipator elements 1516 and 1518 are illustrated that extend from opposing outer surfaces of the processing device 1504, and that extend different distances into the processing device 1504.

Similarly as well, a micro-strand heat dissipator element 1520 is illustrated that includes a first micro-strand heat dissipator element portion that extends from the outer surface of the processing device 1506, and that includes a second micro-strand heat dissipator element portion 1520*a* that extends into the processing device 1506 from its outer surface and that is oriented substantially perpendicular to the first micro-strand heat dissipator element portion of the micro-strand heat dissipator element 1520 that extends from the outer surface of the processing device 1506. Similarly as well, a micro-strand heat dissipator element 1522 is illustrated that extends from the outer surface of the processing device 1508, and that extends into the processing device 1506 from its outer surface. Similarly as well, micro-strand heat dissipator elements 1524 and 1526 are illustrated that include first micro-strand heat dissipator element portions that extend from the outer surface of the processing device 1510, and that include respective micro-strand heat dissipator element portions 1524*a* and 1516*a* that extend into the processing device 1510 from its outer surface and that are oriented substantially perpendicular to the first micro-strand heat dissipator element portions of the respective micro-strand heat dissipator elements 1524 and 1526 that extend from the outer surface of the processing device 1510. As will be appreciated by one of skill in the art in possession of the present disclosure, the portions of the micro-strand heat dissipator elements 1514, 1515, 1518, 1520, 1522, 1524, and 1526 that extend into the processing devices in the stacked processing system 1500 may be routed to locations in the stacked processing system 1500 where heat generation is expected or known to occur, which allows those micro-strand heat dissipator elements 1514, 1515, 1518, 1520, 1522, 1524, and 1526 to dissipate that heat more efficiently.

Figure 16:
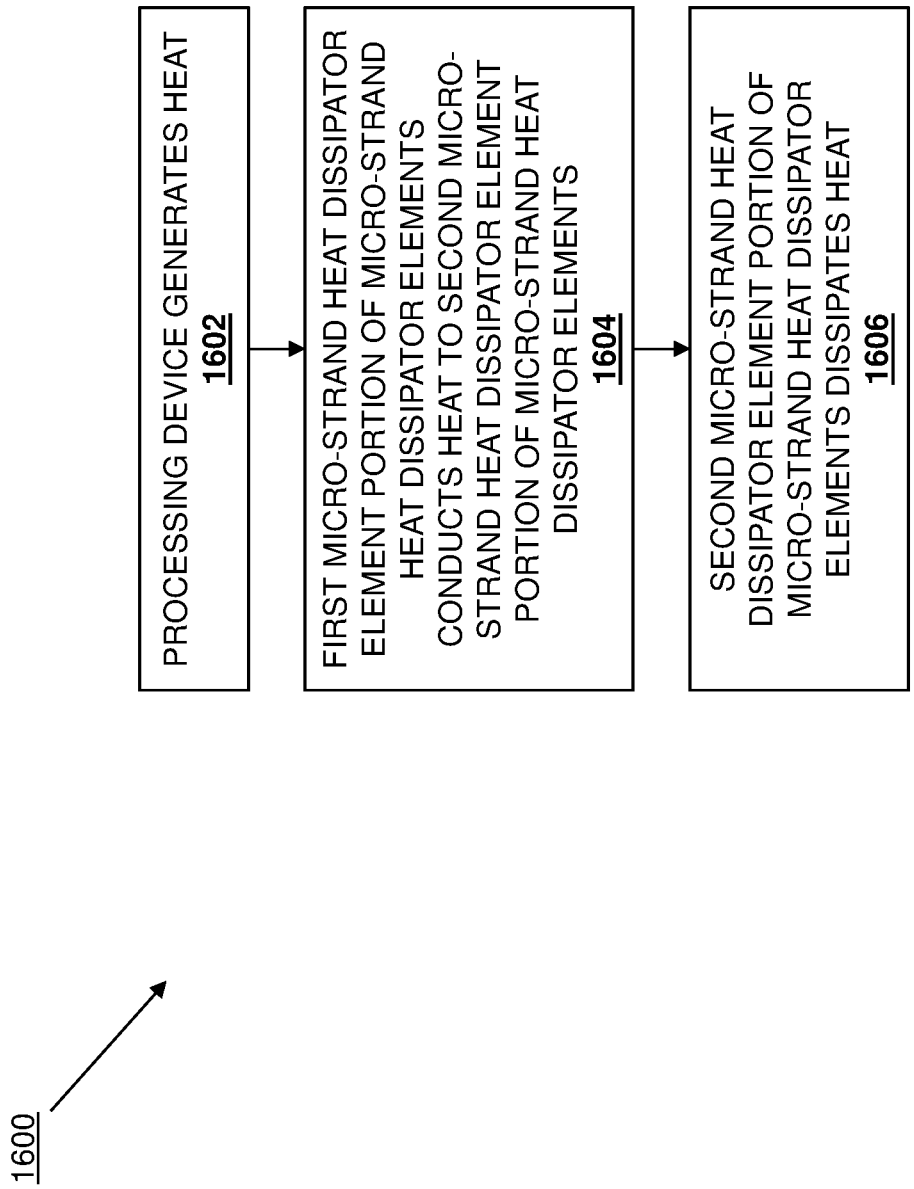
FIG. 16 is a flow chart illustrating an embodiment of a method for dissipating heat.

Referring now to FIG. 16, an embodiment of a method 1600 for dissipating heat is illustrated. As discussed below, the systems and methods of the present disclosure provide for the dissipation of heat from a processing device via the use of micro-strand heat dissipator elements. For example, a plurality of micro-strand heat dissipator elements may each be positioned on the processing device in a spaced apart orientation from the other micro-strand heat dissipator elements, with each micro-strand heat dissipator element including a first micro-strand heat dissipator element portion that extends into the processing device from an outer surface of the processing device, and a second micro-strand heat dissipator element portion that extends from the outer surface of the processing device. As such, heat generated by the processing device may be conducted by the first micro-strand heat dissipator element portion of at least some of the micro-strand heat dissipator elements to the second micro-strand heat dissipator element portions of those micro-strand heat dissipator elements, and then dissipated by the second micro-strand heat dissipator element portions of those micro-strand heat dissipator elements. It has been found that the use of micro-strand heat dissipator elements allows for targeted dissipation of heat generated from particular areas or volumes in the processing device, and may operate to meet the cooling requirements of relatively higher performance processing devices such as those provided by silicon photonics integrated circuits.

The method 1600 begins at block 1602 where a processing device generates heat. In an embodiment, at block 1602, any of the processing devices discussed above may operate to generate heat. For example, processing devices utilizing the micro-strand heat dissipation system of the present disclosure may be provided by silicon photonics integrated circuits, and the operation of components in those processing devices will product heat. In particular one of skill in the art in possession of the present disclosure will recognize how the operation of components in processing devices provided by silicon photonics integrated circuits may result in particular areas (e.g., as viewed from a top surface of the processing device) or volumes of the processing device that generate heat and reach relatively high temperatures (as opposed to other areas or volumes of the processing device that do not include such components and, as such, do not generate as much heat and, as such, reach relatively lower temperatures). However, while a specific processing device is discussed, one of skill in the art in possession of the present disclosure will appreciate how uniform or non-uniform heat generation by any of a variety of devices may utilize the micro-strand heat dissipation system of the present disclosure while remaining within its scope.

The method 1600 then proceeds to block 1604 where a first micro-strand heat dissipator element portion of micro-strand heat dissipator elements conducts heat to a second micro-strand heat dissipator element portion of the micro-strand heat dissipator elements. In an embodiment, at block 1604, the first micro-strand heat dissipator element portion of at least some of the micro-strand heat dissipator elements that extends into the processing device will operate to conduct the heat generated by the processing device at block 1602 to the corresponding second micro-strand heat dissipator element portion of those micro-strand heat dissipator elements that extend out of the surface of the processing device, and one of skill in the art in possession of the present disclosure will appreciate that micro-strand heat dissipator elements positioned closer to the source of heat generation within the processing device may conduct more heat relative to micro-strand heat dissipator elements positioned further from the source of heat generation within the processing device. As discussed in detail above, the second micro-strand heat dissipator element portion of the micro-strand heat dissipator elements may extend into the processing device to an area or volume that is expected or known to generated relatively high temperatures, and thus the configuration of the micro-strand heat dissipator elements on the processing device may be designed to maximize the heat transfer from the processing device at block 1604. At will be appreciated by one of skill in the art in possession of the present disclosure, the micro-strand heat dissipator elements in the processing system stacks described above with reference to FIGS. 11A, 11B, 12, 13, and 15 may operate similarly as discussed above to conduct heat generated by any of the processing devices included in those processing system stacks.

The method 1600 then proceeds to block 1606 where the second micro-strand heat dissipator element portion of the micro-strand heat dissipator elements dissipates the heat. In an embodiment, at block 1606, the heat conducted to the second micro-strand heat dissipator element portion of the micro-strand heat dissipator elements will then be dissipated by the second micro-strand heat dissipator element portion of those micro-strand heat dissipator elements. As will be appreciated by one of skill in the art in possession of the present disclosure, the heat conducted to the second micro-strand heat dissipator element portion of those micro-strand heat dissipator elements may be dissipated at block 1606 via radiative heat transfer, as well as convective heat transfer. As will be appreciated by one of skill in the art in possession of the present disclosure, the configuration of the micro-strand heat dissipator elements may allow air (or other fluids) to move past the second micro-strand heat dissipator element portion of those micro-strand heat dissipator elements in different directions (i.e., rather than blocking airflow in some directions, as occurs in many "finned" heat sink systems) in order to enhance the convective heat transfer from those micro-strand heat dissipator elements. As such, heat generated by the processing device (or devices) may be dissipated by the micro-strand heat dissipator elements extending from that processing device.

Thus, systems and methods have been described that provide for the dissipation of heat from a silicon photonics integrated circuit via the use of micro-strand heat dissipator elements. For example, a plurality of micro-strand heat dissipator elements may each be positioned on the silicon photonics integrated circuit in a spaced apart orientation from the other micro-strand heat dissipator elements, with each micro-strand heat dissipator element including a first micro-strand heat dissipator element portion that extends into the silicon photonics integrated circuit from an outer surface of the silicon photonics integrated circuit, and a second micro-strand heat dissipator element portion that extends from the outer surface of the silicon photonics integrated circuit. As such, heat generated by the silicon photonics integrated circuit may be conducted by the first micro-strand heat dissipator element portion of at least some of the micro-strand heat dissipator elements to the second micro-strand heat dissipator element portions of those micro-strand heat dissipator elements, and then dissipated by the second micro-strand heat dissipator element portions of those micro-strand heat dissipator elements. It has been found that the use of micro-strand heat dissipator elements allows for targeting dissipation of heat generated from particular areas or volumes in the silicon photonics integrated circuit, and may operate to meet the cooling requirements of silicon photonics integrated circuits.

The inventors of the present disclosure have discovered that the micro-strand heat dissipation system discussed above may provide particular benefits to transceiver devices. With reference to FIGS. 17A, 17B, 17C, and 17D, an embodiment of a conventional transceiver device 1700 is illustrated and described in order to discuss the benefits of incorporating the micro-strand heat dissipation system discussed above in transceiver devices to provide a micro-strand transceiver heat dissipation system. In the illustrated embodiment, the conventional transceiver device 1700 includes a transceiver handle 1702, a transceiver chassis 1704 that extends from the transceiver handle and houses some or all of the transceiver components of the conventional transceiver device 1700, and a transceiver connector 1706 that extends from the transceiver chassis 1704 and that is configured to connect to a corresponding transceiver connector that may be provided on the IHS 100 discussed above with reference to FIG. 1. In some of the specific examples provided below, the conventional transceiver device 1700 is provided by a Silicon Photonic transceiver device (e.g., a 40 GbE Silicon Photonic transceiver, a 100 GbE Silicon Photonic transceiver, a 200 GbE Silicon Photonic transceiver, a 400 GbE Silicon Photonic transceiver, an 800 GbE Silicon Photonic transceiver, and/or future Silicon Photonic transceivers that may operate at yet higher speeds), although one of skill in the art in possession of the present disclosure will appreciate that other transceiver devices may benefit from the teachings of the present disclosure and thus will fall within its scope as well.

Figure 17A:
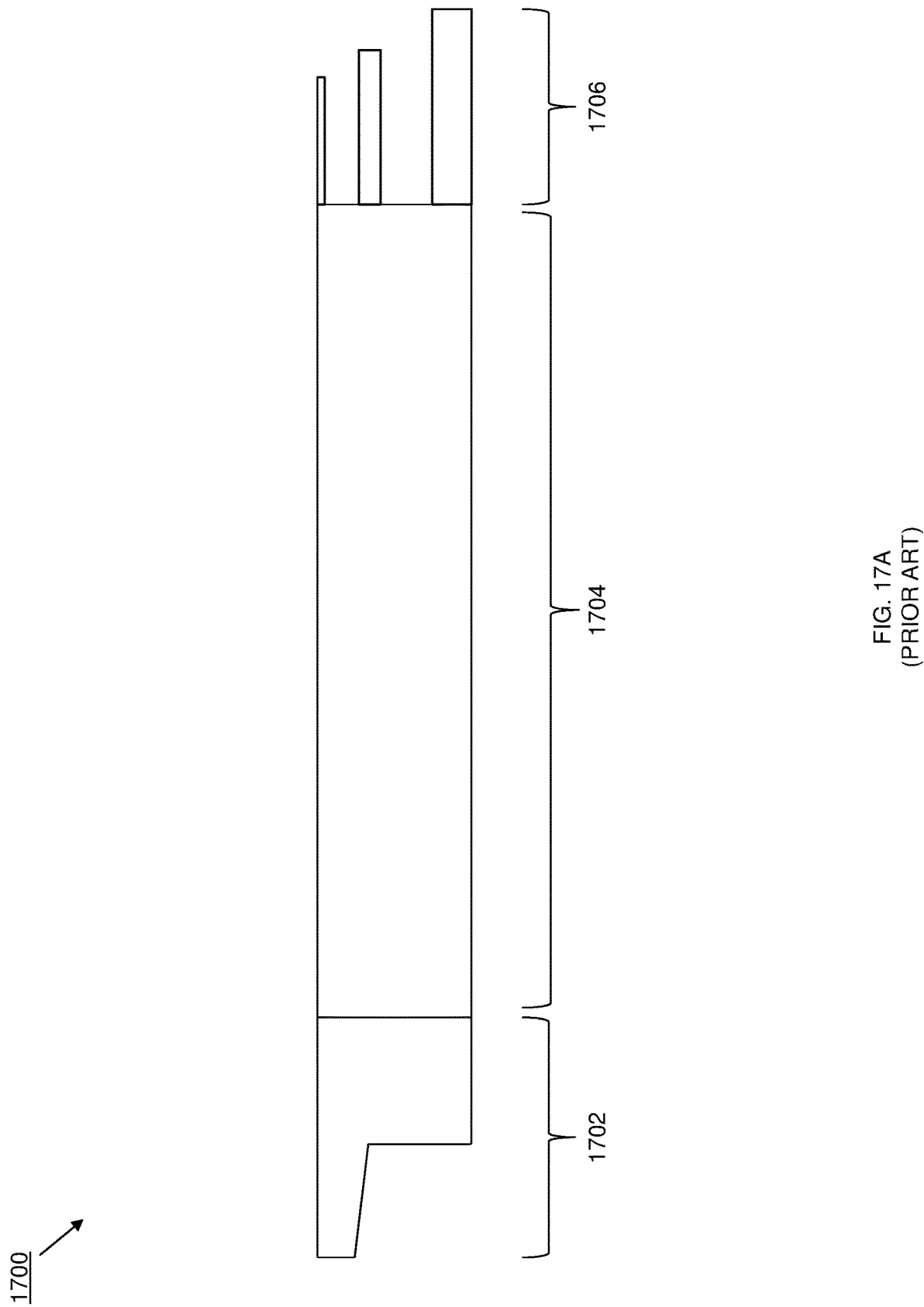
FIG. 17A is a schematic side view illustrating an embodiment of a conventional transceiver device.
Figure 17B:
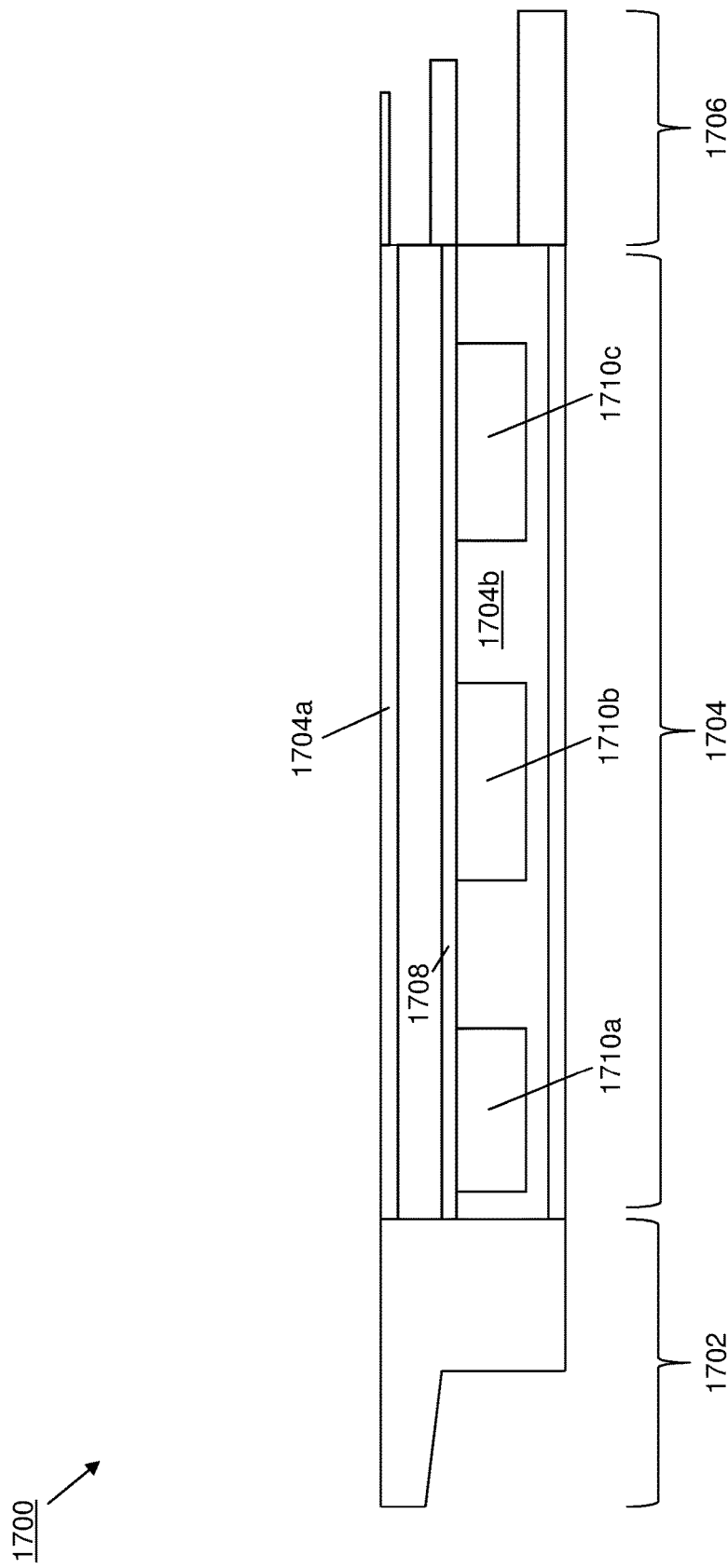
FIG. 17B is a schematic cross-sectional side view illustrating an embodiment of the conventional transceiver device of FIG. 17A.
Figure 17C:
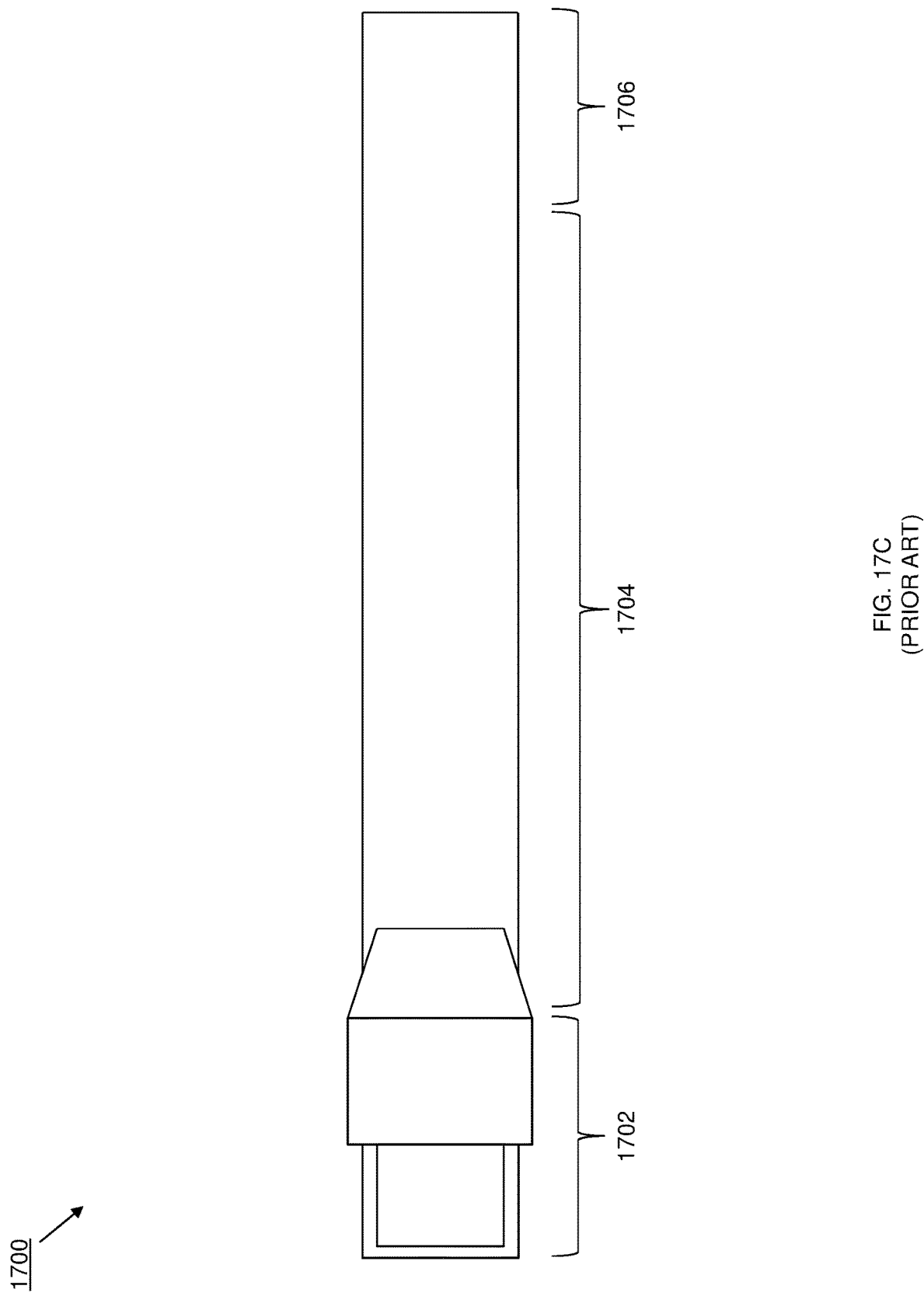
FIG. 17C is a schematic top view illustrating an embodiment of the conventional transceiver device of FIGS. 17A and 17B.
Figure 17D:
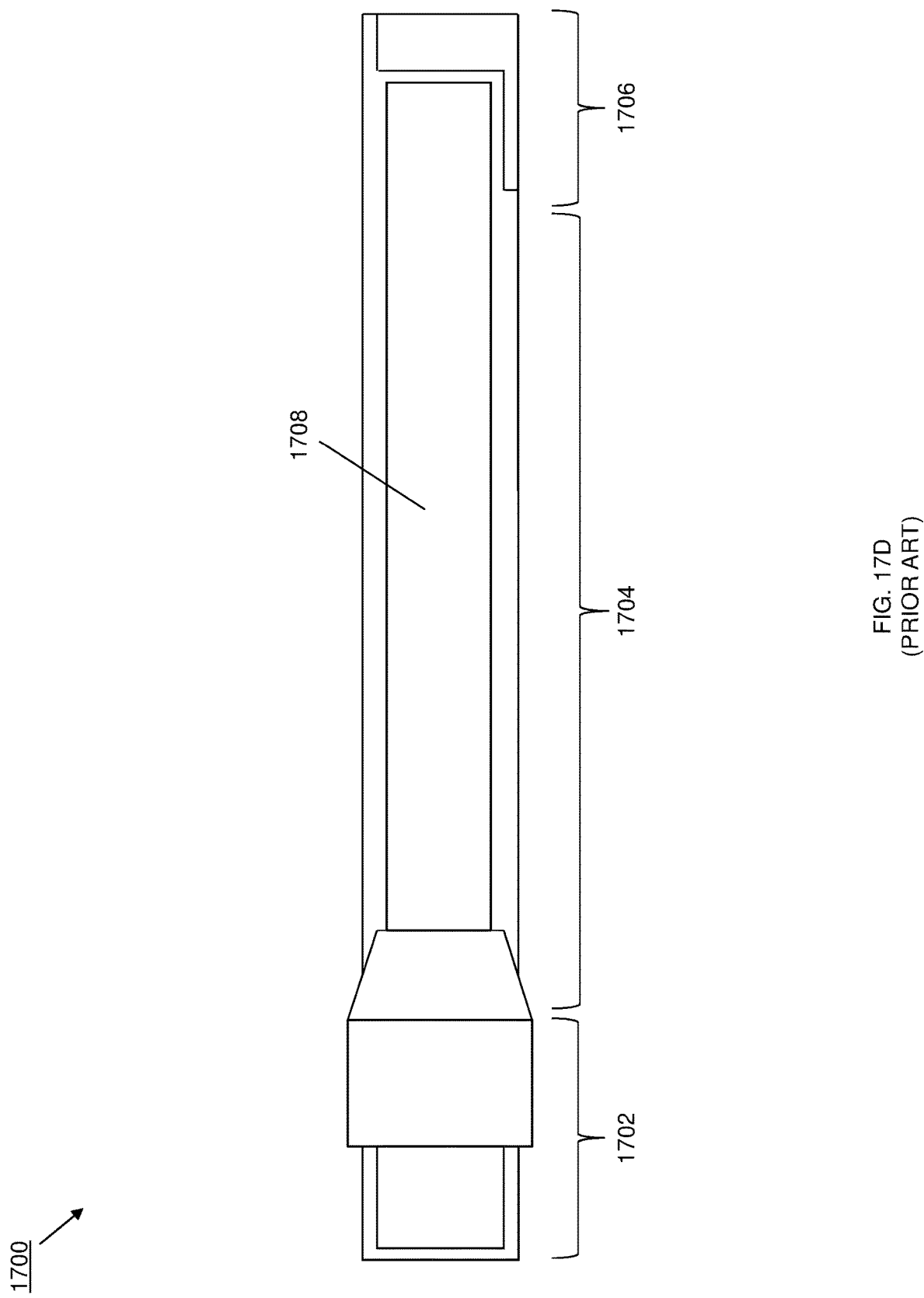
FIG. 17D is a schematic cross-sectional top view illustrating an embodiment of the conventional transceiver device of FIGS. 17A, 17B, and 17C.

As illustrated in FIG. 17B, the transceiver chassis 1704 includes a transceiver wall 1704a that defines a transceiver component housing 1704b. In the illustrated embodiment, the transceiver component housing 1704b houses transceiver components that, in the examples provided below, include a circuit board 1708 and a plurality of heat producing devices 1710a, 1710b, and up to 1710c that are mounted to the circuit board 1708. For example, the heat producing devices 1710a-1710c may be provided by laser devices, modulator devices, demodulator devices, and/or any other transceiver components and/or heat producing devices that would be apparent to one of skill in the art in possession of the present disclosure. However, while a specific conventional transceiver device 1700 is illustrated and described in with reference to FIGS. 17A-17D, and well as modified according to the teachings included herein to provide the micro-strand transceiver heat dissipation system of the present disclosure, one of skill in the art in possession of the present disclosure will recognize that the micro-strand transceiver heat dissipation system of the present disclosure may be provided using a variety of transceiver devices including a variety of components and/or components configurations while remaining within the scope of the present disclosure as well.

Figure 18A:
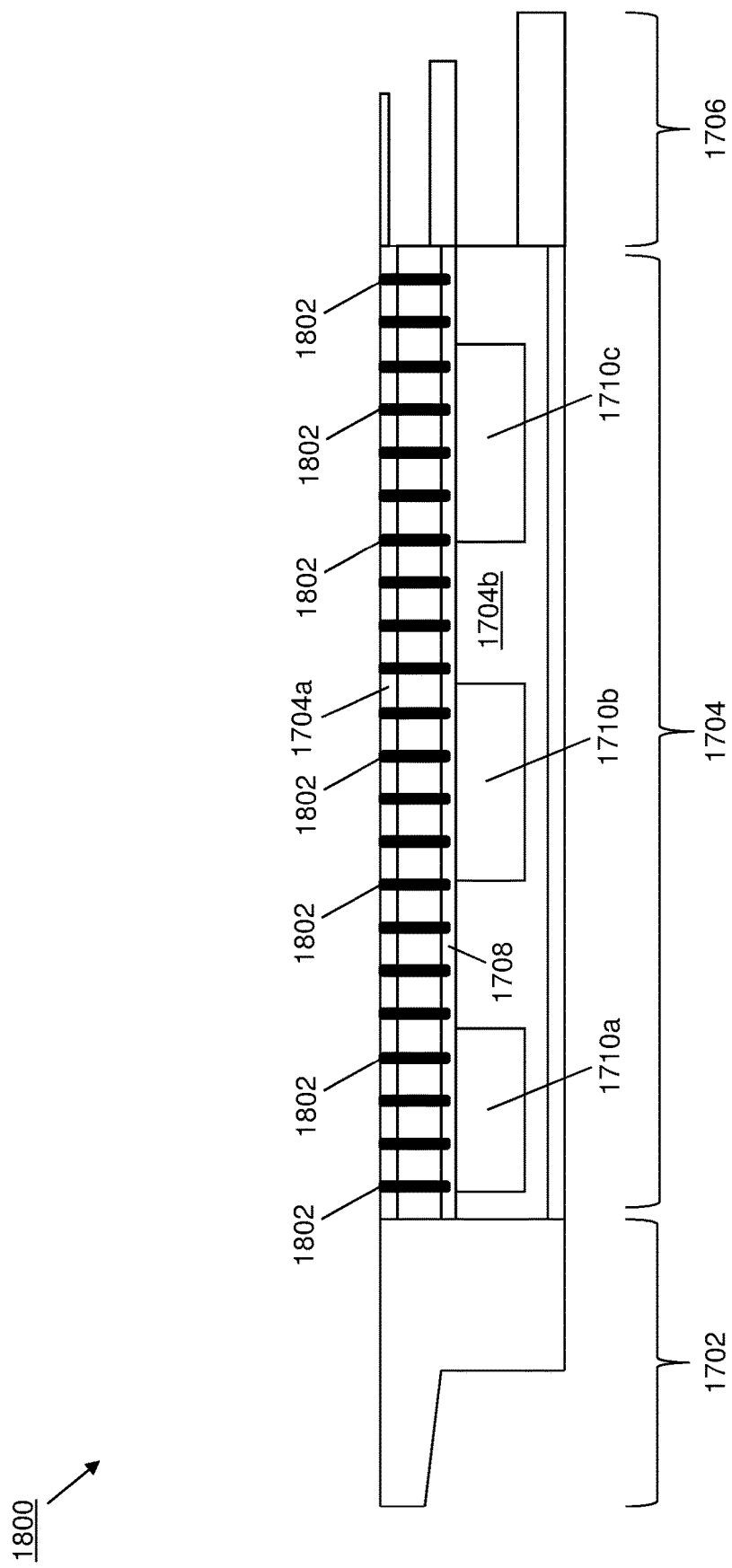
FIG. 18A is a schematic cross-sectional side view illustrating an embodiment of a transceiver device including the micro-strand transceiver heat dissipation system of the present disclosure.
Figure 18B:
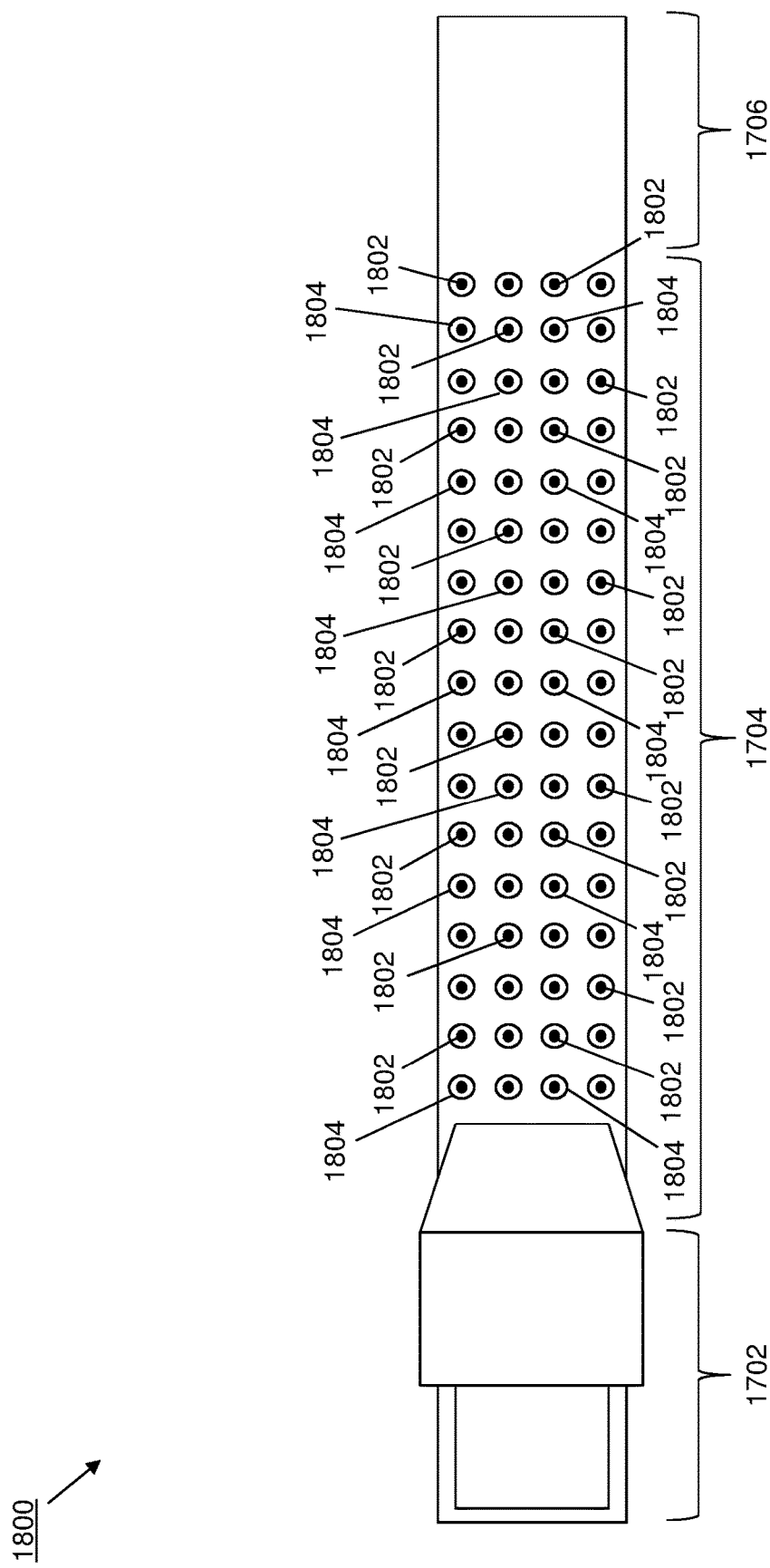
FIG. 18B is a schematic top view illustrating an embodiment of the transceiver device of FIG. 18A including the micro-strand transceiver heat dissipation system of the present disclosure.

With reference to FIGS. 18A and 18B, an embodiment of a micro-strand transceiver heat dissipation system 1800 that is provided according to the teachings of the present disclosure is illustrated as implemented via modifications to the conventional transceiver device 1700 discussed above with reference to FIGS. 17A-17D, and thus similar elements on the conventional transceiver device 1700 are provided with similar element numbers. In the illustrated embodiment, a plurality of micro-strand heat dissipator elements 1802 are each positioned in the transceiver component housing 1704b defined by the transceiver chassis 1704 in a spaced apart orientation from the others of the plurality of micro-strand heat dissipator elements 1802, with each of the plurality of micro-strand heat dissipator elements 1802 including a first micro-strand heat dissipator element portion that engages the circuit board 1708, and a second micro-strand heat dissipator element portion that extends from the circuit board 1708.

Furthermore, in the embodiment illustrated in FIGS. 18A and 18B, the transceiver wall 1704a defines a plurality of micro-strand heat dissipator element apertures 1804 (visible in FIG. 18B) that extend through the transceiver wall 1704a from the transceiver component housing 1704b to an outer surface of the transceiver chassis 1704, and the second micro-strand heat dissipator element portion on each of the plurality of micro-strand heat dissipator elements 1802 extends into a respective one of the plurality of micro-strand heat dissipator element apertures 1804. In the examples provided herein that include micro-strand heat dissipator element apertures 1804 defined by the transceiver chassis 1704, the micro-strand heat dissipator elements 1802 terminate in those micro-strand heat dissipator element apertures 1804. However, one of skill in the art in possession of the present disclosure will recognize that in embodiments that include micro-strand heat dissipator element apertures 1804 defined by the transceiver chassis 1704, the micro-strand heat dissipator elements 1802 may extend through those micro-strand heat dissipator element apertures 1804 and out of the transceiver chassis 1704 while remaining within the scope of the present disclosure as well. As such, one of skill in the art in possession of the present disclosure will recognize that any airflow provided through the transceiver component housing 1704*b* may provide sub-airflows that move past the micro-strand heat dissipator elements 1802 may out of the micro-strand heat dissipator element apertures 1804.

While not described herein in detail, one of skill in the art in possession of the present disclosure will appreciate that the micro-strand heat dissipator elements 1802 may be provided in the micro-strand transceiver heat dissipation system 1800 using any of the techniques described above, including the connection/securing of the micro-strand heat dissipator elements 1802 to micro-strand heat dissipator connector holes defined by the circuit board 1708 in the transceiver chassis 1704 (e.g., via a micro-strand heat dissipator element carrier like those illustrated and described above), integration of the micro-strand heat dissipator elements 1802 with the circuit board 1708 in the transceiver chassis 1704 in the configuration illustrated in FIGS. 18A and 18B during, for example, the manufacturing, fabrication, and/or other provisioning of the circuit board 1708 and/or the transceiver chassis 1704, and/or in a variety of other manners that will fall within the scope of the present disclosure as well. Furthermore, one of skill in the art in possession of the present disclosure will appreciate that any of the techniques described above may be incorporated into the embodiment illustrated in FIGS. 18A and 18B in order to provide the micro-strand heat dissipator elements 1802 in a manner that dissipates heat from the circuit board 1708 in the transceiver chassis 1704 (e.g., via "routed" micro-strand heat dissipator elements such as those including the micro-strand heat dissipator element portions 1406*a*, 1408*a*, 1410*a*, 1410*b*, 1520*a*, 1524*a*, and 1526*a* illustrated in FIGS. 14 and 15). As such, while the embodiment in FIGS. 18A and 18B illustrates the micro-strand heat dissipator elements 1802 in a uniform, 4×17 grid, other micro-strand heat dissipator element configurations may be provided in micro-strand transceiver heat dissipation system 1800 (e.g., with the micro-strand heat dissipator elements 1802 extending different distances into the circuit board 1708 in the transceiver chassis 1704) while remaining within the scope of the present disclosure as well.

Figure 19A:
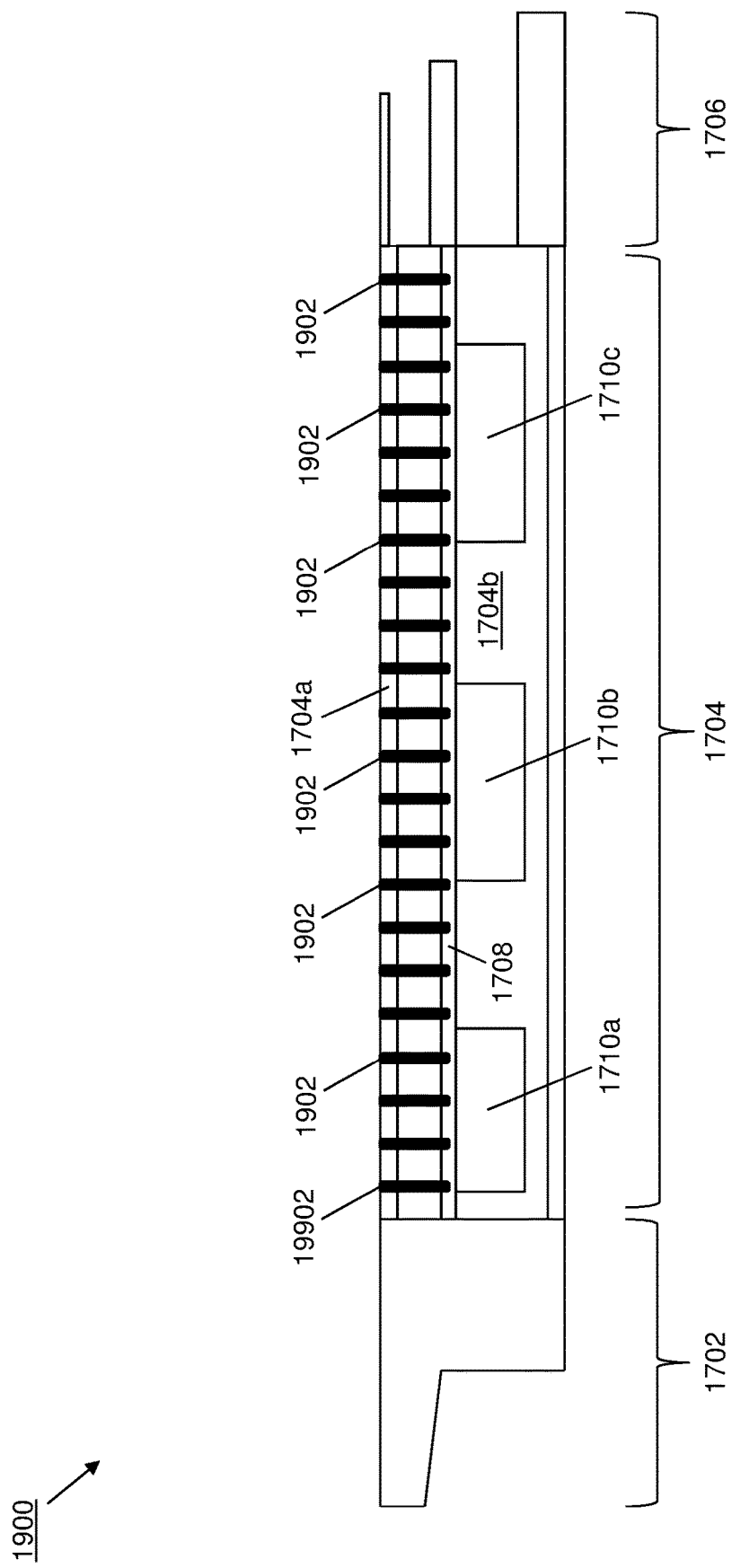
FIG. 19A is a schematic cross-sectional side view illustrating an embodiment of a transceiver device including the micro-strand transceiver heat dissipation system of the present disclosure.
Figure 19B:
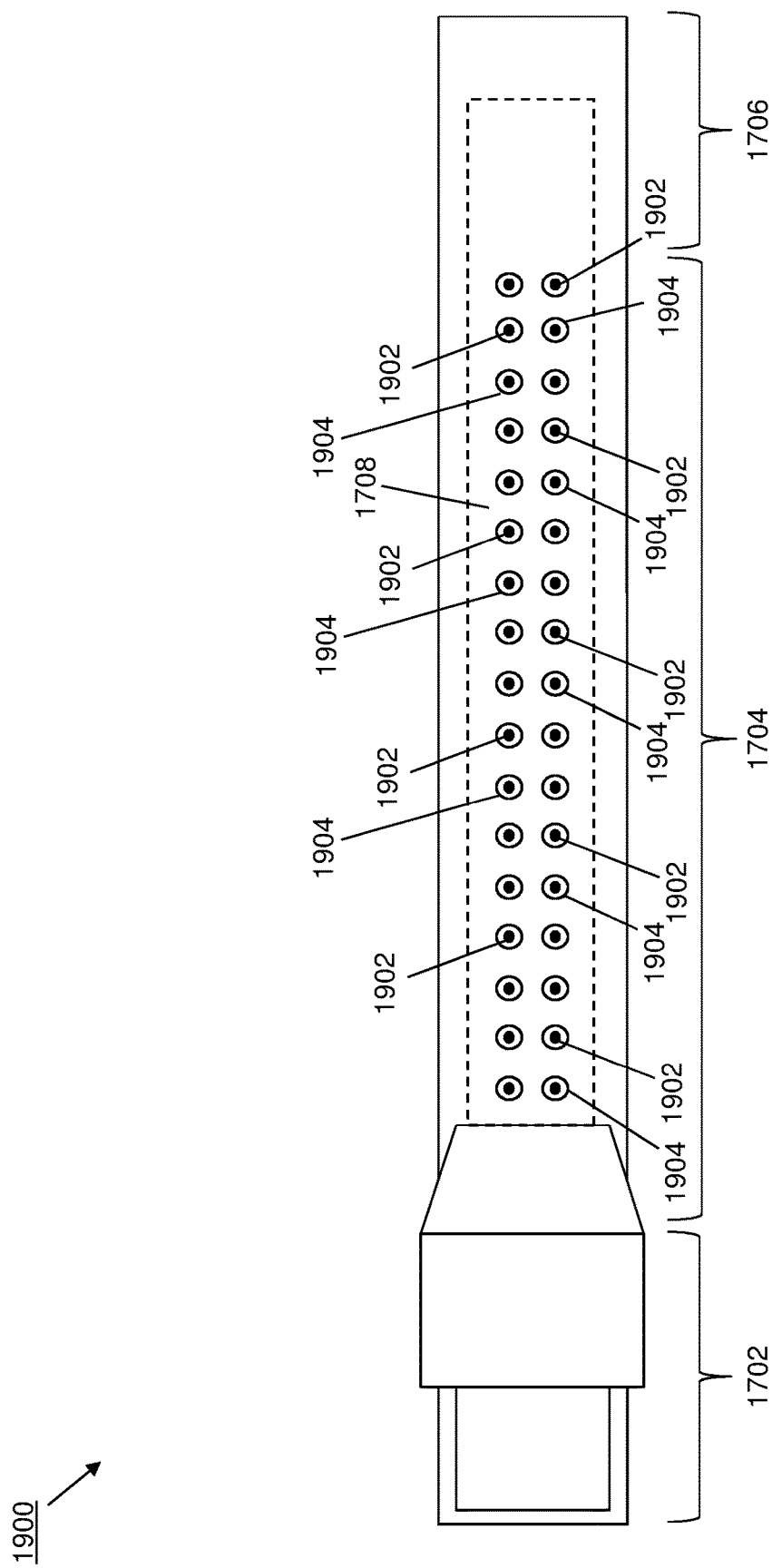
FIG. 19B is a schematic cross-sectional top view illustrating an embodiment of a transceiver device including the micro-strand transceiver heat dissipation system of the present disclosure.

With reference to FIGS. 19A and 19B, another embodiment of a micro-strand transceiver heat dissipation system 1900 that is provided according to the teachings of the present disclosure is illustrated as implemented via modifications to the conventional transceiver device 1700 discussed above with reference to FIGS. 17A-17D, and thus similar elements on the conventional transceiver device 1700 are provided with similar element numbers. In the illustrated embodiment, a plurality of micro-strand heat dissipator elements 1902 are each positioned in the transceiver component housing 1704*b* defined by the transceiver chassis 1704 in a spaced apart orientation from the others of the plurality of micro-strand heat dissipator elements 1902, with each of the plurality of micro-strand heat dissipator elements 1902 including a first micro-strand heat dissipator element portion that engages the circuit board 1708, and a second micro-strand heat dissipator element portion that extends from the circuit board 1708.

As will be appreciated by one of skill in the art in possession of the present disclosure, the micro-strand heat dissipator element configuration in the micro-strand transceiver heat dissipation system 1900 provides the micro-strand heat dissipator elements 1902 in a uniform, 2×17 grid, that centrally locates those micro-strand heat dissipator elements 1902 on the circuit board 1708 in the transceiver component housing 1704*b*, as compared to the micro-strand heat dissipator element configuration in the micro-strand transceiver heat dissipation system 1800 discussed above with reference to FIGS. 18A and 18B. As such, in situations in which the central portion of the circuit board 1708 in the transceiver component housing 1704*b* is known to provide "hot-spots" that produce more heat than the edge portions of that circuit board 1708, the micro-strand heat dissipator element configuration in the micro-strand transceiver heat dissipation system 1900 may provide benefits over the micro-strand heat dissipator element configuration in the micro-strand transceiver heat dissipation system 1800.

Furthermore, in the embodiment illustrated in FIGS. 19A and 19B, the transceiver wall 1704*a* defines a plurality of micro-strand heat dissipator element apertures 1904 (visible in FIG. 19B) that extend through the transceiver wall 1704*a* from the transceiver component housing 1704*b* to an outer surface of the transceiver chassis 1704, and the second micro-strand heat dissipator element portion on each of the plurality of micro-strand heat dissipator elements 1902 extends into a respective one of the plurality of micro-strand heat dissipator element apertures 1904. In the examples provided herein that include micro-strand heat dissipator element apertures 1904 defined by the transceiver chassis 1704, the micro-strand heat dissipator elements 1902 terminate in those micro-strand heat dissipator element apertures 1904. However, one of skill in the art in possession of the present disclosure will recognize that in embodiments that include micro-strand heat dissipator element apertures 1904 defined by the transceiver chassis 1704, the micro-strand heat dissipator elements 1902 may extend through those micro-strand heat dissipator element apertures 1904 and out of the transceiver chassis 1704 while remaining within the scope of the present disclosure as well. As such, one of skill in the art in possession of the present disclosure will recognize that any airflow provided through the transceiver component housing 1704*b* may provide sub-airflows that move past the micro-strand heat dissipator elements 1902 may out of the micro-strand heat dissipator element apertures 1904.

Similarly as described above, one of skill in the art in possession of the present disclosure will appreciate that the micro-strand heat dissipator elements 1902 may be provided in the micro-strand transceiver heat dissipation system 1900 using any of the techniques described above, including the connection/securing of the micro-strand heat dissipator elements 1902 to micro-strand heat dissipator connector holes defined by the circuit board 1708 in the transceiver chassis 1704 (e.g., via a micro-strand heat dissipator element carrier like those illustrated and described above), integration of the micro-strand heat dissipator elements 1902 with the circuit board 1708 in the transceiver chassis 1704 in the configuration illustrated in FIGS. 19A and 19B during, for example, the manufacturing, fabrication, and/or other provisioning of the circuit board 1708 and/or the transceiver chassis 1704, and/or in a variety of other manners that will fall within the scope of the present disclosure as well. Furthermore, one of skill in the art in possession of the present disclosure will appreciate that any of the techniques described above may be incorporated into the embodiment illustrated in FIGS. 19A and 19B in order to provide the micro-strand heat dissipator elements 1902 in a manner that dissipates heat from the circuit board 1708 in the transceiver chassis 1704 (e.g., via "routed" micro-strand heat dissipator elements such as those including the micro-strand heat dissipator element portions 1406*a*, 1408*a*, 1410*a*, 1410*b*, 1520*a*, 1524*a*, and 1526*a* illustrated in FIGS. 14 and 15). As such, while the embodiment in FIG. 19 illustrates the micro-strand heat dissipator elements 1902 in a uniform, 2×17 grid, other micro-strand heat dissipator element configurations may be provided in micro-strand transceiver heat dissipation system 1900 (e.g., with the micro-strand heat dissipator elements 1902 extending different distances into the circuit board 1708 in the transceiver chassis 1704) while remaining within the scope of the present disclosure as well.

Figure 20A:
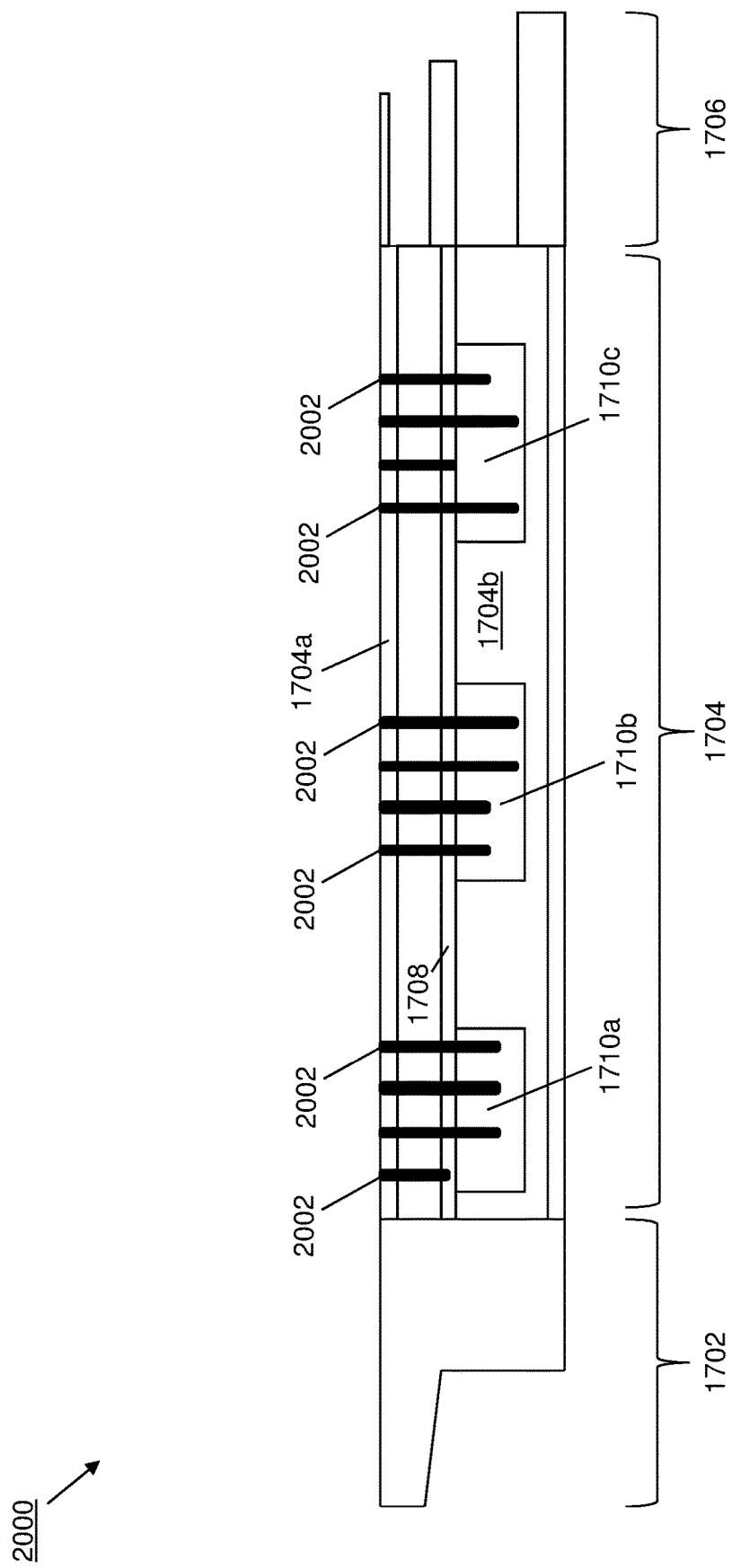
FIG. 20A is a schematic cross-sectional side view illustrating an embodiment of a transceiver device including the micro-strand transceiver heat dissipation system of the present disclosure.
Figure 20B:
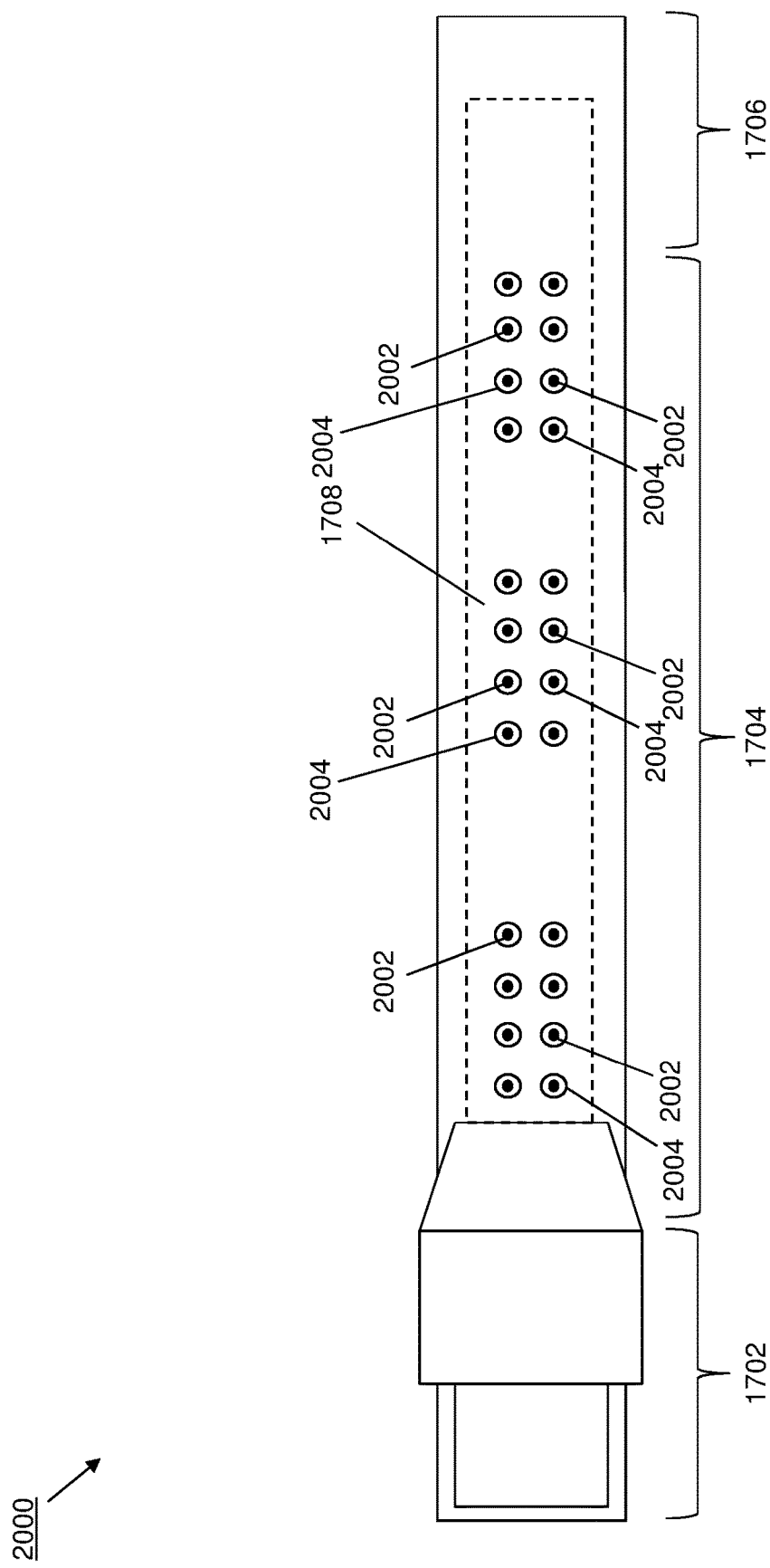
FIG. 20B is a schematic cross-sectional top view illustrating an embodiment of the transceiver device of FIG. 20A including the micro-strand transceiver heat dissipation system of the present disclosure.

With reference to FIGS. 20A and 20B, another embodiment of a micro-strand transceiver heat dissipation system 2000 that is provided according to the teachings of the present disclosure is illustrated as implemented via modifications to the conventional transceiver device 1700 discussed above with reference to FIGS. 17A-17D, and thus similar elements on the conventional transceiver device 1700 are provided with similar element numbers. In the illustrated embodiment, a plurality of micro-strand heat dissipator elements 2002 are each positioned in the transceiver component housing 1704*b* defined by the transceiver chassis 1704 in a spaced apart orientation from the others of the plurality of micro-strand heat dissipator elements 2002, with each of the plurality of micro-strand heat dissipator elements 2002 including a first micro-strand heat dissipator element portion that either engages the circuit board 1708 or extends through the circuit board 1708 and into one of the heat producing devices 1710*a*, 1710*b*, and up to 1710*c*, and a second micro-strand heat dissipator element portion that extends from the circuit board 1708. Furthermore, the micro-strand transceiver heat dissipation system 2000 illustrates how the micro-strand heat dissipator elements 2002 may extend different distances into the circuit board 1708 and/or the heat producing devices 1710*a*-1710*c* (e.g., some micro-strand heat dissipator elements 2002 may engage the circuit board 1708; some may extend a first distance into a heat producing device 1710*a*, 1710*b*, or 1710*c*; some may extend a second distance into a heat producing device 1710*a*, 1710*b*, or 1710*c* that is greater than the first distance; and so on).

As will be appreciated by one of skill in the art in possession of the present disclosure, the micro-strand heat dissipator element configuration in the micro-strand transceiver heat dissipation system 2000 provides the micro-strand heat dissipator elements 2002 in multiple, targeted, 2×4 grids that are located relative to the heat producing devices 1710*a*-1710*c* in the transceiver component housing 1704*b* in order to allow those micro-strand heat dissipator elements 1902 to engage those heat producing devices 1710*a*-1710*c* (or the portion of the circuit board 1708 they are mounted to). As such, in situations in which the heat producing devices 1710*a*-1710*c* mounted to the circuit board 1708 in the transceiver component housing 1704*b* are known to provide the primary source of heat on that circuit board 1708, the micro-strand heat dissipator element configuration in the micro-strand transceiver heat dissipation system 2000 may provide benefits over the micro-strand heat dissipator element configurations in the micro-strand transceiver heat dissipation system 1800 and 1900. In particular, one of skill in the art in possession of the present disclosure will appreciate how the micro-strand heat dissipator elements 2002 may be configured to target "hot-spots" on the circuit board 1708 and/or within heat producing devices 1710*a*-1710*c* in order to provide for more efficient heat dissipation in the micro-strand transceiver heat dissipation system 2000

Furthermore, in the embodiment illustrated in FIGS. 20A and 20B, the transceiver wall 1704*a* defines a plurality of micro-strand heat dissipator element apertures 2004 (visible in FIG. 20B) that extend through the transceiver wall 1704*a* from the transceiver component housing 1704*b* to an outer surface of the transceiver chassis 1704, and the second micro-strand heat dissipator element portion on each of the plurality of micro-strand heat dissipator elements 2002 extends into a respective one of the plurality of micro-strand heat dissipator element apertures 2004. In the examples provided herein that include micro-strand heat dissipator element apertures 2004 defined by the transceiver chassis 1704, the micro-strand heat dissipator elements 2002 terminate in those micro-strand heat dissipator element apertures 2004. However, one of skill in the art in possession of the present disclosure will recognize that in embodiments that include micro-strand heat dissipator element apertures 2004 defined by the transceiver chassis 1704, the micro-strand heat dissipator elements 2002 may extend through those micro-strand heat dissipator element apertures 2004 and out of the transceiver chassis 1704 while remaining within the scope of the present disclosure as well. As such, one of skill in the art in possession of the present disclosure will recognize that any airflow provided through the transceiver component housing 1704*b* may provide sub-airflows that move past the micro-strand heat dissipator elements 2002 may out of the micro-strand heat dissipator element apertures 2004.

Similarly as described above, one of skill in the art in possession of the present disclosure will appreciate that the micro-strand heat dissipator elements 2002 may be provided in the micro-strand transceiver heat dissipation system 2000 using any of the techniques described above, including the connection/securing of the micro-strand heat dissipator elements 2002 to micro-strand heat dissipator connector holes defined by the circuit board 1708 in the transceiver chassis 1704 (e.g., via a micro-strand heat dissipator element carrier like those illustrated and described above), integration of the micro-strand heat dissipator elements 2002 with the circuit board 1708 in the transceiver chassis 1704 in the configuration illustrated in FIGS. 20A and 20B during, for example, the manufacturing, fabrication, and/or other provisioning of the circuit board 1708 and/or the transceiver chassis 1704, and/or in a variety of other manners that will fall within the scope of the present disclosure as well. Furthermore, one of skill in the art in possession of the present disclosure will appreciate that any of the techniques described above may be incorporated into the embodiment illustrated in FIGS. 20A and 20B in order to provide the micro-strand heat dissipator elements 2002 in a manner that dissipates heat from the circuit board 1708 and/or heat producing devices 1710*a*-1710*c* in the transceiver chassis 1704 (e.g., via "routed" micro-strand heat dissipator elements such as those including the micro-strand heat dissipator element portions 1406*a*, 1408*a*, 1410*a*, 1410*b*, 1520*a*, 1524*a*, and 1526*a* illustrated in FIGS. 14 and 15). As such, while the embodiment in FIGS. 20A and 20B illustrates the micro-strand heat dissipator elements 2002 in a multiple, targeted, 2×4 grids, other micro-strand heat dissipator element configurations may be provided in micro-strand transceiver heat dissipation system 2000 while remaining within the scope of the present disclosure as well.

Figure 21:
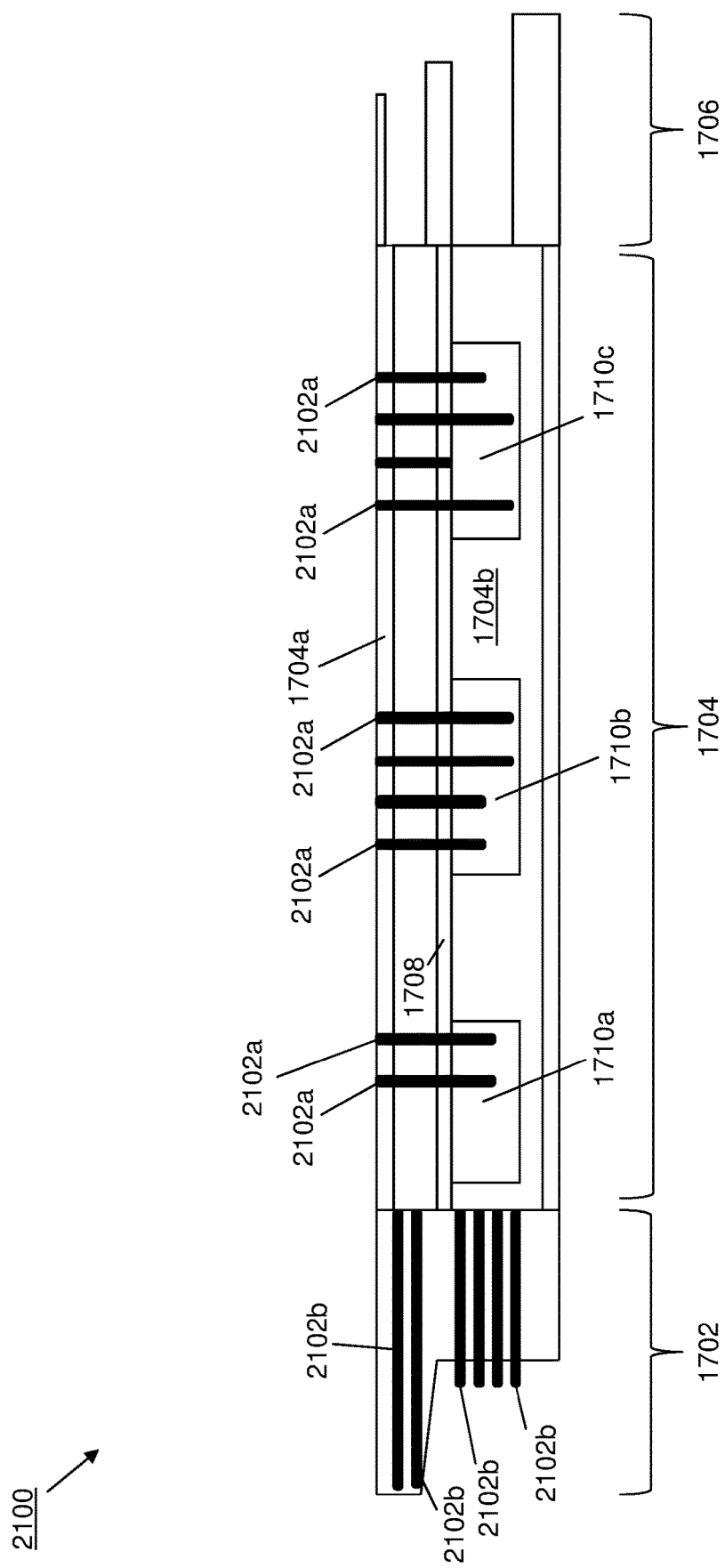
FIG. 21 is a schematic cross-sectional side view illustrating an embodiment of a transceiver device including the micro-strand transceiver heat dissipation system of the present disclosure.

In another embodiment, with reference to FIG. 21, a micro-strand transceiver heat dissipation system 2100 is illustrated in which a plurality of micro-strand heat dissipator elements 2102a may be positioned in the transceiver component housing 1704b defined by the transceiver chassis 1704 in a spaced apart orientation from the others of the plurality of micro-strand heat dissipator elements 2102a, with each of the plurality of micro-strand heat dissipator elements 2102a including a first micro-strand heat dissipator element portion that either engages the circuit board 1708, or extends through the circuit board 1708 and into one of the heat producing devices 1710a, 1710b, and up to 1710c, and a second micro-strand heat dissipator element portion that extends from the circuit board 1708 or the heat producing component 1710a. Furthermore, the micro-strand transceiver heat dissipation system 2100 illustrates how micro-strand heat dissipator elements 2102b may extend from the transceiver chassis 1704 and adjacent to the transceiver handle 1702, and one of skill in the art in possession of the present disclosure will appreciate that micro-strand heat dissipator elements may extend from other portions of the micro-strand transceiver heat dissipation system 2100 (e.g., other sides of the transceiver chassis 1704, the transceiver connector 1706, etc.) while remaining within the scope of the present disclosure as well.

Similarly as described above, one of skill in the art in possession of the present disclosure will appreciate that the micro-strand heat dissipator elements 2102a and 2102b may be provided in the micro-strand transceiver heat dissipation system 2100 using any of the techniques described above, including the connection/securing of the micro-strand heat dissipator elements 2102a to micro-strand heat dissipator connector holes defined by the circuit board 1708 and the transceiver chassis 1704 (e.g., via a micro-strand heat dissipator element carrier like those illustrated and discussed above), integration of the micro-strand transceiver heat dissipation system 2100 with the circuit board 1708 and the transceiver chassis 1704 in the configuration illustrated in FIG. 21 during, for example, the manufacturing, fabrication, and/or other provisioning of the circuit board 1708 and/or the transceiver chassis 1704, and/or in a variety of other manners that will fall within the scope of the present disclosure as well. Furthermore, one of skill in the art in possession of the present disclosure will appreciate that any of the techniques described above may be incorporated into the embodiment illustrated in FIG. 21 in order to provide the micro-strand heat dissipator elements 2102a and 2102b in a manner that dissipates heat from the circuit board 1708 and/or heat producing devices 1710a-1710c in the transceiver chassis 1704 (e.g., via "routed" micro-strand heat dissipator elements such as those including the micro-strand heat dissipator element portions 1406a, 1408a, 1410a, 1410b, 1520a, 1524a, and 1526a illustrated in FIGS. 14 and 15). As such, while the embodiment in FIG. 21 illustrates the micro-strand heat dissipator elements 2102a and 2102b in a particular micro-strand heat dissipator element configuration, the micro-strand transceiver heat dissipation system 2100 may include other micro-strand heat dissipator element configurations while remaining within the scope of the present disclosure as well.

Referring now to FIG. 22, an embodiment of a method 2200 for dissipating heat generated by a transceiver device is illustrated. As discussed below, the systems and methods of the present disclosure provide for the dissipation of heat from a transceiver device via the use of micro-strand heat dissipator elements. For example, a plurality of micro-strand heat dissipator elements may each be positioned on the transceiver device in a spaced apart orientation from the other micro-strand heat dissipator elements, with each micro-strand heat dissipator element including a first micro-strand heat dissipator element portion that engages a circuit board in the transceiver device, and a second micro-strand heat dissipator element portion that extends from the circuit board in the transceiver device. As such, heat generated by or through the circuit board in the transceiver device may be conducted by the first micro-strand heat dissipator element portion of at least some of the micro-strand heat dissipator elements to the second micro-strand heat dissipator element portions of those micro-strand heat dissipator elements, and then dissipated by the second micro-strand heat dissipator element portions of those micro-strand heat dissipator elements. It has been found that the use of micro-strand heat dissipator elements allows for targeted dissipation of heat generated from particular areas or volumes in the transceiver device, and may operate to meet the cooling requirements of relatively higher performance transceiver devices such as those provided by silicon photonics transceiver devices.

The method 2200 begins at block 2202 where a transceiver device generates heat. In an embodiment, at block 2202 and with reference to FIG. 23A, any of the transceiver devices in micro-strand transceiver heat dissipation system 1800/1900/2000/2100 discussed above may be connected to a computing system 2300 via a transceiver device connector 2300a on that computing system 2300, and may then be operated to generate heat. As discussed above, in specific examples transceiver devices utilizing the micro-strand transceiver heat dissipation system of the present disclosure may be provided by silicon photonics transceiver devices, and the operation of components in those transceiver devices will produce heat. In particular, one of skill in the art in possession of the present disclosure will recognize how the operation of components in silicon photonics transceiver devices may result in particular areas (e.g., as viewed from a top surface of the transceiver device) or volumes of the transceiver device that generate heat and reach relatively high temperatures (as opposed to other areas or volumes of the transceiver device that do not include such components and, as such, do not generate as much heat and reach relatively lower temperatures). However, while a specific transceiver device is discussed, one of skill in the art in possession of the present disclosure will appreciate how uniform or non-uniform heat generation by any of a variety of devices may benefit from the micro-strand transceiver heat dissipation system of the present disclosure while remaining within its scope.

The method 2200 then proceeds to block 2204 where a first micro-strand heat dissipator element portion of micro-strand heat dissipator elements conducts heat to a second micro-strand heat dissipator element portion of the micro-strand heat dissipator elements. In an embodiment, at block 1604, the first micro-strand heat dissipator element portion of at least some of the micro-strand heat dissipator elements that are included in the transceiver device will operate to conduct the heat generated by the transceiver device at block 2202 to the corresponding second micro-strand heat dissipator element portion of those micro-strand heat dissipator elements, and one of skill in the art in possession of the present disclosure will appreciate that micro-strand heat dissipator elements positioned closer to the source of heat generation within the transceiver device may conduct more heat relative to micro-strand heat dissipator elements positioned further from the source of heat generation within the transceiver device. As discussed in detail above, the first micro-strand heat dissipator element portion of the micro-strand heat dissipator elements may extend into the transceiver device to an area or volume that is expected or known to generated relatively high temperatures (e.g., into the heat producing device(s) 1710a-1710c), and thus the configuration of the micro-strand heat dissipator elements on the transceiver device may be designed to maximize the heat transfer from the transceiver device at block 2204.

Figure 23B:
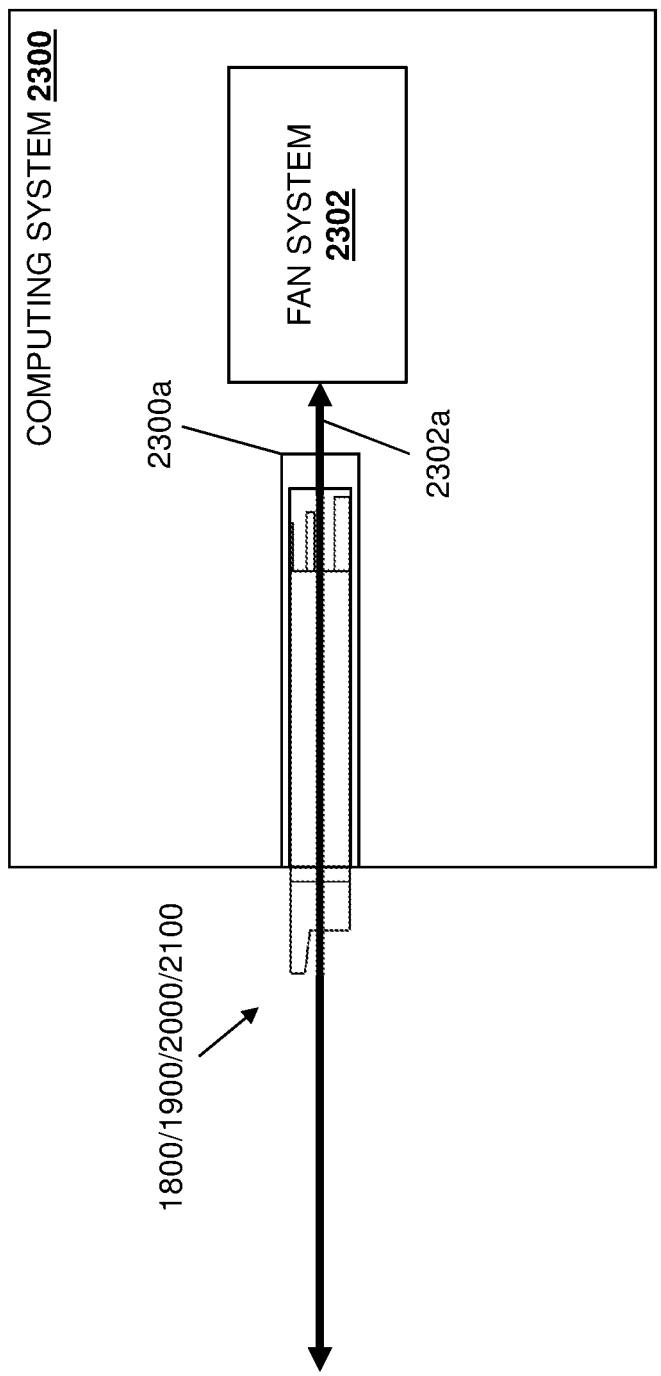
FIG. 23B is a schematic embodiment of the transceiver device of FIG. 18A/18B, 19A/19B, or 20A/20B operating during the method of FIG. 22.

The method 2200 then proceeds to block 2206 where the second micro-strand heat dissipator element portion of the micro-strand heat dissipator elements dissipates the heat. In an embodiment, at block 2206, the heat conducted to the second micro-strand heat dissipator element portion of the micro-strand heat dissipator elements will then be dissipated by the second micro-strand heat dissipator element portion of those micro-strand heat dissipator elements. As will be appreciated by one of skill in the art in possession of the present disclosure, the heat conducted to the second micro-strand heat dissipator element portion of those micro-strand heat dissipator elements may be dissipated at block 2206 via radiative heat transfer, as well as convective heat transfer. For example, as illustrated in FIG. 23B, a fan system 2302 in the computing system 2300 may operate to generate an airflow 2302a that may either 1) enter an air inlet defined by the transceiver device (e.g., adjacent the transceiver connector 1706), move through the transceiver chassis 1704 and past the micro-strand heat dissipator elements, and may exit an air outlet defined by the transceiver device (e.g., adjacent the transceiver handle 1702), or 2) enter an air inlet defined by the transceiver device (e.g., adjacent the transceiver handle 1702), move through the transceiver chassis 1704 and past the micro-strand heat dissipator elements, and may exit an air outlet defined by the transceiver device (e.g., adjacent the transceiver connector 1706).

In other words, the fan system 2302 may either "push" or "pull" air through the micro-strand transceiver heat dissipation systems 1800/1900/2000/2100. As will be appreciated by one of skill in the art in possession of the present disclosure, the configuration of the micro-strand heat dissipator elements may allow that airflow (or other fluid flows) to move past the second micro-strand heat dissipator element portion of those micro-strand heat dissipator elements in different directions (i.e., rather than blocking airflow in some directions, as occurs in many "finned" heat sink systems) in order to enhance the convective heat transfer from those micro-strand heat dissipator elements. As such, heat generated by the transceiver device may be dissipated by the micro-strand heat dissipator elements extending from the transceiver component(s) in that transceiver device.

Thus, systems and methods have been described that provide for the dissipation of heat from a silicon photonics transceiver device via the use of micro-strand heat dissipator elements. For example, a plurality of micro-strand heat dissipator elements may each be positioned on the silicon photonics transceiver device in a spaced apart orientation from the other micro-strand heat dissipator elements, with each micro-strand heat dissipator element including a first micro-strand heat dissipator element portion that extends into a circuit board and/or heat producing devices in the transceiver device, and a second micro-strand heat dissipator element portion that extends from the circuit board in the silicon photonics transceiver device. As such, heat generated by the silicon photonics transceiver device may be conducted by the first micro-strand heat dissipator element portion of at least some of the micro-strand heat dissipator elements to the second micro-strand heat dissipator element portions of those micro-strand heat dissipator elements, and then dissipated by the second micro-strand heat dissipator element portions of those micro-strand heat dissipator elements. It has been found that the use of micro-strand heat dissipator elements allows for targeting dissipation of heat generated from particular areas or volumes in the silicon photonics transceiver device, and may operate to meet the cooling requirements of silicon photonics transceiver device.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A micro-strand transceiver device heat dissipation system, comprising:
   a transceiver device chassis that includes a first end that defines an air inlet, and a second end that is located opposite the transceiver device chassis from the first end and that defines an air outlet;
   at least one transceiver component located in the transceiver device chassis; and
   a plurality of micro-strand heat dissipator elements that are each positioned in the transceiver device chassis in a spaced apart orientation from the others of the plurality of micro-strand heat dissipator elements, wherein each of the plurality of micro-strand heat dissipator elements include:
   a first micro-strand heat dissipator element portion that engages the at least one transceiver component; and
   a second micro-strand heat dissipator element portion that extends from the at least one transceiver component, and wherein the air inlet and the air outlet are configured to allow an airflow to move past the plurality of micro-strand heat dissipator elements.

2. The system of claim 1, wherein the at least one transceiver component includes a circuit board.

3. The system of claim 1, wherein the at least one transceiver component includes a heat producing device.

4. The system of claim 3, wherein a first subset of the plurality of micro-strand heat dissipator elements extend a first distance into the heat producing device, and wherein a second subset of the plurality of micro-strand heat dissipator elements extend a second distance into the heat producing device that is different than the first distance.

5. The system of claim 1, wherein the transceiver device chassis includes:
   a plurality of micro-strand heat dissipator element apertures that extend through a wall on the transceiver device chassis, wherein a respective one of each the plurality of micro-strand heat dissipator elements extends into the plurality of micro-strand heat dissipator element apertures.

6. The system of claim 1, wherein the plurality of micro-strand heat dissipator elements each include a diameter between 0.04 mm and 0.1 mm.

7. An Information Handling System (IHS), comprising:
   an Information Handling System (IHS) chassis;
   a transceiver device connector that is included on the IHS chassis;

a transceiver device that is connected to the transceiver device connector and that includes a first end that defines an air inlet, and a second end that is located opposite the transceiver device from the first end and that defines an air outlet;

at least one transceiver component located in the transceiver device; and a plurality of micro-strand heat dissipator elements that are each positioned in the transceiver device in a spaced apart orientation from the others of the plurality of micro-strand heat dissipator elements, wherein each of the plurality of micro-strand heat dissipator elements include:

a first micro-strand heat dissipator element portion that engages the at least one transceiver component; and a second micro-strand heat dissipator element portion that extends from the at least one transceiver component, and wherein the air inlet and the air outlet are configured to allow an airflow to move past the plurality of micro-strand heat dissipator elements.

8. The IHS of claim 7, wherein the at least one transceiver component includes a circuit board.

9. The IHS of claim 7, wherein the at least one transceiver component includes a heat producing device.

10. The IHS of claim 9, wherein a first subset of the plurality of micro-strand heat dissipator elements extend a first distance into the heat producing device, and wherein a second subset of the plurality of micro-strand heat dissipator elements extend a second distance into the heat producing device that is different than the first distance.

11. The IHS of claim 7, wherein the transceiver device includes:

a plurality of micro-strand heat dissipator element apertures that extend through a wall on the transceiver device, wherein a respective one of each the plurality of micro-strand heat dissipator elements extends into the plurality of micro-strand heat dissipator element apertures.

12. The IHS of claim 7, wherein the plurality of micro-strand heat dissipator elements each include a diameter between 0.04 mm and 0.1 mm.

13. The IHS of claim 7, further comprising:

a fan system that is configured to produce the airflow.

14. A method for dissipating heat generated by a transceiver device, comprising:

generating, by at least one transceiver component in a transceiver device that engages a plurality of micro-strand heat dissipator elements that are each positioned in the transceiver device in a spaced apart orientation from the others of the plurality of micro-strand heat dissipator elements, heat;

conducting, by a first micro-strand heat dissipator element portion on each of the plurality of micro-strand heat dissipator elements that engages the at least one transceiver component, the heat that is generated by the at least one transceiver component to a respective second micro-strand heat dissipator element portion on that micro-strand heat dissipator element that extends from the at least one transceiver component; and allowing, via an air inlet that is defined on a first end of the transceiver device and an air outlet that is defined on a second end of the transceiver device that is opposite the first end, an airflow to move past the plurality of micro-strand heat dissipator elements;

dissipating, via the airflow by the second micro-strand heat dissipator element portion on each of the plurality of micro-strand heat dissipator elements that extend from the outer surface of the first processing device, the heat.

15. The method of claim 14, wherein the at least one transceiver component includes a circuit board.

16. The method of claim 14, wherein the at least one transceiver component includes a heat producing device.

17. The method of claim 16, wherein a first subset of the plurality of micro-strand heat dissipator elements extend a first distance into the heat producing device, and wherein a second subset of the plurality of micro-strand heat dissipator elements extend a second distance into the heat producing device that is different than the first distance.

18. The method of claim 14, wherein the transceiver device includes:

a plurality of micro-strand heat dissipator element apertures that extend through a wall on the transceiver device, wherein a respective one of each the plurality of micro-strand heat dissipator elements extends into the plurality of micro-strand heat dissipator element apertures.

19. The method of claim 14, wherein
the plurality of micro-strand heat dissipator elements each include a diameter between 0.04 mm and 0.1 mm.

20. The method of claim 14, further comprising:

generating, by a computing system connected to the transceiver device, the airflow.

* * * * *